(12) United States Patent
Park et al.

(10) Patent No.: US 11,864,449 B2
(45) Date of Patent: Jan. 2, 2024

(54) DISPLAY MODULE HAVING INCREASED TRANSMITTANCE AND ELECTRONIC DEVICE INCLUDING THE DISPLAY MODULE

(71) Applicant: Samsung Display Co., Ltd., Yongin-Si (KR)

(72) Inventors: Ok-Kyung Park, Hwaseong-si (KR); Yujin Choe, Seoul (KR); Young-Seok Seo, Seoul (KR); Hye Won Jang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/945,245

(22) Filed: Sep. 15, 2022

(65) Prior Publication Data

US 2023/0105728 A1     Apr. 6, 2023

(30) Foreign Application Priority Data

Oct. 1, 2021   (KR) .......................... 10-2021-0130746

(51) Int. Cl.
*H10K 59/40* (2023.01)
*G06F 3/044* (2006.01)

(52) U.S. Cl.
CPC ........... *H10K 59/40* (2023.02); *G06F 3/0446* (2019.05); *G06F 2203/04112* (2013.01)

(58) Field of Classification Search
None
See application file for complete search history.

(56) References Cited

U.S. PATENT DOCUMENTS

| 2020/0258967 | A1 | 8/2020 | Kim et al. |
| 2021/0036064 | A1* | 2/2021 | Jang .................... G06F 3/04164 |
| 2021/0096643 | A1 | 4/2021 | Park et al. |
| 2021/0357079 | A1 | 11/2021 | Song et al. |

FOREIGN PATENT DOCUMENTS

| KR | 10-2020-0042664 | 4/2020 |
| KR | 10-2020-0097371 | 8/2020 |
| KR | 10-2021-0038782 | 4/2021 |

* cited by examiner

*Primary Examiner* — Nicholas J Lee
(74) *Attorney, Agent, or Firm* — F. Chau & Associates, LLC

(57) ABSTRACT

A display module includes: a display panel having a first area, a second area, and a third area; and a sensor disposed on the display panel, wherein the sensor has a transmissive area, a first sensing area, and a second sensing area, wherein the transmissive area overlaps the first area, wherein the first sensing area overlaps the second area, and the second sensing area overlaps the third area, wherein the sensor includes a plurality of first electrodes and a plurality of second electrodes, and each of the plurality of first electrodes and the plurality of second electrodes has a mesh structure, and wherein the mesh structure includes a first mesh structure and a second mesh structure, wherein the first mesh structure overlaps the first sensing area, wherein the second mesh structure overlaps the second sensing area. The first mesh structure and the second mesh structure are different from each other.

18 Claims, 37 Drawing Sheets

# DISPLAY MODULE HAVING INCREASED TRANSMITTANCE AND ELECTRONIC DEVICE INCLUDING THE DISPLAY MODULE

CROSS-REFERENCE TO RELATED APPLICATION

This application claims priority under 35 U.S.C. § 119 to Korean Patent Application No. 10-2021-0130746 filed on Oct. 1, 2021, in the Korean Intellectual Property Office, the disclosure of which is incorporated by reference herein in its entirety.

TECHNICAL FIELD

Embodiments of the present inventive concept relate to a display module and an electronic device including the same, and more particularly, to a display module having increased transmittance, and an electronic device including the display module.

DISCUSSION OF THE RELATED ART

Generally, an electronic device may include various electronic components such as a display panel, an electronic module, and the like. The electronic module may typically include a camera, an infrared sensor, a proximity sensor, or the like. The electronic module may be disposed under the display panel. A first portion of the display panel may have a higher transmittance than a second portion of the display panel. The electronic module may receive an external input through the first portion of the display panel, or may provide an output through the first portion of the display panel.

SUMMARY

According to an embodiment of the present inventive concept, a display module includes: a display panel having a first area, a second area, and a third area, wherein the second area is adjacent to the first area, and the third area surrounds at least part of the second area; and a sensor disposed on the display panel, wherein the sensor has a transmissive area, a first sensing area, and a second sensing area, wherein the transmissive area overlaps the first area, wherein the first sensing area overlaps the second area, and the second sensing area overlaps the third area, wherein the sensor includes a plurality of first electrodes and a plurality of second electrodes, and each of the plurality of first electrodes and the plurality of second electrodes has a mesh structure, and wherein the mesh structure includes a first mesh structure and a second mesh structure, wherein the first mesh structure is configured to overlap the first sensing area, wherein the second mesh structure configured to overlap the second sensing area, and wherein the first mesh structure and the second mesh structure are different from each other.

In an embodiment of the present inventive concept, the first mesh structure includes a plurality of first mesh lines and a plurality of first intersection mesh lines configured to intersect the plurality of first mesh lines, and the second mesh structure includes a plurality of second mesh lines and a plurality of second intersection mesh lines configured to intersect the plurality of second mesh lines.

In an embodiment of the present inventive concept, the first mesh structure includes a plurality of first disconnection portions formed in the plurality of first mesh lines and the plurality of first intersection mesh lines, and the second mesh structure includes a plurality of second disconnection portions formed in the plurality of second mesh lines and the plurality of second intersection mesh lines, and wherein an arrangement density of the plurality of first disconnection portions is lower than an arrangement density of the plurality of second disconnection portions.

In an embodiment of the present inventive concept, the first sensing area includes a first sub-sensing area adjacent to the transmissive area and a second sub-sensing area between the first sub-sensing area and the second sensing area, and wherein an arrangement density of first disconnection portions configured to overlap the first sub-sensing area among the plurality of first disconnection portions is lower than an arrangement density of first disconnection portions configured to overlap the second sub-sensing area among the plurality of first disconnection portions.

In an embodiment of the present inventive concept, the first mesh structure further includes a compensation electrode, and the compensation electrode is disposed in an area corresponding to an opening formed by some first mesh lines among the plurality of first mesh lines and some first intersection mesh lines among the plurality of first intersection mesh lines.

In an embodiment of the present inventive concept, the compensation electrode has a shape corresponding to the opening and is connected to the some first mesh lines and the some first intersection mesh lines.

In an embodiment of the present inventive concept, the compensation electrode overlaps a portion of the opening and is connected to at least a part of the some first mesh lines and the some first intersection mesh lines.

In an embodiment of the present inventive concept, the first mesh structure includes a first compensation mesh line disposed between some first mesh lines among the plurality of first mesh lines.

In an embodiment of the present inventive concept, the first mesh structure further includes a first compensation intersection mesh line disposed between some first intersection mesh lines among the plurality of first intersection mesh lines.

In an embodiment of the present inventive concept, a width of a first portion of a first mesh line among the plurality of first mesh lines is greater than a width of a second portion of the first mesh line, and a width of first portion of a first intersection mesh line among the plurality of first intersection mesh lines is greater than a width of second portion of the first intersection mesh line.

In an embodiment of the present inventive concept, the first mesh structure and the second mesh structure face each other and are included in one of the plurality of first electrodes or one of the plurality of second electrodes.

In an embodiment of the present inventive concept, the first mesh structure and the second mesh structure face each other, the first mesh structure is included in one of the plurality of first electrodes, and the second mesh structure is included in one of the plurality of second electrodes.

In an embodiment of the present inventive concept, a distance between the plurality of first mesh lines is greater than a distance between the plurality of second mesh lines.

In an embodiment of the present inventive concept, in the second sensing area, an arrangement density of the plurality of first mesh lines and an arrangement density of the plurality of first intersection mesh lines are gradually lowered as the transmissive area is approached.

In an embodiment of the present inventive concept, a border between the first sensing area and the second sensing area has a circular shape.

In an embodiment of the present inventive concept, a border between the first sensing area and the second sensing area has a polygonal shape.

In an embodiment of the present inventive concept, the display panel includes: a first pixel including a first light emitting element and a first pixel circuit, wherein the first light emitting element is disposed in the first area, and the first pixel circuit is configured to drive the first light emitting element and is disposed in the second area; a second pixel including a second light emitting element and a second pixel circuit, wherein the second light emitting element is disposed in the second area, and the second pixel circuit is configured to drive the second light emitting element and is disposed in the second area; and a third pixel including a third light emitting element and a third pixel circuit, wherein the third light emitting element is disposed in the third area, and the third pixel circuit is configured to drive the third light emitting element and is disposed in the third area.

In an embodiment of the present inventive concept, the first light emitting element includes a plurality of first light emitting elements, wherein the third light emitting element includes a plurality of third light emitting elements, and wherein a distance between two first light emitting elements most adjacent to each other among the plurality of first light emitting elements is greater than a distance between two third light emitting elements most adjacent to each other among the plurality of third light emitting elements.

According to an embodiment of the present inventive concept, an electronic device includes: a display panel; a sensor disposed on the display panel, wherein the sensor has a transmissive area, a first sensing area, and a second sensing area, wherein the first sensing area is adjacent to the transmissive area, and the second sensing area is spaced apart from the transmissive area with the first sensing area disposed therebetween; and an electronic module disposed on the display panel and configured to overlap the transmissive area, wherein the sensor includes: a first mesh structure disposed in the first sensing area, wherein the first mesh structure includes a plurality of first mesh lines and a plurality of first intersection mesh lines configured to intersect the plurality of first mesh lines; and a second mesh structure disposed in the second sensing area, wherein the second mesh structure includes a plurality of second mesh lines and a plurality of second intersection mesh lines configured to intersect the plurality of second mesh lines, and wherein an area of the first mesh structure is different from an area of the second mesh structure.

In an embodiment of the present inventive concept, the first mesh structure includes a plurality of first disconnection portions formed in the plurality of first mesh lines and the plurality of first intersection mesh lines, and the second mesh structure includes a plurality of second disconnection portions formed in the plurality of second mesh lines and the plurality of second intersection mesh lines, and wherein an arrangement density of the plurality of first disconnection portions is lower than an arrangement density of the plurality of second disconnection portions.

BRIEF DESCRIPTION OF THE FIGURES

The above and other features of the present inventive concept will become more apparent by describing in detail embodiments thereof with reference to the accompanying drawings, in which.

DETAILED DESCRIPTION OF THE EMBODIMENTS

Figure 1:
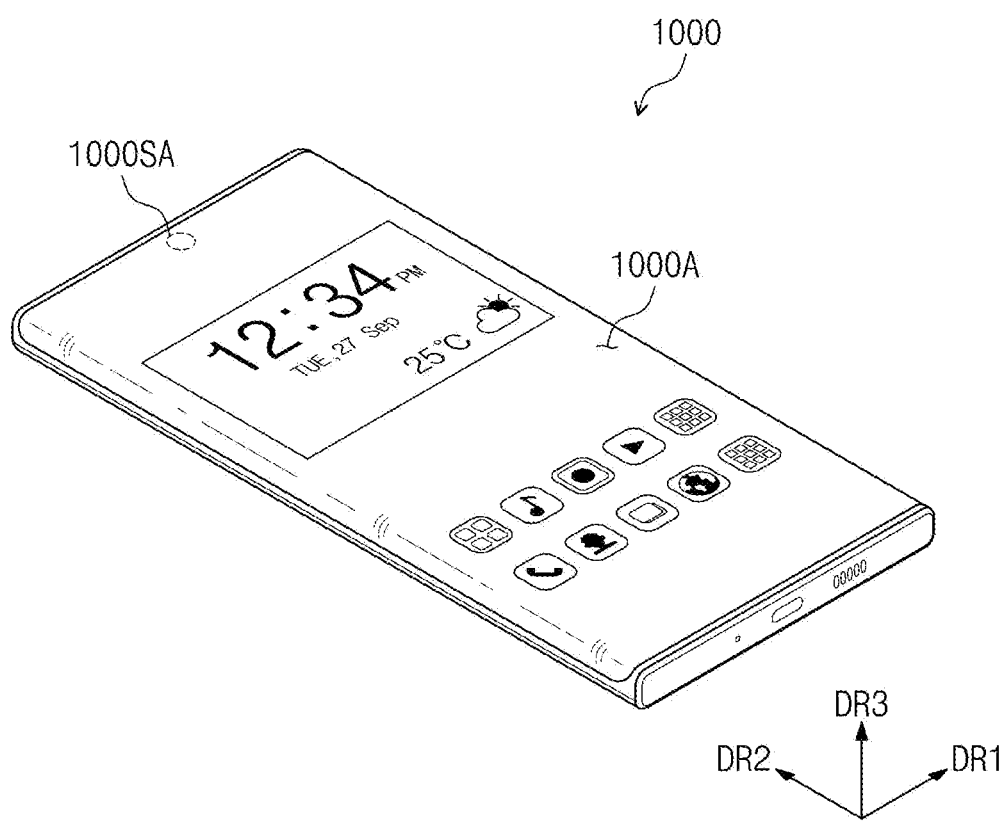
FIG. 1 is a perspective view of an electronic device according to an embodiment of the present inventive concept.

In this specification, it will be understood that when a component (or, an area, a layer, a part, etc.) is referred to as being "on", "connected to" or "coupled to" another component, the component may be directly on, connected to, or coupled to the other component or a third component may be present therebetween.

Identical reference numerals may refer to identical components throughout the specification. Additionally, in the drawings, the thicknesses, proportions, and dimensions of components may be exaggerated for clarity. As used herein, the term "and/or" includes all of one or more combinations of one or more of the associated listed items.

Terms such as first, second, and the like may be used to describe various components, but the components should not be limited by these terms. The terms may be used only for distinguishing one component from other components. For example, without departing the scope of the present inventive concept, a first component may be referred to as a second component, and similarly, the second component may also be referred to as the first component. The terms of a singular form may include plural forms unless otherwise specified. As used herein, the singular forms, "a", "an" and "the" are intended to include the plural forms as well, unless the context clearly indicates otherwise.

In addition, terms such as "below", "under", "above", "over" and the like, may be used to describe one element's relation to another element(s) as illustrated in the figures. It will be understood that the spatially relative terms are intended to encompass different orientations of the device in use or operation in addition to the orientation depicted in the figures. For example, if the device in the figures is turned over, components described as "below" or "beneath" other components or features would then be oriented "above" the other components or features. The terms are relative concepts and may be described based on directions illustrated in the drawing.

Hereinafter, embodiments of the present inventive concept will be described with reference to the accompanying drawings.

FIG. 1 is a perspective view of an electronic device according to an embodiment of the present disclosure.

Referring to FIG. 1, the electronic device 1000 may be a device activated based on an electrical signal. For example, the electronic device 1000 may be, but is not limited to, a mobile phone, a tablet computer, a monitor, a television, a car navigation system, a portable gaming device, or a wearable device. In FIG. 1, the electronic device 1000 is illustrated as a mobile phone.

The electronic device 1000 may display an image through a display area 1000A. The display area 1000A may include a flat surface parallel to a plane formed by a first direction DR1 and a second direction DR2. For example, the display area 1000A may further include curved surfaces bent from at least two sides of the flat surface of the display area 1000A. However, the shape of the display area 1000A is not limited thereto. For example, the display area 1000A may include only the flat surface, or may include four curved surfaces bent from at least two sides, for example, four sides of the flat surface. As another example, the display area 1000A may include only one curved surface bent from one side of the flat surface of the display area 1000A.

A sensing area 1000SA may be provided in the display area 1000A of the electronic device 1000. Although one sensing area 1000SA is illustrated in FIG. 1, the number of sensing areas 1000SA is not limited thereto. The sensing area 1000SA may be a portion of the display area 1000A. Accordingly, the electronic device 1000 may display an image through the sensing area 1000SA.

An electronic module may be disposed in an area overlapping the sensing area 1000SA. The electronic module may receive an external input transferred through the sensing area 1000SA, or may provide an output through the sensing area 1000SA. For example, the electronic module may be a camera module, a sensor (e.g., a proximity sensor) that measures a distance, a sensor that recognizes a part of a user's body (e.g., a fingerprint, an iris, or a face), or a small lamp that outputs light, but the present inventive concept is not limited thereto.

The thickness direction of the electronic device 1000 may be parallel to a third direction DR3 crossing the first direction DR1 and the second direction DR2. Accordingly, front surfaces (or, e.g., upper surfaces) and rear surfaces (or, e.g., lower surfaces) of members constituting the electronic device 1000 may be based on the third direction DR3.

Figure 2:
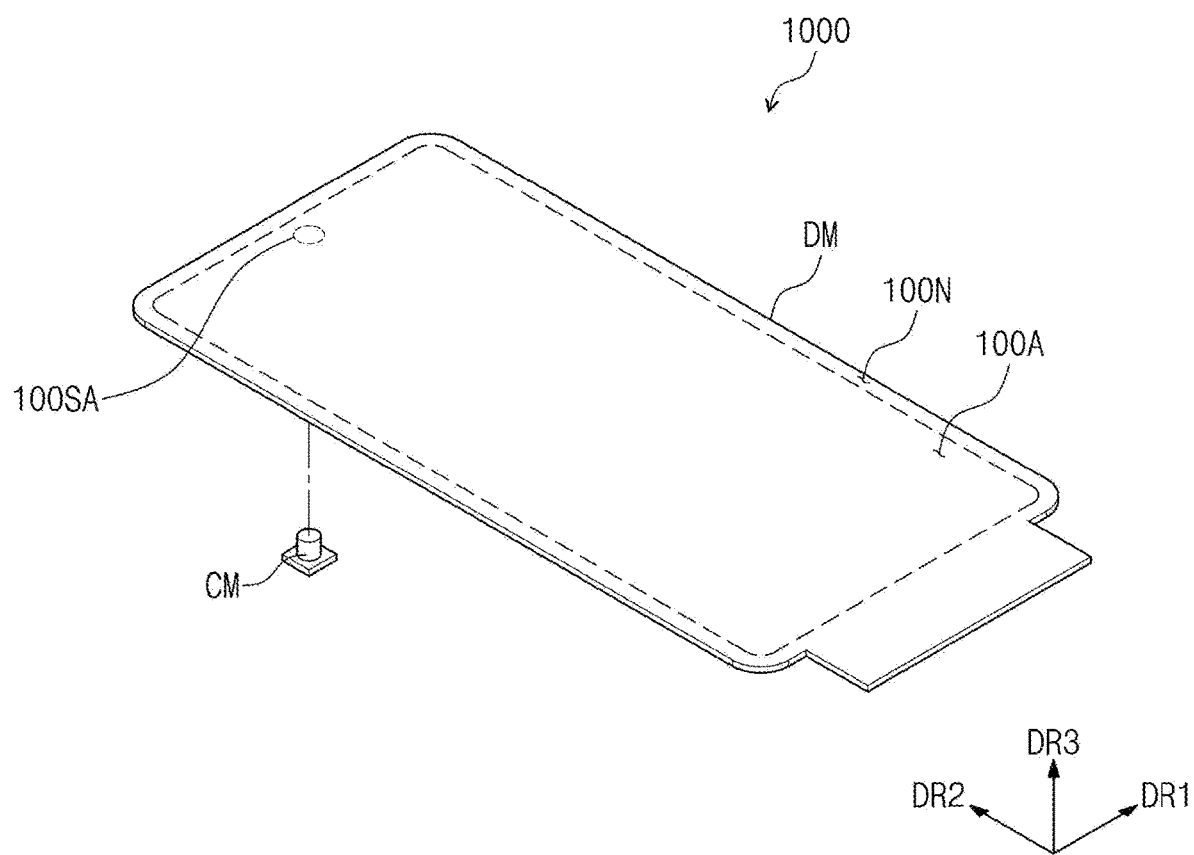
FIG. 2 is an exploded perspective view illustrating some components of the electronic device according to an embodiment of the present inventive concept.

FIG. 2 is an exploded perspective view illustrating some components of the electronic device according to an embodiment of the present inventive concept.

Referring to FIG. 2, the electronic device 1000 may include a display module DM and an electronic module CM. The display module DM may generate an image and may sense an input applied from the outside. The electronic module CM may be disposed under the display module DM and may be, for example, a camera module. The display module DM and the electronic module CM may be referred to as the first electronic module and the second electronic module, respectively.

A display area 100A and a peripheral area 100N may be provided in the display module DM. The display area 100A may correspond to the display area 1000A illustrated in FIG. 1. One portion of the display module DM may have a higher transmittance than another portion thereof and may be a sensing area 100SA. The sensing area 100SA may be a portion of the display area 100A. For example, the sensing area 100SA may display an image and may transmit an external input that is provided to the electronic module CM and/or an output from the electronic module CM.

Figure 3:
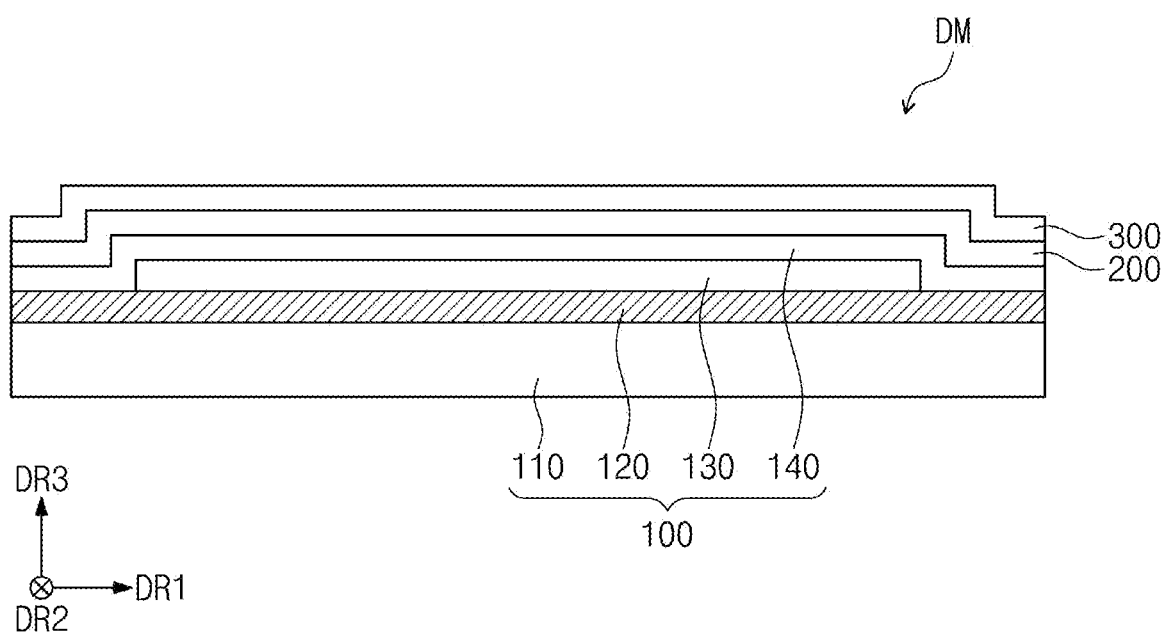
FIG. 3 is a sectional view of a display module according to an embodiment of the present inventive concept.

FIG. 3 is a sectional view of the display module according to an embodiment of the present inventive concept.

Referring to FIG. 3, the display module DM may include a display panel 100, a sensor 200, and an anti-reflection layer 300.

The display panel 100 may be a component that generates an image. The display panel 100 may be an emissive display panel. For example, the display panel 100 may be an organic light emitting display panel, an inorganic light emitting display panel, a quantum-dot display panel, a micro LED display panel, or a nano LED display panel. The display panel 100 may be referred to as the display layer.

The display panel 100 may include a base layer 110, a circuit layer 120, a light emitting element layer 130, and an encapsulation layer 140.

The base layer 110 may be a layer that provides a base surface on which the circuit layer 120 is disposed. The base layer 110 may be a rigid substrate or a flexible substrate that can be bent, folded, or rolled. The base layer 110 may be, for example, a glass substrate, a metal substrate, or a polymer substrate. However, without being limited thereto, the base layer 110 may be an inorganic layer, an organic layer, or a composite layer.

The base layer 110 may have a multi-layer structure. For example, the base layer 110 may include a first synthetic resin layer, an intermediate layer having a multi-layer structure or a single-layer structure, and a second synthetic resin layer disposed on the intermediate layer. For example, the intermediate layer may be referred to as the base barrier layer. The intermediate layer may include, but is not limited to, a silicon oxide (SiOx) layer and an amorphous silicon (a-Si) layer disposed on the silicon oxide layer. For example, the intermediate layer may include at least one of a silicon oxide layer, a silicon nitride layer, a silicon oxy-nitride layer, and/or an amorphous silicon layer.

Each of the first and second synthetic layers may include a polyimide-based resin. In addition, each of the first and second synthetic layers may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, and/or a perylene-based resin. In addition, a "~~"-based resin used herein may refer to a resin including a "~~" functional group.

The circuit layer 120 may be disposed on the base layer 110. The circuit layer 120 may include, for example, an insulating layer, a semiconductor pattern, a conductive pattern, and a signal line. The insulating layer, a semiconductor layer, and a conductive layer may be formed on the base layer 110 by a method such as coating or deposition and may be selectively subjected to patterning by performing a photolithography process a plurality of times. Thereafter, the semiconductor pattern, the conductive pattern, and the signal line included in the circuit layer 120 may be formed.

The light emitting element layer 130 may be disposed on the circuit layer 120. The light emitting element layer 130 may include light emitting elements. For example, the light emitting element layer 130 may include an organic light emitting material, an inorganic light emitting material, an organic-inorganic light emitting material, a quantum dot, a quantum rod, a micro LED, or a nano LED.

The encapsulation layer 140 may be disposed on the light emitting element layer 130. The encapsulation layer 140 may protect the light emitting element layer 130 from foreign matter such as moisture, oxygen, and dust particles. For example, the encapsulation layer 140 may include an organic layer and an inorganic layer stacked on each other.

The sensor 200 may be disposed on the display panel 100. The sensor 200 may sense an external input applied from the outside. The external input may be an input of the user. The input of the user may include various forms of external inputs such as a part of the user's body, light, heat, a pen, or pressure.

The sensor 200 may be formed on the display panel 100 through a continuous process. For example, the sensor 200 may be directly disposed on the display panel 100. When the sensor 200 is directly disposed on the display panel 100, a third component might not be disposed between the sensor 200 and the display panel 100. For example, a separate adhesive member might not be disposed between the sensor 200 and the display panel 100. In addition, the sensor 200 may be coupled with the display panel 100 through an adhesive member. The adhesive member may include a conventional adhesive or sticky substance.

The anti-reflection layer 300 may be disposed on the sensor 200. The anti-reflection layer 300 may decrease the reflectivity of external light incident from outside the display module DM. The anti-reflection layer 300 may be formed on the sensor 200 through a continuous process. The anti-reflection layer 300 may include color filters. The color filters may have a predetermined arrangement. For example, the color filters may be arranged in consideration of the colors of light emitted by pixels included in the display panel 100. Furthermore, the anti-reflection layer 300 may further include a black matrix adjacent to the color filters. In an embodiment of the present inventive concept, the anti-reflection layer 300 may be omitted.

Figure 4:
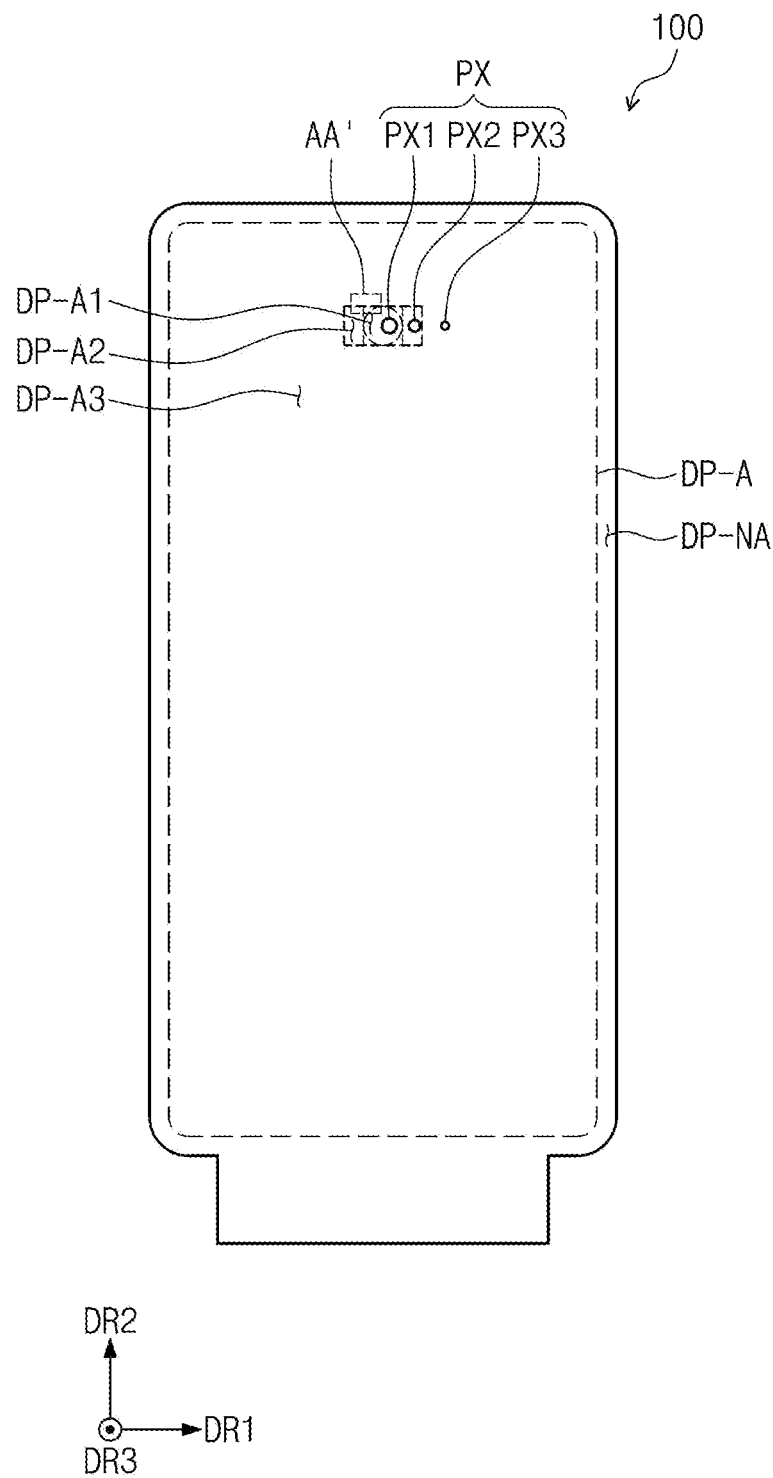
FIG. 4 is a plan view of a display panel according to an embodiment of the present inventive concept.
Figure 5:
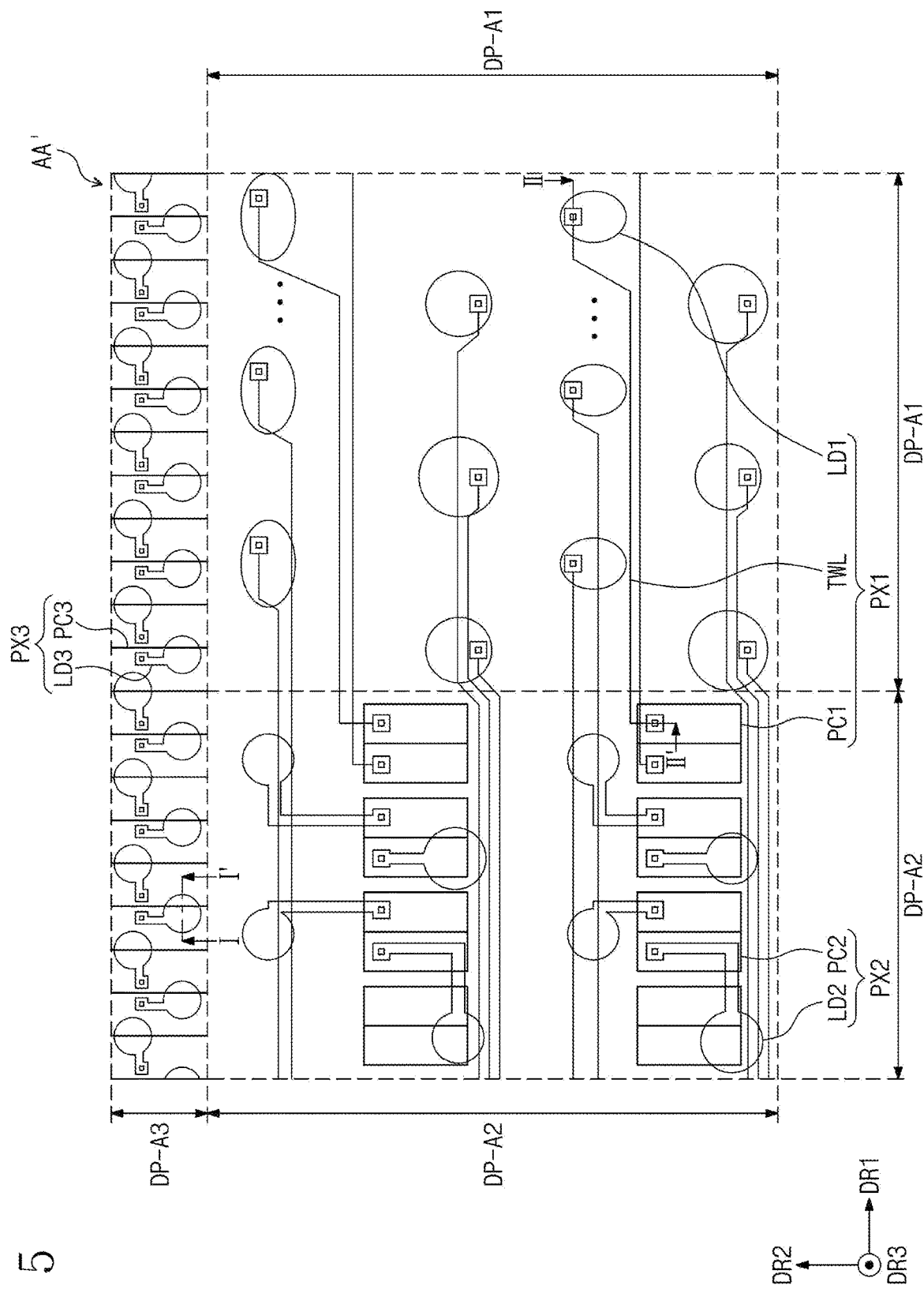
FIG. 5 is an enlarged plan view illustrating area AA' of FIG. 4.

FIG. 4 is a plan view of the display panel according to an embodiment of the present inventive concept. FIG. 5 is an enlarged plan view illustrating area AA' of FIG. 4.

Referring to FIGS. 4 and 5, the display panel 100 may include a display area DP-A and a peripheral area DP-NA. The peripheral area DP-NA may be adjacent to the display area DP-A and may surround at least part of the display area DP-A.

The display area DP-A may include a first area DP-A1, a second area DP-A2, and a third area DP-A3. The first area DP-A1 may be referred to as the component area, the second area DP-A2 may be referred to as the intermediate area or the transition area, and the third area DP-A3 may be referred to as the main display area or the normal display area. The first area DP-A1 and the second area DP-A2 may be referred to as the auxiliary display area.

The display panel 100 may include a plurality of pixels PX. The plurality of pixels PX may include a first pixel PX1, a second pixel PX2, and a third pixel PX3. The first pixel PX1 emits light in the first area DP-A1. The second pixel PX2 emits light in the second area DP-A2, and the third pixel PX3 emits light in the third area DP-A3.

A plurality of first pixels PX1, a plurality of second pixels PX2, and a plurality of third pixels PX3 may be provided. In this case, each of the first to third pixels PX1, PX2, and PX3 may include, for example, a red pixel, a green pixel, and a blue pixel and may further include a white pixel according to an embodiment of the present inventive concept.

The first pixel PX1 may include a first light emitting element LD1 and a first pixel circuit PC1 that drives the first light emitting element LD1. The second pixel PX2 may include a second light emitting element LD2 and a second pixel circuit PC2 that drives the second light emitting element LD2. The third pixel PX3 may include a third light emitting element LD3 and a third pixel circuit PC3 that drives the third light emitting element LD3. The positions of the first pixel PX1, the second pixel PX2, and the third pixel PX3 in FIG. 4 are illustrated to correspond to the positions of the first, second, and third light emitting elements LD1, LD2, and LD3.

The first area DP-A1 may overlap or correspond to the sensing area 1000SA illustrated in FIG. 1. For example, the first area DP-A1 may be provided in an area overlapping the electronic module CM (refer to FIG. 2) on a plane. For example, an external input (e.g., light) may be provided to the electronic module CM through the first area DP-A1, and an output from the electronic module CM may be emitted to the outside through the first area DP-A1. Although the first area DP-A1 is illustrated in a circular shape in this embodiment, the first area DP-A1 may have various shapes, such as a polygonal shape, an oval shape, a shape having at least one curved side, or an irregular shape, and the present inventive concept is not limited thereto.

To secure the area of a transmissive area, a smaller number of pixels may be provided in the first area DP-A1 than in the third area DP-A3. The area where the first light emitting element LD1 is not disposed in the first area DP-A1 may be the transmissive area. For example, the area where a first pixel electrode of the first light emitting element LD1 and a pixel defining pattern surrounding the first pixel electrode are not disposed in the first area DP-A1 may be the transmissive area.

The number of first pixels PX1 per unit area or the same area in the first area DP-A1 may be smaller than the number of third pixels PX3 per unit area or the same area in the third area DP-A3. For example, the resolution of the first area DP-A1 may be equal to about ½, ⅜, ⅓, ¼, ⅖, ⅛, ⅑, or 1/16 of the resolution of the third area DP-A3. For example, the third area DP-A3 may have a resolution of about 400 ppi or more, and the first area DP-A1 may have a resolution of about 200 ppi or about 100 ppi. However, this is illustrative, and the present inventive concept is not particularly limited thereto.

The first pixel circuit PC1 of the first pixel PX1 may not be disposed in the first area DP-A1. For example, the first pixel circuit PC1 may be disposed in the second area DP-A2 or the peripheral area DP-NA. In this case, the light transmittance of the first area DP-A1 may be higher than a case where the first pixel circuit PC1 is disposed in the first area DP-A1.

The first light emitting element LD1 and the first pixel circuit PC1 may be electrically connected with each other through a connecting line TWL. The connecting line TWL may overlap the transmissive area of the first area DP-A1. The connecting line TWL may include a transparent conductive line. The transparent conductive line may include a transparent conductive material or a light transmissive material. For example, the connecting line TWL may be formed of a film of transparent conductive oxide (TCO) such as indium tin oxide (ITO), indium zinc oxide (IZO), indium gallium zinc oxide (IGZO), or indium oxide (In$_2$O$_3$).

The second area DP-A2 is adjacent to the first area DP-A1. The second area DP-A2 may surround at least part of the first area DP-A1. The second area DP-A2 may have a lower transmittance than that of the first area DP-A1. In this embodiment, the second area DP-A2 may be spaced apart from the peripheral area DP-NA. However, without being limited thereto, the second area DP-A2 may be in contact with the peripheral area DP-NA.

The first pixel circuit PC1 of the first pixel PX1, the second light emitting element LD2, and the second pixel circuit PC2 may be disposed in the second area DP-A2. Accordingly, the light transmittance of the second area DP-A2 may be lower than that of the light transmittance of the first area DP-A1. Furthermore, as the first pixel circuit PC1 of the first pixel PX1 is disposed in the second area DP-A2, the number of second pixels PX2 per unit area or the same area in the second area DP-A2 may be smaller than the number of third pixels PX3 per unit area or the same area in the third area DP-A3. The resolution of an image displayed on the second area DP-a2 may be lower than the resolution of an image displayed on the third area DP-A3.

The third area DP-A3 is adjacent to the second area DP-A2. The third area DP-A3 may be an area having a lower transmittance than that of the first area DP-A1. The third light emitting element LD3 and the third pixel circuit PC3 may be disposed in the third area DP-A3.

A plurality of first light emitting elements LD1, a plurality of second light emitting elements LD2, and a plurality of third light emitting elements LD3 may be provided. The interval between two first light emitting elements LD1 most adjacent to each other among the first light emitting elements LD1 may be greater than the interval between two third light emitting elements LD3 most adjacent to each other among the third light emitting elements LD3. Furthermore, the interval between two second light emitting elements LD2 most adjacent to each other among the second light emitting elements LD2 may be greater than the interval between two third light emitting elements LD3 most adjacent to each other among the third light emitting elements LD3.

The first, second, and third light emitting elements LD1, LD2, and LD3 illustrated in FIG. 5 may respectively correspond to the planer shapes of a first pixel electrode AE1 (refer to FIG. 6B) of the first light emitting element LD1, a second pixel electrode AE2 (refer to FIG. 6B) of the second light emitting element LD2, and a third pixel electrode AE3 (refer to FIG. 6A) of the third light emitting element LD3. For example, the area of the first pixel electrode AE1 (refer to FIG. 6B) may be greater than the area of the third pixel electrode AE3 (refer to FIG. 6A).

Figure 6A:
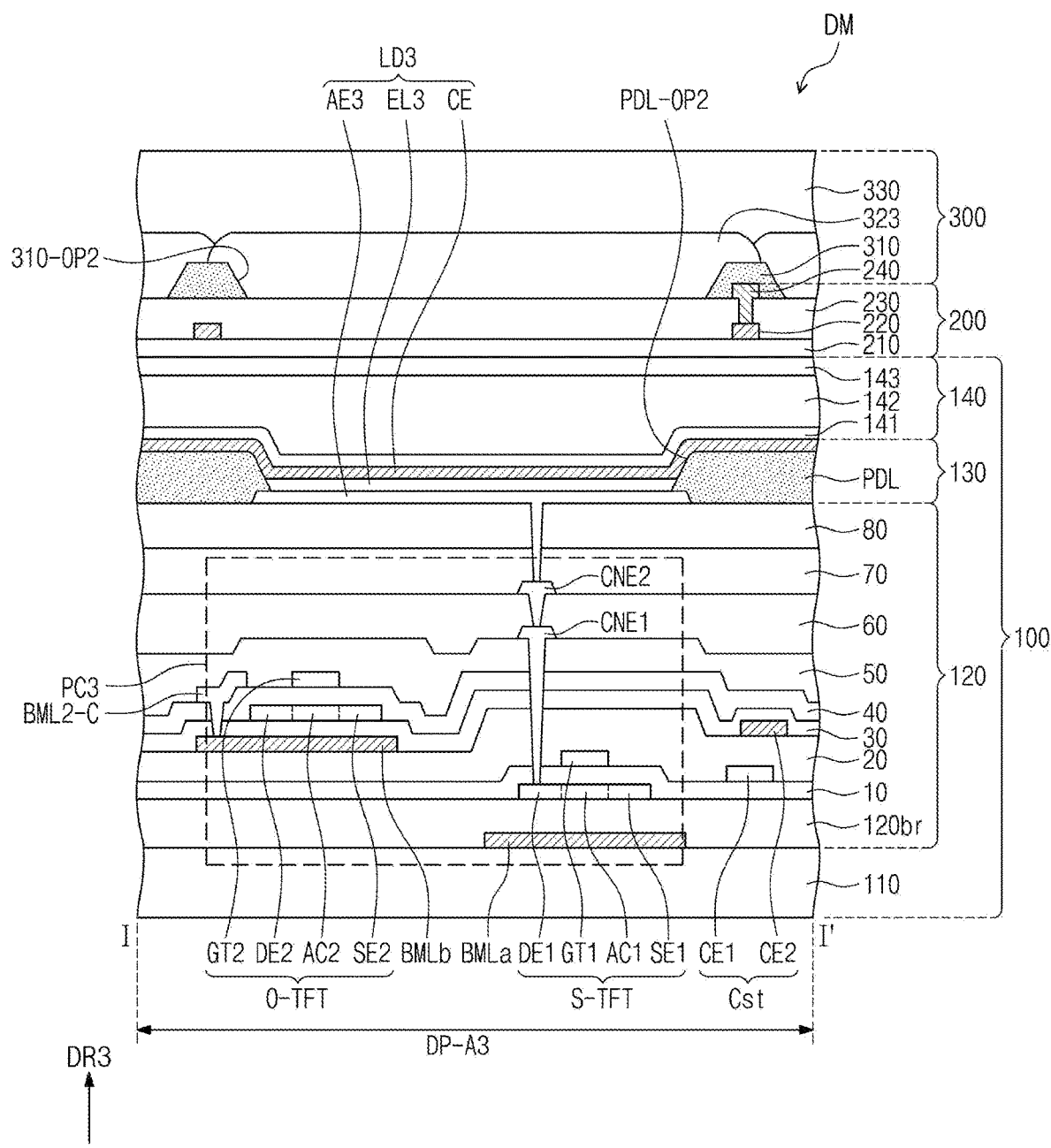
FIG. 6A is a sectional view of the display module taken along line I-I' illustrated in FIG. 5.
Figure 6B:
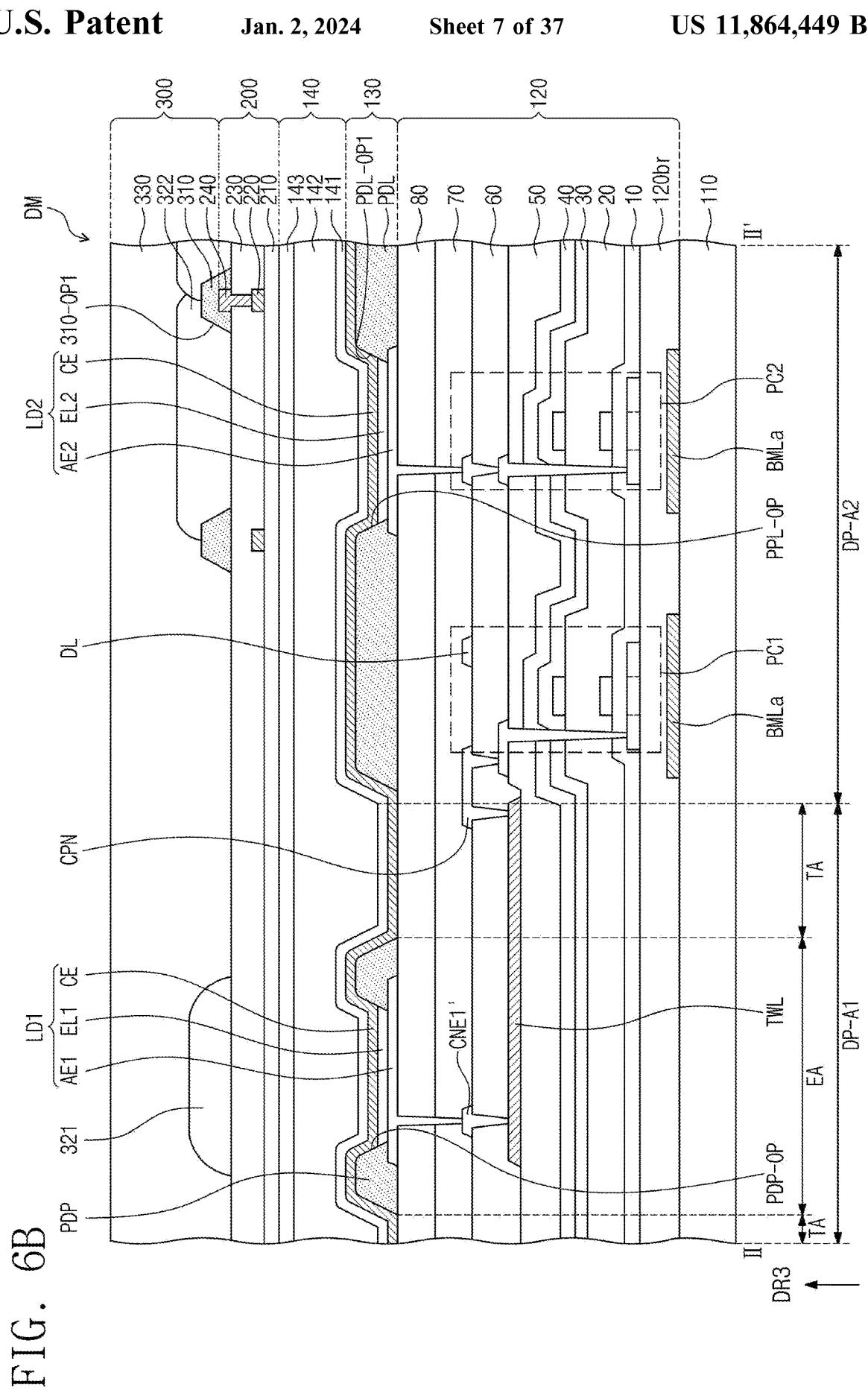
FIG. 6B is a sectional view of the display module taken along line II-II' illustrated in FIG. 5.

FIG. 6A is a sectional view of the display module taken along line I-I' illustrated in FIG. 5. FIG. 6B is a sectional view of the display module taken along line II-II' illustrated in FIG. 5. FIG. 6A is a sectional view of a portion of the display panel 100 including the third area DP-A3, and FIG. 6B is a sectional view of a portion of the display panel 100 including the first area DP-A1 and the second area DP-A2.

Referring to FIGS. 6A and 6B, the display panel 100 may include a plurality of insulating layers, a semiconductor pattern, a conductive pattern, and a signal line. An insulating layer, a semiconductor layer, and a conductive layer may be formed by a method such as coating or deposition. Thereafter, the insulating layer, the semiconductor layer, and the conductive layer may be selectively subjected to patterning by photolithography. The semiconductor pattern, the conductive pattern, and the signal line included in the circuit layer 120 and the light emitting element layer 130 may be formed by the above-described method. Thereafter, the encapsulation layer 140 that covers the light emitting element layer 130 may be formed.

In FIG. 6A, the third light emitting element LD3, a silicon thin film transistor S-TFT and an oxide thin film transistor O-TFT of the third pixel circuit PC3 (refer to FIG. 5) are illustrated. In FIG. 6B, the first light emitting element LD1, the first pixel circuit PC1, the second light emitting element LD2, and the second pixel circuit PC2 are illustrated.

A buffer layer 120*br* may be disposed on the base layer 110. The buffer layer 120*br* may prevent diffusion of metal atoms or impurities from the base layer 110 to a first semiconductor pattern. Furthermore, the buffer layer 120*br* may allow the first semiconductor pattern to be substantially uniformly formed, by adjusting the speed at which heat is provided during a crystallization process for forming the first semiconductor pattern.

A first rear metal layer BMLa may be disposed under the silicon thin film transistor S-TFT, and a second rear metal layer BMLb may be disposed under the oxide thin film transistor O-TFT. The first and second rear metal layers BMLa and BMLb may be disposed to overlap the first to third pixel circuits PC1, PC2, and PC3 to protect the first to third pixel circuits PC1, PC2, and PC3. The first and second rear metal layers BMLa and BMLb may prevent electric potential due to polarization of the base layer 110 from affecting the first to third pixel circuits PC1, PC2, and PC3.

The first rear metal layer BMLa may be disposed to correspond to at least a portion of a pixel circuit. For example, the first rear metal layer BMLa may overlap at least a portion of the pixel circuit. In an embodiment of the present inventive concept, the first rear metal layer BMLa may be disposed to overlap a drive thin film transistor implemented with the silicon thin film transistor S-TFT.

The first rear metal layer BMLa may be disposed between the base layer 110 and the buffer layer 120*br*. In an embodiment of the present inventive concept, the first rear metal layer BMLa may be disposed on the base layer 110 in which organic films and inorganic films are alternately stacked. In addition, in an embodiment of the present inventive concept, the first rear metal layer BMLa may be disposed in the buffer layer 120*br*. In this case, an inorganic barrier layer may be disposed between the first rear metal layer BMLa and the buffer layer 120*br*. The first rear metal layer BMLa may be connected with an electrode or a line and may receive a constant voltage or a signal from the electrode or the line. In an embodiment of the present inventive concept, the first rear metal layer BMLa may be provided in a form isolated from another electrode or line.

The second rear metal layer BMLb may be disposed to correspond to a lower portion of the oxide thin film transistor O-TFT. For example, the second rear metal layer BMLb may overlap at least a portion of the oxide thin film transistor O-TFT. The second rear metal layer BMLb may be disposed between a second insulating layer 20 and a third insulating layer 30. The second rear metal layer BMLb may be disposed in the same layer as a second electrode CE2 of a storage capacitor Cst. The second rear metal layer BMLb may be connected with a contact electrode BML2-C and may receive a constant voltage or a signal from the contact electrode BML2-C. The contact electrode BML2-C may be disposed in the same layer as a second gate electrode GT2 of the oxide thin film transistor O-TFT.

Each of the first rear metal layer BMLa and the second rear metal layer BMLb may include, for example, a reflective metal. For example, each of the first rear metal layer BMLa and the second rear metal layer BMLb may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), titanium (Ti), and p+ doped amorphous silicon. The first rear metal layer BMLa and the second rear metal layer BMLb may include the same material as each other, or may contain different materials from each other.

The first semiconductor pattern may be disposed on the buffer layer 120*br*. The first semiconductor pattern may include a silicon semiconductor. For example, the silicon semiconductor may include amorphous silicon or polycrystalline silicon. For example, the first semiconductor pattern may include low-temperature poly silicon.

Only a portion of the first semiconductor pattern disposed on the buffer layer 120*br* is illustrated in FIG. 6A, and the first semiconductor pattern may be further disposed in another area. The first semiconductor pattern may be arranged across pixels according to a specific rule. The first semiconductor pattern may have different electrical properties depending on whether the first semiconductor pattern is doped or not. The first semiconductor pattern may include a first area, which has a high conductivity, and a second area, which has a low conductivity. The first area may be doped with an N-type dopant or a P-type dopant. A P-type transistor may include a doped area doped with a P-type dopant, and an N-type transistor may include a doped area doped with an N-type dopant. The second area may be an undoped area, or may be an area more lightly doped than the first area.

The first area of the first semiconductor pattern may have a higher conductivity than the second area of the first semiconductor pattern and may substantially serve as an electrode or a signal line. The second area may substantially correspond to an active area (or, e.g., a channel) of a transistor. In other words, a portion of a semiconductor pattern may be an active area of a transistor, and another portion of the semiconductor pattern may be a source or a drain of the transistor. Another portion of the semiconductor pattern may be a connecting electrode or a connecting signal line.

A source area SE1, an active area AC1, and a drain area DE1 of the silicon thin film transistor S-TFT may be formed from the first semiconductor pattern. The source area SE1 and the drain area DE1 may extend from the active area AC1 in opposite directions on the section. For example, the active area AC1 may be between the source area SE1 and the drain area DE1.

A first insulating layer 10 may be disposed on the buffer layer 120*br*. The first insulating layer 10 may commonly overlap the plurality of pixels PX (refer to FIG. 4) and may cover the first semiconductor pattern. The first insulating layer 10 may be, for example, an inorganic layer and/or an organic layer and may have a single-layer structure or a multi-layer structure. The first insulating layer 10 may include at least one of aluminum oxide, titanium oxide, silicon oxide, silicon nitride, silicon oxy-nitride, zirconium oxide, or hafnium oxide. In this embodiment, the first insulating layer 10 may be a single layer of silicon oxide. In addition, insulating layers of the circuit layer 120 to be described below may be inorganic layers and/or organic layers and may have a single-layer structure or a multi-layer structure. The inorganic layers may include at least one of the aforementioned materials, but the present inventive concept is not limited thereto.

A gate GT1 of the silicon thin film transistor S-TFT may be disposed on the first insulating layer 10. The gate GT1 may be a portion of a metal pattern. The gate GT1 may overlap the active area AC. For example, the gate GT1 may function as a mask in a process of doping the first semiconductor pattern. The gate GT1 may include titanium (Ti), silver (Ag), an alloy, which includes silver and molybdenum (Mo), an alloy which includes molybdenum and aluminum (Al), and/or an alloy, which includes aluminum, aluminum nitride (AlN), tungsten (W), tungsten nitride (WN), copper (Cu), indium tin oxide (ITO), or indium zinc oxide (IZO), but the present inventive concept is not particularly limited thereto.

The second insulating layer 20 may be disposed on the first insulating layer 10 and may cover the gate GT1. The second insulating layer 20 may be an inorganic layer and/or an organic layer and may have a single-layer structure or a multi-layer structure. The second insulating layer 20 may include at least one of silicon oxide, silicon nitride, and/or silicon oxy-nitride. In this embodiment, the second insulating layer 20 may have a multi-layer structure including a silicon oxide layer and a silicon nitride layer.

The third insulating layer 30 may be disposed on the second insulating layer 20. The third insulating layer 30 may have a single-layer structure or a multi-layer structure. For example, the third insulating layer 30 may have a multi-layer structure including a silicon oxide layer and a silicon nitride layer. The second electrode CE2 of the storage capacitor Cst may be disposed between the second insulating layer 20 and the third insulating layer 30. Furthermore, a first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include a plurality of areas distinguished depending on whether metal oxide is reduced or not. An area (hereinafter, referred to as the reduced area) where metal oxide is reduced may have a higher conductivity than that of an area (hereinafter, referred to as the non-reduced area) where metal oxide is not reduced. The reduced area may substantially serve as a source/drain of a transistor or a signal line. The non-reduced area may substantially correspond to an active area (or, e.g., a semiconductor area or a channel) of the transistor. In other words, a portion of the second semiconductor pattern may be an active area of a transistor, and another portion of the semiconductor pattern may be a source/drain area of the transistor. Another portion of the semiconductor pattern may be a signal transmission area.

A source area SE2, an active area AC2, and a drain area DE2 of the oxide thin film transistor O-TFT may be formed from the second semiconductor pattern. The source area SE2 and the drain area DE2 may extend from the active area AC2 in opposite directions on the section.

A fourth insulating layer 40 may be disposed on the third insulating layer 30. The fourth insulating layer 40 may commonly overlap the plurality of pixels PX (refer to FIG. 4) and may cover the second semiconductor pattern. The fourth insulating layer 40 may include at least one of aluminum oxide, titanium oxide, silicon oxide, silicon nitride, silicon oxy-nitride, zirconium oxide, and/or hafnium oxide.

The gate GT2 of the oxide thin film transistor O-TFT may be disposed on the fourth insulating layer 40. The gate GT2 may be a portion of a metal pattern. The gate GT2 may overlap the active area AC2. The gate GT2 may function as a mask in a process of doping the second semiconductor pattern.

A fifth insulating layer 50 may be disposed on the fourth insulating layer 40 and may cover the gate GT2. The fifth insulating layer 50 may be an inorganic layer and/or an organic layer and may have a single-layer structure or a multi-layer structure.

A first connecting electrode CNE1 may be disposed on the fifth insulating layer 50. The first connecting electrode CNE1 may be connected to the drain area DE1 of the silicon thin film transistor S-TFT through a contact hole penetrating the first to fifth insulating layers 10, 20, 30, 40, and 50. Although FIG. 6A illustrates an example that the first connecting electrode CNE1 is connected to the drain area DE1 of the silicon thin film transistor S-TFT, the first connecting electrode CNE1 may be electrically connected to the drain area DE1 through a light emission control thin film transistor.

A sixth insulating layer 60 may be disposed on the fifth insulating layer 50. A second connecting electrode CNE2 may be disposed on the sixth insulating layer 60. The second connecting electrode CNE2 may be connected to the first connecting electrode CNE1 through a contact hole penetrating the sixth insulating layer 60. A seventh insulating layer 70 may be disposed on the sixth insulating layer 60 and may cover the second connecting electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vinyl alcohol-based polymer, or a blend thereof.

The light emitting element layer 130 including the first to third light emitting elements LD1, LD2, and LD3 may be disposed on the circuit layer 120. The first light emitting element LD1 may include the first pixel electrode AE1, a first emissive layer EL1, and a common electrode CE. The second light emitting element LD2 may include the second pixel electrode AE2, a second emissive layer EL2, and the common electrode CE. The third light emitting element LD3 may include the third pixel electrode AE3, a third emissive layer EL3, and the common electrode CE. The common electrode CE may be commonly provided to the pixels PX (refer to FIG. 4).

The first pixel electrode AE1, the second pixel electrode AE2, and the third pixel electrode AE3 may be disposed on the eighth insulating layer 80. Each of the first pixel electrode AE1, the second pixel electrode AE2, and the third pixel electrode AE3 may be, for example, a transparent (or, e.g., translucent) electrode or a reflective electrode. In an embodiment of the present inventive concept, each of the first pixel electrode AE1, the second pixel electrode AE2, and the third pixel electrode AE3 may include a reflective layer and transparent or translucent electrode. The reflective layer may be formed of, for example, Ag, Mg, Al, Pt, Pd, Au, Ni, Nd, Ir, Cr, or a compound thereof, and the transparent or translucent electrode layer may be formed on the reflective layer. The transparent or translucent electrode layer may include at least one of indium tin oxide (ITO), indium zinc oxide (IZO), indium gallium zinc oxide (IGZO), or indium oxide ($In_2O_3$) and/or aluminum-doped zinc oxide (AZO). For example, each of the first pixel electrode AE1, the second pixel electrode AE2, and the third pixel electrode AE3 may include ITO/Ag/ITO.

A pixel defining film PDL and a pixel defining pattern PDP may be disposed on the eighth insulating layer 80. The pixel defining film PDL and the pixel defining pattern PDP may include the same material and may be formed through the same process. Each of the pixel defining film PDL and the pixel defining pattern PDP may have a property of absorbing light. For example, each of the pixel defining film PDL and the pixel defining pattern PDP may be black in color. Each of the pixel defining film PDL and the pixel defining pattern PDP may include a black coloring agent. The black coloring agent may include a black dye or a black pigment. The black coloring agent may include carbon black, metal such as chromium, or an oxide thereof.

The pixel defining pattern PDP may be disposed in the first area DP-A1. The pixel defining pattern PDP may cover a portion of the first pixel electrode AE1. For example, the pixel defining pattern PDP may cover the periphery of the first pixel electrode AE1. The pixel defining pattern PDP may have a ring shape when viewed on a plane. As used herein, the expression "viewed on a plane" may mean that it is viewed in the third direction DR3.

The pixel defining film PDL may be disposed in the second area DP-A2 and the third area DP-A3. The pixel defining film PDL may cover a portion of each of the second pixel electrode AE2 and the third pixel electrode AE3. For example, a first opening PDL-OP1, which exposes a portion of the second pixel electrode AE2, and a second opening PDL-OP2, which exposes a portion of the third pixel electrode AE3, may be formed in the pixel defining film PDL.

The pixel defining pattern PDP may increase the distance between the periphery of the first pixel electrode AE1 and the common electrode CE, and the pixel defining film PDL may increase the distance between the periphery of the second pixel electrodes AE2 and the common electrode CE and the distance between the periphery of the third pixel electrode AE3 and the common electrode CE. Accordingly, the pixel defining pattern PDP and the pixel defining film PDL may serve to prevent arc at the peripheries of the first, second, and third pixel electrodes AE1, AE2, and AE3.

In the first area DP-A1, the area overlapping the portion where the first pixel electrode AE1 and the pixel defining pattern PDP are disposed may be an element area EA, and the remaining area may be a transmissive area TA.

The first pixel electrode AE1 may be electrically connected with the first pixel circuit PC1 disposed in the second area DP-A2. For example, the first pixel electrode AE1 may be electrically connected with the first pixel circuit PC1 through the connecting line TWL and a connecting bridge CPN. In this case, the connecting line TWL may overlap the transmissive area TA. Accordingly, the connecting line TWL may include a light transmissive material.

The connecting line TWL may be disposed between the fifth insulating layer 50 and the sixth insulating layer 60, but is not particularly limited thereto. The connecting bridge CPN may be disposed between the sixth insulating layer 60 and the seventh insulating layer 70. The connecting bridge CPN may be connected to the connecting line TWL and the first pixel circuit PC1.

The first emissive layer EL1 may be disposed on the first pixel electrode AE1. The second emissive layer EL2 may be disposed on the second pixel electrode AE2. The third emissive layer EL3 may be disposed on the third pixel electrode AE3. In this embodiment of the present inventive concept, each of the first to third emissive layers EL1, EL2, and EL3 may emit at least one of blue light, red light, or green light.

The common electrode CE may be disposed on the first to third emissive layers EL1, EL2, and EL3. The common electrode CE may have an integrated shape and may be commonly disposed for the plurality of pixels PX (refer to FIG. 4).

A hole control layer may be disposed between the first to third pixel electrodes AE1, AE2, and AE3 and the first to third emissive layers EL1, EL2, and EL3. The hole control layer may include a hole transporting layer and a hole injection layer. An electron control layer may be disposed between the first to third emissive layers EL1, EL2, and EL3 and the common electrode CE. The electron control layer may include an electron transporting layer and an electron injection layer. For example, the hole control layer and the electron control layer may be commonly formed for the plurality of pixels PX (refer to FIG. 4) by using an open mask.

The encapsulation layer 140 may be disposed on the light emitting element layer 130. The encapsulation layer 140 may include an inorganic layer 141, an organic layer 142, and an inorganic layer 143 sequentially stacked on one another. However, layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include, for example, a silicon nitride layer, a silicon oxy-nitride layer, a silicon oxide layer, a titanium oxide layer, or an aluminum oxide layer. The organic layer 142 may include, but is not limited to, an acrylate-based organic layer.

The sensor 200 may be disposed on the display panel 100. The sensor 200 may be referred to as the sensor layer, the input sensing layer, or the input sensing panel. The sensor 200 may include a base layer 210, a first conductive layer 220, a sensing insulation layer 230, and a second conductive layer 240.

The base layer 210 may be disposed on the display panel 100. For example, the base layer 210 may be directly disposed on the display panel 100. The base layer 210 may be an inorganic layer including at least one of silicon nitride, silicon oxy-nitride, and/or silicon oxide. In addition, the base layer 210 may be an organic layer including an epoxy resin, an acrylic resin, or an imide-based resin. The base layer 210 may have a single-layer structure, or may have a multi-layer structure stacked in the third direction DR3.

Each of the first conductive layer 220 and the second conductive layer 240 may have a single-layer structure, or may have a multi-layer structure stacked in the third direction DR3.

The conductive layer having the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), or indium zinc tin oxide (IZTO). In addition, the transparent conductive layer may include a conductive polymer such as PEDOT, a metal nano wire, or graphene.

The conductive layer having the multi-layer structure may include metal layers. The metal layers may have, for example, a three-layer structure of titanium/aluminum/titanium. The conductive layer having the multi-layer structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may include at least one of aluminum oxide, titanium oxide, silicon oxide, silicon nitride, silicon oxy-nitride, zirconium oxide, and/or hafnium oxide.

In addition, the sensing insulation layer 230 may include an organic film. The organic film may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyimide-based resin, a polyamide-based resin, and/or a perylene-based resin.

The sensor 200 may further include a cover layer. The cover layer may be disposed on the sensing insulation layer 230 and may cover the second conductive layer 240. The cover layer may decrease or remove a probability that the second conductive layer 240 will be damaged in a subsequent process. The cover layer may include an inorganic material. For example, the cover layer may include silicon nitride, but is not particularly limited thereto.

The anti-reflection layer 300 may be disposed on the sensor 200. The anti-reflection layer 300 may include a dividing layer 310, a first color filter 321, a second color filter 322, a third color filter 323, and a planarization layer 330.

The material of the dividing layer 310 is not particularly limited as long as it is a material that absorbs light. For example, the dividing layer 310, which is a layer having a black color, may include a black coloring agent in an embodiment of the present inventive concept. The black coloring agent may include a black dye or a black pigment. The black coloring agent may include carbon black, metal such as chromium, or oxide thereof.

The dividing layer 310 may cover the second conductive layer 240 of the sensor 200. The dividing layer 310 may prevent reflection of external light by the second conductive layer 240. The dividing layer 310 may overlap the second area DP-A2 and the third area DP-A3 and might not overlap the first area DP-A1. For example, a portion of the dividing layer 310 that overlaps the first area DP-A1 may be removed. Accordingly, the transmittance in the first area DP-A1 may be further increased.

A plurality of openings 310-OP1 and 310-OP2 may be formed in the dividing layer 310. The first opening 310-OP1 may overlap the second pixel electrode AE2, and the second opening 310-OP2 may overlap the third pixel electrode AE3.

The first color filter 321 may be disposed to overlap the first area DP-A1. The second color filter 322 may be disposed to overlap the second area DP-A2, and the third color filter 323 may be disposed to overlap the third area DP-A3. The first color filter 321 may be disposed to overlap the first pixel electrode AE1. The second color filter 322 may be disposed to overlap the second pixel electrode AE2, and the third color filter 323 may be disposed to overlap the third pixel electrode AE3.

The first color filter 321 may be spaced apart from the dividing layer 310 because the dividing layer 310 does not overlap the first area DP-A1. For example, the first color filter 321 might not make contact with the dividing layer 310. The second color filter 322 may cover the first opening 310-OP1, and the third color filter 323 may cover the second opening 310-OP2. Each of the second color filter 322 and the third color filter 323 may be disposed on dividing layer 310. For example, each of the second color filter 322 and the third color filter 323 may make contact with the dividing layer 310. The opening areas of the first and second openings 310-OP1 and 310-OP2 of the dividing layer 310 may be greater than the opening areas of the first and second openings PDL-OP1 and PDL-OP2 of the pixel defining film PDL, respectively.

The planarization layer 330 may cover the dividing layer 310, the first color filter 321, the second color filter 322, and the third color filter 323. The planarization layer 330 may include an organic material and may have a flat upper surface. In an embodiment of the present inventive concept, the planarization layer 330 may be omitted.

Figure 7A:
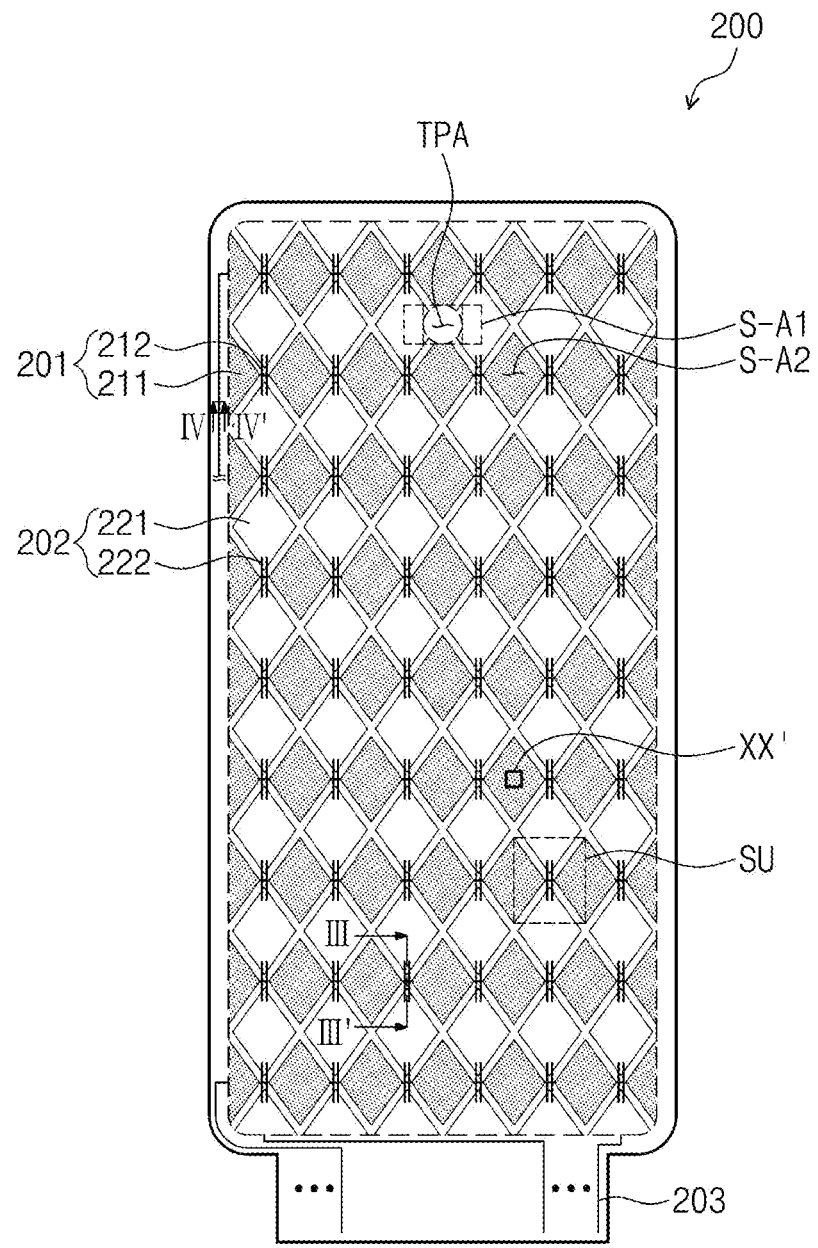
FIG. 7A is a plan view of a sensor according to an embodiment of the present inventive concept.

FIG. 7A is a plan view of the sensor according to an embodiment of the present inventive concept.

Referring to FIG. 7A, the sensor 200 may include a plurality of first electrodes 201 and a plurality of second electrodes 202. The plurality of second electrodes 202 may cross the plurality of first electrodes 201. The sensor 200 may further include a plurality of signal lines 203 connected to the plurality of first electrodes 201 and the plurality of second electrodes 202.

Each of the plurality of first electrodes 201 may include first portions 211 and second portions 212. The first portions 211 and the second portions 212 may have an integrated shape and may be disposed on the same layer. For example, the first portions 211 and the second portions 212 may be included in the second conductive layer 240 (refer to FIGS. 6A and 6B).

Each of the plurality of second electrodes 202 may include sensing patterns 221 and bridge patterns 222. Two sensing patterns 221 that are adjacent to each other may be electrically connected with each other by two bridge patterns 222. However, the present inventive concept is not particularly limited thereto. The two bridge patterns 222 may intersect a second portion 212 and may be insulated from the second portion 212. The sensing patterns 221 may be included in the second conductive layer 240 (refer to FIGS. 6A and 6B), and the bridge patterns 222 may be included in the first conductive layer 220 (refer to FIGS. 6A and 6B).

Each of the plurality of first electrodes 201 and the sensing patterns 221 may have a mesh (or, e.g., a lattice or net) structure. The sensor 200 may be disposed on the display panel 100. For example, the sensor 200 may be directly disposed on the display panel 100 (refer to FIG. 6A). In this case, the interval between the sensor 200 and the second electrode CE (refer to FIG. 6A) of the display panel 100 (refer to FIG. 6A) may be decreased. According to the present inventive concept, because each of the plurality of first electrodes 201 and the sensing patterns 221 has a mesh structure, base capacitance caused by parasitic capacitance between the first electrodes 201 and the second electrode CE (refer to FIG. 6A) and base capacitance caused by parasitic capacitance between the second electrodes 202 and the second electrode CE (refer to FIG. 6A) may be decreased, as compared with when each of the plurality of first electrodes 210 and the sensing patterns 221 has an electrode shape without an opening. Accordingly, as each of the plurality of first electrodes 201 and the sensing patterns 221 has a mesh structure, the touch sensitivity of the sensor 200 may be increased. In addition, to further decrease parasitic capacitance, some of the mesh lines constituting the first portions 211 and the sensing patterns 221 may be removed in the form of a closed curve, and an electrically insulated dummy pattern surrounded by the closed curve may be additionally provided.

A transmissive area TPA, a first sensing area S-A1, and a second sensing area S-A2 may be formed in the sensor 200. Referring to FIGS. 4 and 7A, the transmissive area TPA may overlap the first area DP-A1 of the display panel 100. The first sensing area S-A1 may overlap the second area DP-A2 of the display panel 100, and the second sensing area S-A2 may overlap the third area DP-A3 of the display panel 100. The plurality of first electrodes 201 and the plurality of second electrodes 202 might not be disposed in the transmissive area TPA. Accordingly, the transmittance of the transmissive area TPA may be further increased.

Figure 7B:
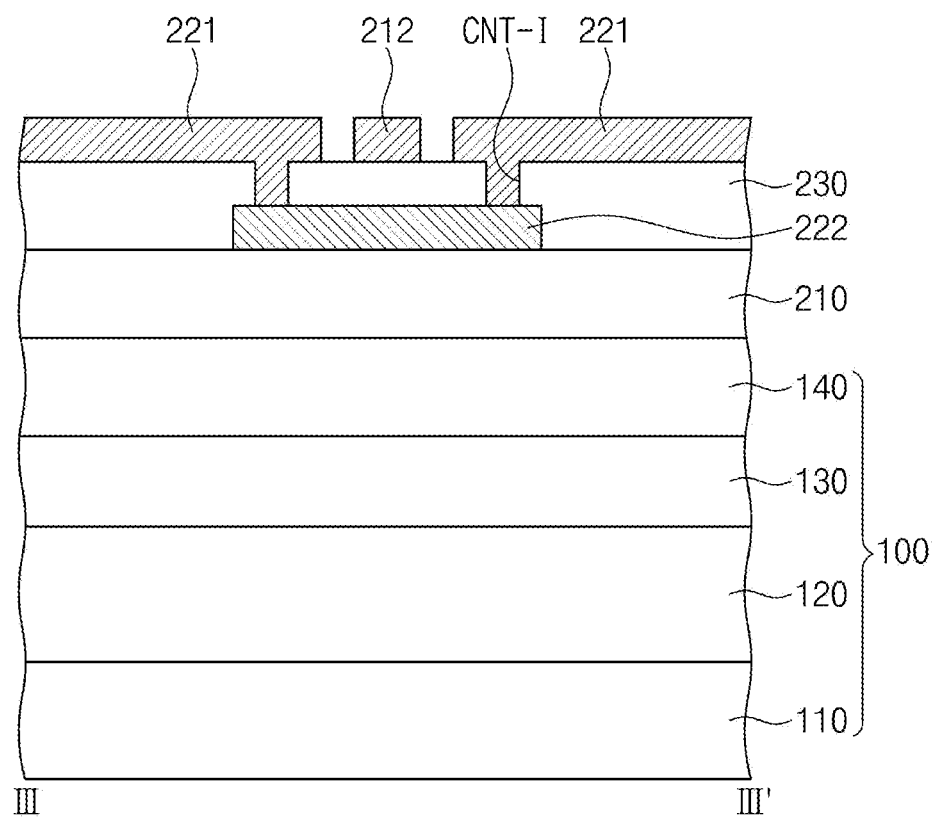
FIG. 7B is a sectional view of the sensor taken along line III-III' illustrated in FIG. 7A.
Figure 7B:
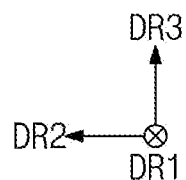
Figure 7C:
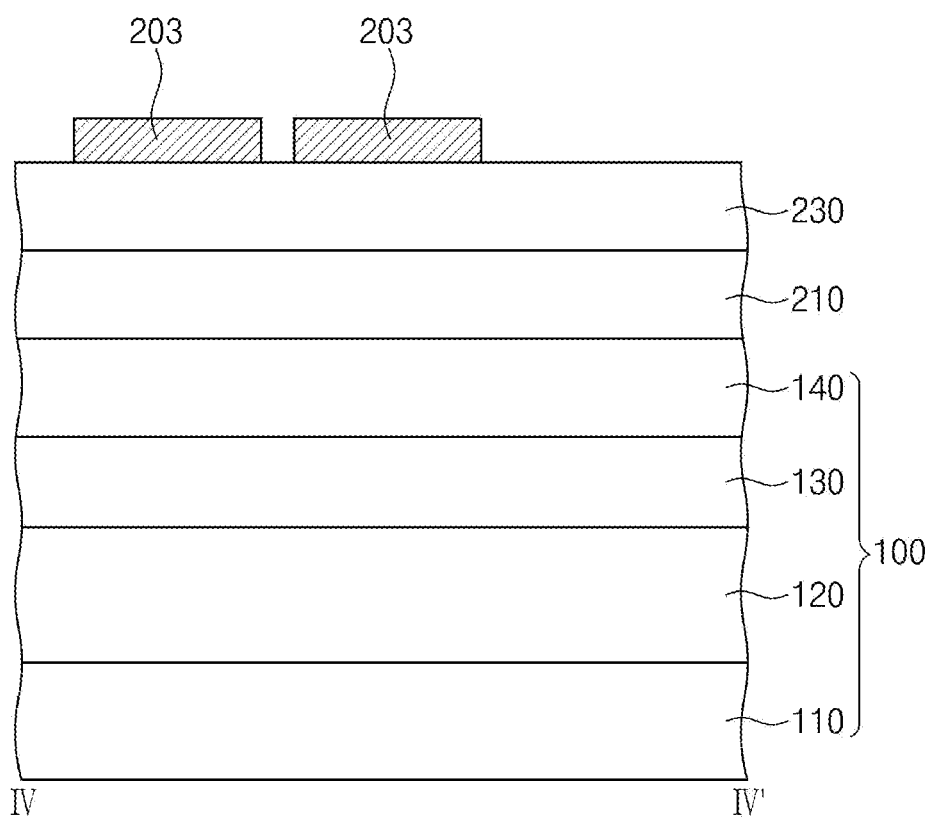
FIG. 7C is a sectional view of the sensor taken along line IV-IV' illustrated in FIG. 7A.
Figure 7C:
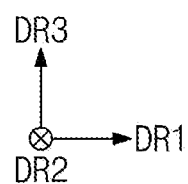

FIG. 7B is a sectional view of the sensor taken along line III-III' illustrated in FIG. 7A. FIG. 7C is a sectional view of the sensor taken along line IV-IV' illustrated in FIG. 7A.

Referring to FIGS. 7A, 7B, and 7C, the bridge patterns 222 may be formed from the first conductive layer 220 (refer to FIG. 6A), and the first portions 211, the second portions 212, and the sensing patterns 221 may be formed from the second conductive layer 240 (refer to FIG. 6A). The sensing patterns 221 may be connected with the bridge patterns 222 through contact holes CNT-I penetrating the sensing insulation layer 230.

Figure 7D:
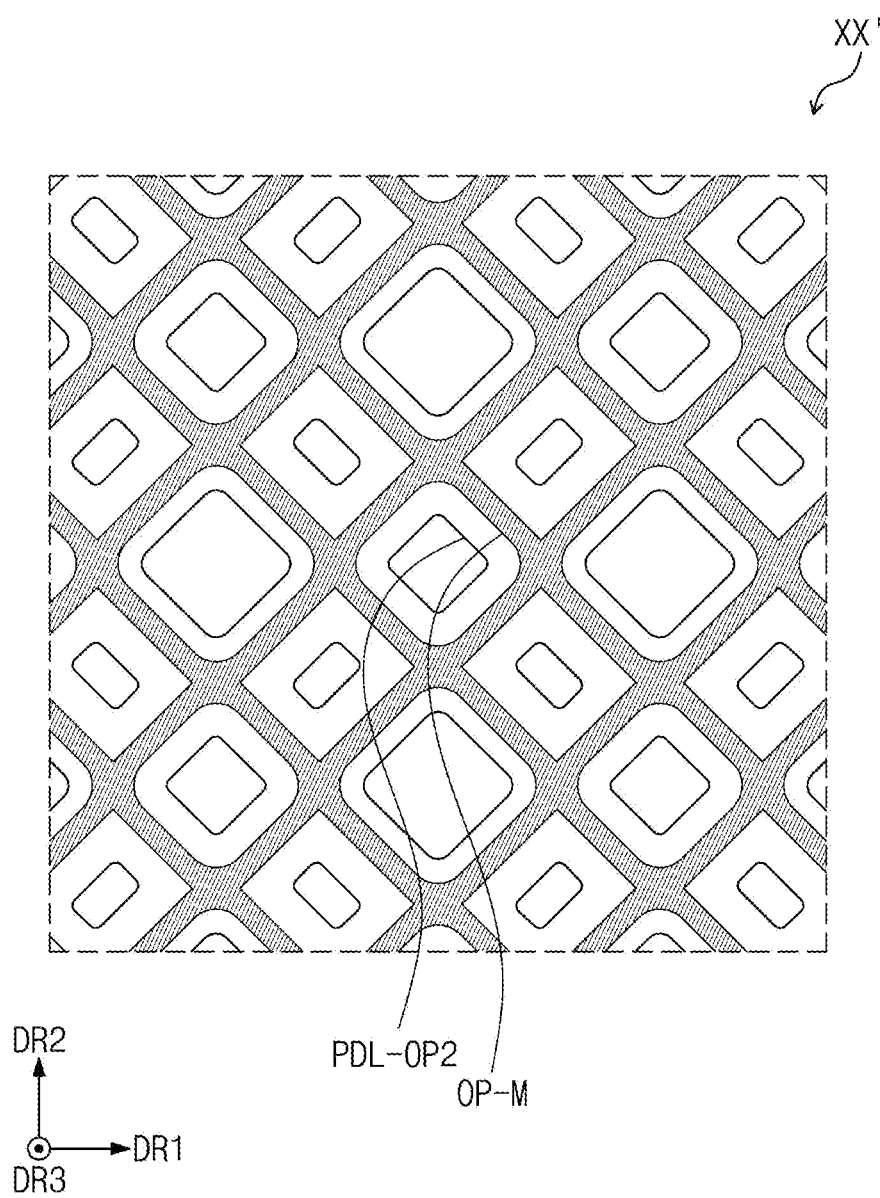
FIG. 7D is an enlarged plan view illustrating area XX' illustrated in FIG. 7A.

The plurality of signal lines 203 may be formed from the second conductive layer 240 (refer to FIG. 6A). However, the present inventive concept is not limited thereto. For example, the plurality of signal lines 203 may be formed from the first conductive layer 220 (refer to FIG. 6A) and may be disposed between the base layer 210 and the sensing insulation layer 230. In addition, the plurality of signal lines 203 may each include a plurality of layers. For example, the plurality of signal lines 203 may each include a first layer line, which is formed from the first conductive layer 220 (refer to FIG. 6A), and a second layer line, which is formed from the second conductive layer 240 (refer to FIG. 6A), and the first layer line and the second layer line may be electrically connected with each other. When each of the plurality of signal lines 203 includes the plurality of layers, the resistance of the plurality of signal lines 203 may be lowered. FIG. 7D is an enlarged plan view illustrating area XX' illustrated in FIG. 7A. FIG. 7D is a blowup of the first portion 211 in FIG. 7A. The first portion 211 may have a mesh structure. A plurality of openings OP-M may be formed in the first portion 211. The plurality of openings OP-M may correspond to the second openings PDL-OP2 of the pixel defining film PDL (refer to FIG. 6A).

Figure 7E:
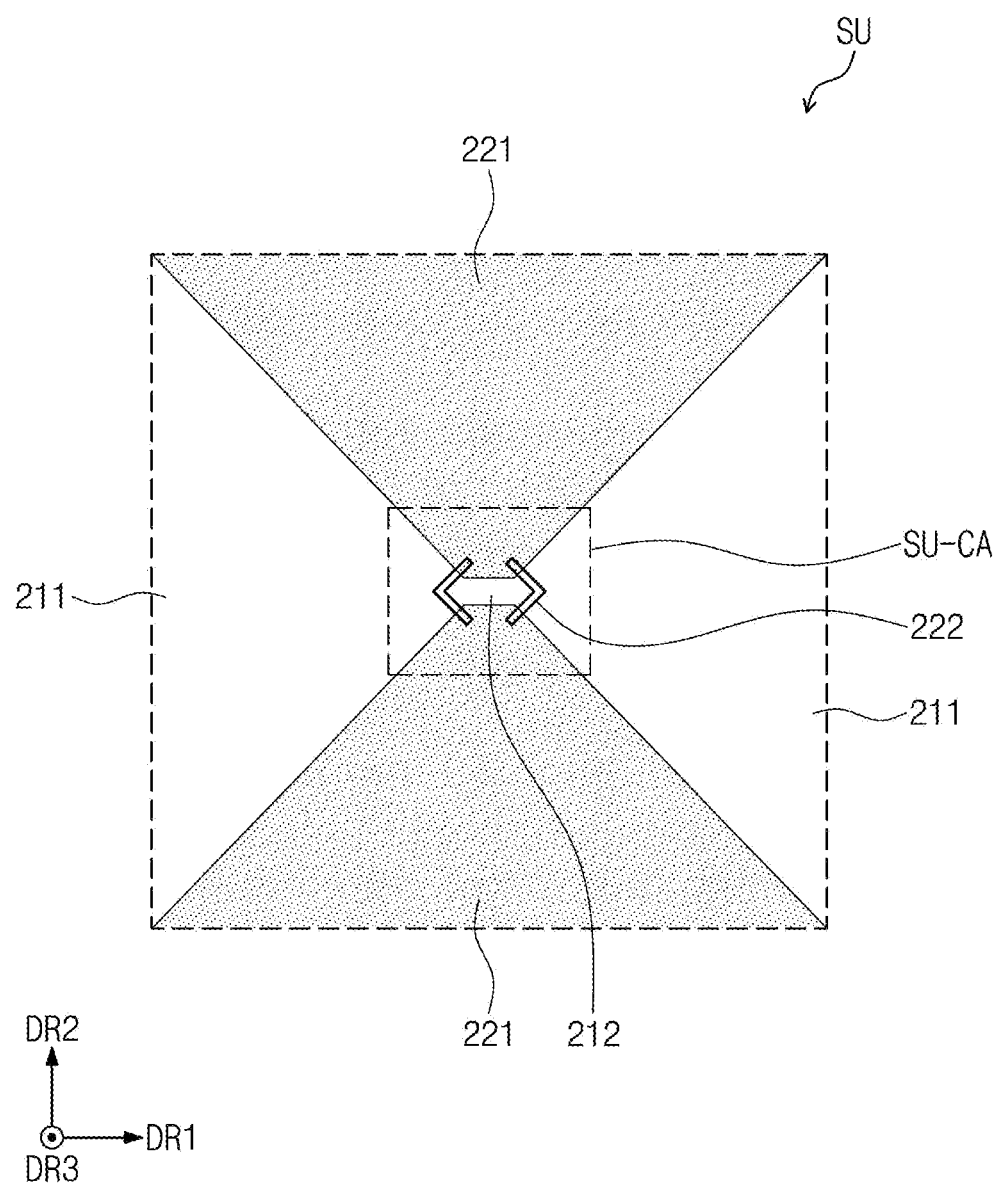
FIG. 7E is a plan view of a sensing unit according to an embodiment of the present inventive concept.
Figure 7F:
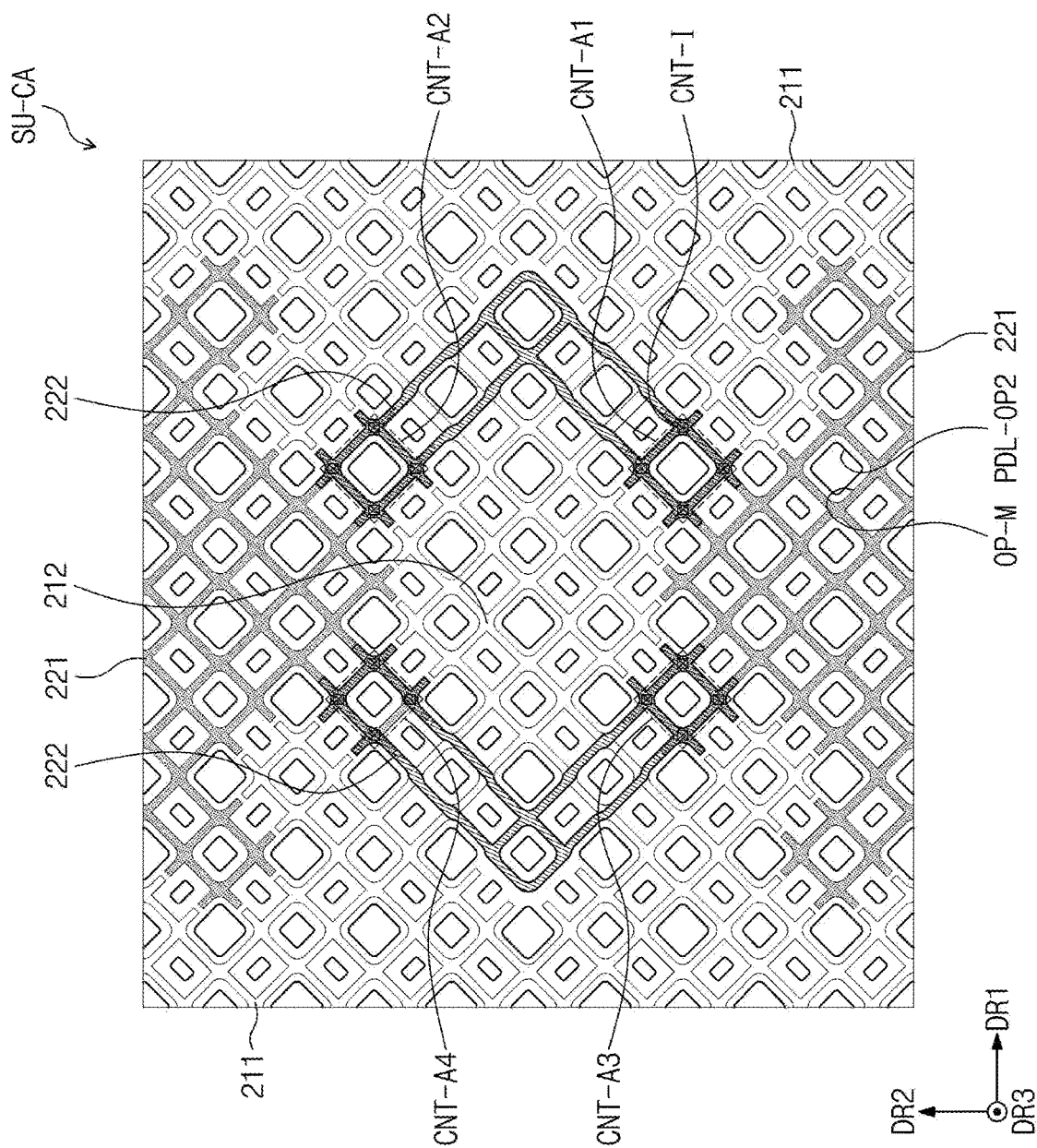
FIG. 7F is an enlarged plan view illustrating an intersection area of the sensing unit according to an embodiment of the present inventive concept.

FIG. 7E is a plan view of a sensing unit according to an embodiment of the present inventive concept. FIG. 7F is an enlarged plan view illustrating an intersection area of the sensing unit according to an embodiment of the present inventive concept.

Referring to FIGS. 7A, 7E, and 7F, the sensor 200 may be divided into a plurality of sensing units SU. Each of the sensing units SU may include a corresponding intersection area among intersection areas of the first electrodes 201 and the second electrodes 202. The intersection area may be an area where bridge patterns 222 are disposed.

The sensing unit SU may include one half of a first first portion 211, a second portion 212, one half of a second first portion 211 opposing the first first portion 211 with the second portion 212 therebetween, one half of a sensing pattern 221, two bridge patterns 222, and one half of another sensing pattern 221.

The two bridge patterns 222 may connect the two sensing patterns 221 to each other. First to fourth connection areas CNT-A1 to CNT-A4 may be provided between the two bridge patterns 222 and the two sensing patterns 221. Four contact holes CNT-I may be formed in each of the first to fourth connection areas CNT-A1 to CNT-A4.

Figure 8:
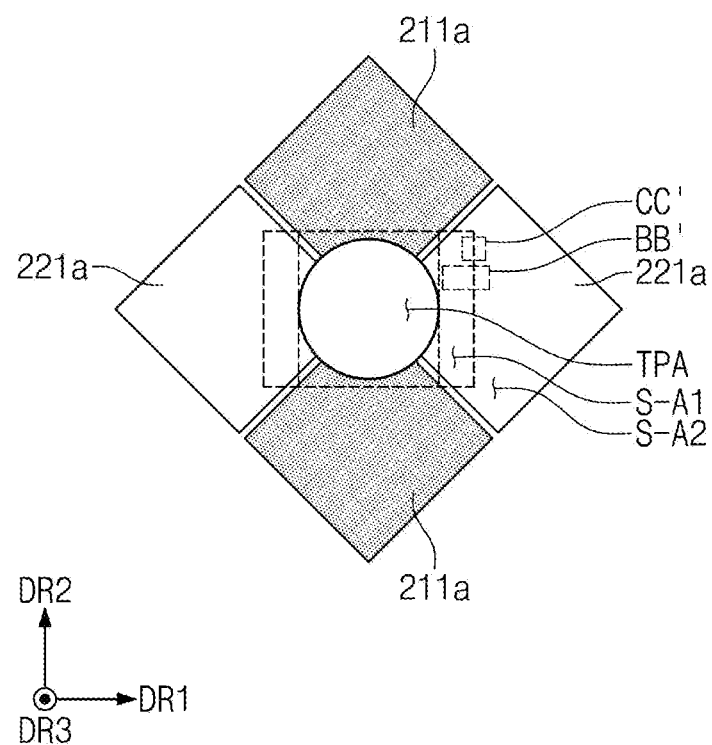
FIG. 8 is an enlarged plan view illustrating some components of the sensor illustrated in FIG. 7A.

FIG. 8 is an enlarged plan view illustrating some components of the sensor illustrated in FIG. 7A.

Referring to FIGS. 7A and 8, two first portions 211a and two sensing patterns 221a adjacent to the transmissive area TPA are illustrated. The two first portions 211a and the two sensing patterns 221a may all overlap the first sensing area S-A1 and the second sensing area S-A2. The two first portions 211a and the two sensing patterns 221a might not overlap the transmissive area TPA.

The first portions 211a and the sensing patterns 221a may each include a first mesh structure and a second mesh structure. The first mesh structure overlaps the first sensing area S-A1, and the second mesh structure overlaps the second sensing area S-A2.

The first portions 211a and the sensing patterns 221a may be continuously disposed in the first sensing area S-A1 and the second sensing area S-A2. Accordingly, the first mesh structure and the second mesh structure facing each other at the border between the first sensing area S-A1 and the second sensing area S-A2 may be included in the same electrode. For example, a first mesh structure and a second mesh structure facing each other in the second direction DR2 may all be included in the first portions 211a and may be included in one of the first electrodes 201. Furthermore, a first mesh structure and a second mesh structure facing each other in the first direction DR1 may all be included in the sensing patterns 221a and may be included in one of the second electrodes 202.

The first mesh structure and the second mesh structure may differ from each other. For example, the areas respectively occupied by the first mesh structure and the second mesh structure in the same reference area may differ from each other. Hereinafter, the first mesh structure and the second mesh structure will be described in detail.

Figure 9:
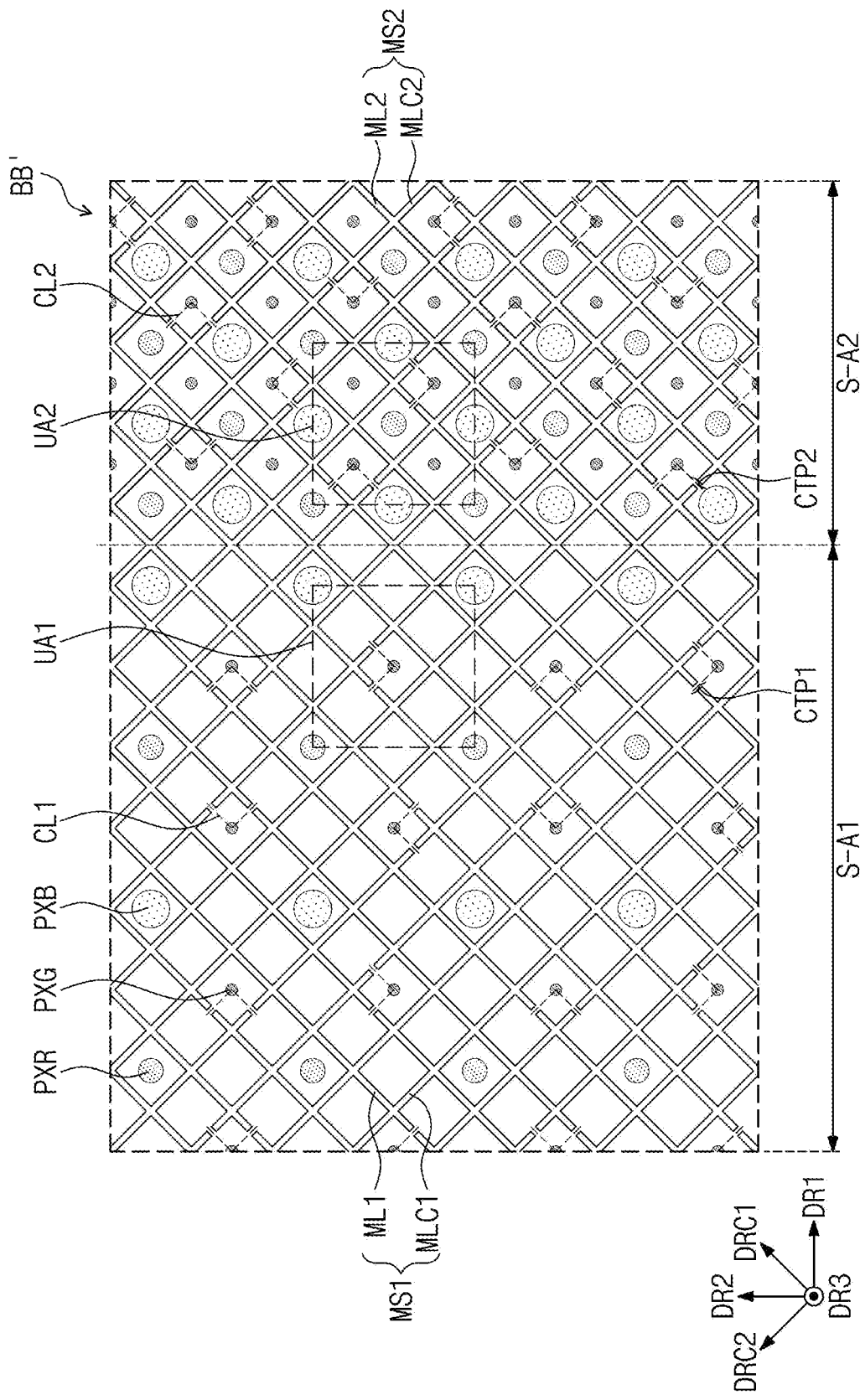
FIG. 9 is an enlarged plan view illustrating area BB' of FIG. 8.

FIG. 9 is an enlarged plan view illustrating area BB' of FIG. 8.

Referring to FIGS. 8 and 9, a first mesh structure MS1, which is disposed in the first sensing area S-A1, and a second mesh structure MS2, which is disposed in the second sensing area S-A2, are illustrated.

The first mesh structure MS1 may include a plurality of first mesh lines ML1 and a plurality of first intersection mesh lines MLC1. The plurality of first mesh lines ML1 may extend in a first intersection direction DRC1 and may be spaced apart from each other in a second intersection direction DRC2, and the plurality of first intersection mesh lines MLC1 may extend in the second intersection direction DRC2 and may be spaced apart from each other in the first intersection direction DRC1. The plurality of first mesh lines ML1 and the plurality of first intersection mesh lines MLC1 may intersect each other and may have an integrated shape. The first intersection direction DRC1 and the second intersection direction DRC2 may cross each other.

The second mesh structure MS2 may include a plurality of second mesh lines ML2 and a plurality of second intersection mesh lines MLC2. The plurality of second mesh lines ML2 may extend in the first intersection direction DRC1 and may be spaced apart from each other in the second intersection direction DRC2, and the plurality of second intersection mesh lines MLC2 may extend in the second intersection direction DRC2 and may be spaced apart from each other in the first intersection direction DRC1. The plurality of second mesh lines ML2 and the plurality of second intersection mesh lines MLC2 may intersect each other and may have an integrated shape.

First disconnection portions CTP1 from which portions of the plurality of first mesh lines ML1 and the plurality of first intersection mesh lines MLC1 are removed may be provided in the first mesh structure MS1, and second disconnection portions CTP2 from which portions of the plurality of second mesh lines ML2 and the plurality of second intersection mesh lines MLC2 are removed may be provided in the second mesh structure MS2. In FIG. 9, first cutting lines CL1 that form the first disconnection portions CTP1 and second cutting lines CL2 that form the second disconnection portions CTP2 are illustrated by dotted lines. Each of the first disconnection portions CTP1 and the second disconnection portions CTP2 may be referred to as a gap, a mesh removal portion, or a mesh separation portion.

The arrangement density of the first disconnection portions CTP1 may be lower than the arrangement density of the second disconnection portions CTP2. For example, in areas of the same size, the number of first disconnection portions CTP1 may be smaller than the number of second disconnection portions CTP2. In FIG. 9, reference areas UA1 and UA2 are illustrated in the first sensing area S-A1 and the second sensing area S-A2, respectively. The reference areas UA1 and UA2 may have the same shape and area.

Two first disconnection portions CTP1 may be disposed in the reference area UA1 of the first sensing area S-A1, and four second disconnection portions CTP2 may be disposed in the reference area UA2 of the second sensing area S-A2.

The first disconnection portions CTP1 and the second disconnection portions CTP2 may be provided to decrease the visibility of disconnection portions for distinguishing the first electrodes 201 (refer to FIG. 7A) and the second electrodes 202. Because the first electrodes 201 (refer to FIG. 7A) and the second electrodes 202 (refer to FIG. 7A) are not disposed in the transmissive area TPA, a disconnection portion is not provided in the transmissive area TPA. For example, the arrangement density of a disconnection portion disposed in the transmissive area TPA may be "0". When the arrangement density is "0", it may mean that a disconnection portion is not disposed in a predetermined area.

In the transmissive area TPA, there may be no reflection visibility caused by a disconnection portion. Accordingly, the arrangement density of the first disconnection portions CTP1 disposed in the first sensing area S-A1 may have a density between the arrangement density of the second disconnection portions CTP2 provided in the second sensing area S-A2 and the arrangement density of a disconnection portion in the transmissive area.

The pixels PX (refer to FIG. 4) may include a red light emitting element PXR, a green light emitting element PXG, or a blue light emitting element PXB depending on the colors of light emitted by the pixels PX. The arrangement density of the red light emitting element PXR, the green light emitting element PXG, and the blue light emitting element PXB disposed in the area overlapping the second sensing area S-A2 may be higher than the arrangement density of the red light emitting element PXR, the green light emitting element PXG, and the blue light emitting element PXB disposed in the area overlapping the first sensing area S-A1.

In the second sensing area S-A2, the second disconnection portions CTP2 may be formed according to a predetermined rule. For example, two second disconnection portions CTP2 may be formed adjacent to one green light emitting element PXG among the green light emitting elements PXG that are arranged in the first direction DR1 and the second direction DR2, and the second disconnection portions CTP2 might not be formed around the green pixel adjacent to the one green light emitting element PXG.

In the first sensing area S-A1, the first disconnection portions CTP1 may be formed according to a predetermined rule. For example, two first disconnection portions CTP1 may be formed adjacent to all of the green light emitting elements PXG disposed in the first sensing area S-A1. In this case, the arrangement density of the first disconnection portions CTP1 may be lower than the arrangement density of the second disconnection portions CTP2 because the pitch between the green light emitting elements PXG disposed in the first sensing area S-A1 is greater than the pitch between the green light emitting elements PXG disposed in the second sensing area S-A2.

The first disconnection portions CTP1 and the second disconnection portions CTP2 may prevent the border between the first electrode 201 and the second electrode 202 from being visible and are not limited to the above-described rules. Furthermore, the arrangement density of the first disconnection portions CTP1 has only to be lower than the arrangement density of the second disconnection portions CTP2 and is not limited to the above-described rules.

Figure 10:
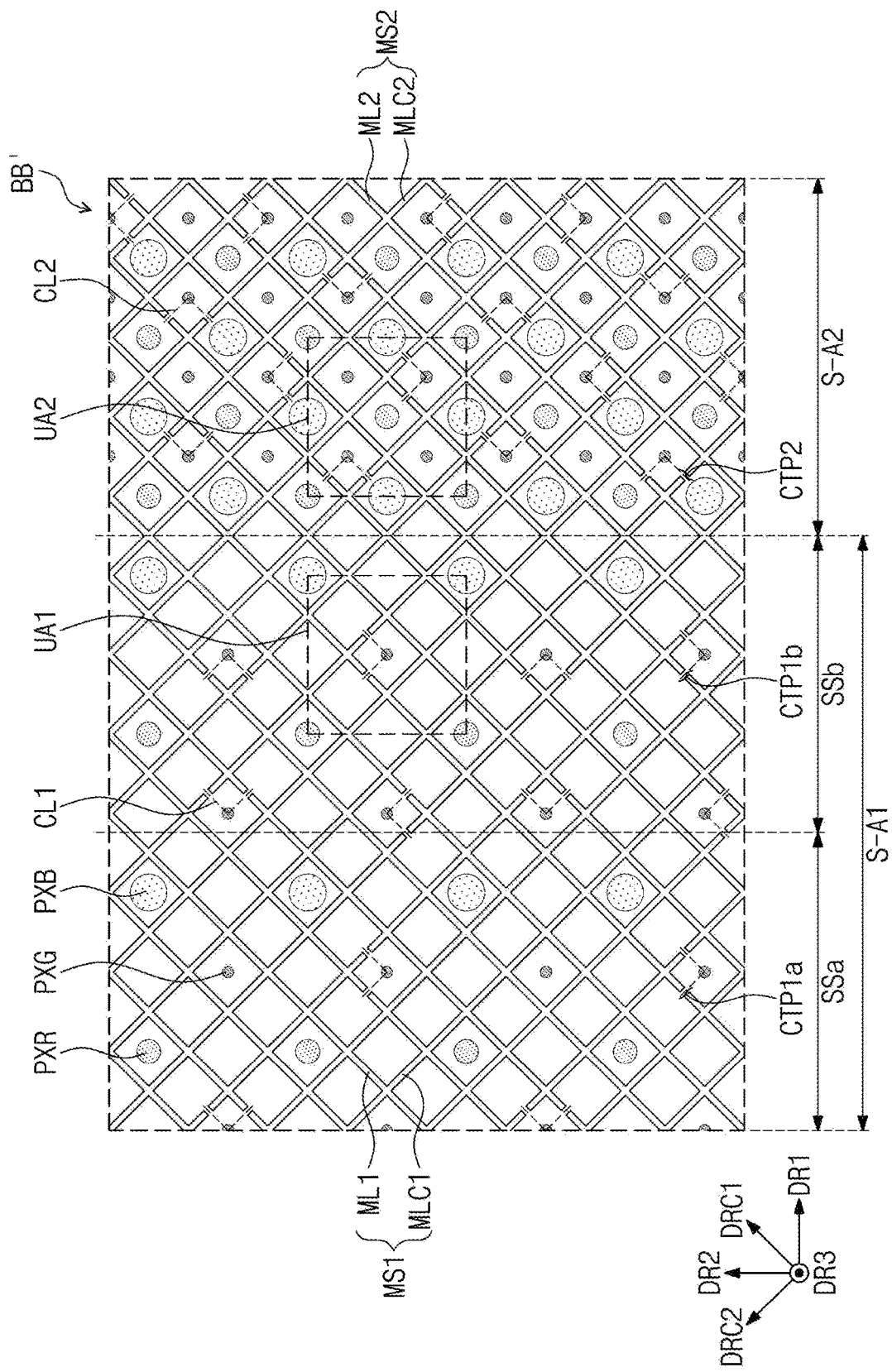
FIG. 10 is an enlarged plan view illustrating area BB' of FIG. 8.

FIG. 10 is an enlarged plan view illustrating area BB' of FIG. 8. In describing FIG. 10, components identical to the components illustrated in FIG. 9 will be assigned with identical reference numerals, and descriptions thereabout may be omitted to prevent redundant descriptions.

Referring to FIGS. 8 and 10, the first sensing area S-A1 may include a first sub-sensing area SSa and a second sub-sensing area SSb. The first sub-sensing area SSa may be adjacent to the transmissive area TPA, and the second sub-sensing area SSb may be between the first sub-sensing area SSa and the second sensing area S-A2.

The arrangement density of first disconnection portions CTP1a formed in the first sub-sensing area SSa may be lower than the arrangement density of first disconnection portions CTP1b formed in the second sub-sensing area SSb. For example, in the first sub-sensing area SSa, two second disconnection portions CTP2 may be formed adjacent to one green light emitting element PXG among green light emitting elements PXG arranged in the first direction DR1 and the second direction DR2, and the first disconnection portions CTP1a might not be formed around the green pixel adjacent to the one green light emitting element PXG. The arrangement density of the first disconnection portions CTP1a may be lower than the arrangement density of the first disconnection portions CTP1b, but the present inventive concept is not limited to the above-described rule.

Figure 11:
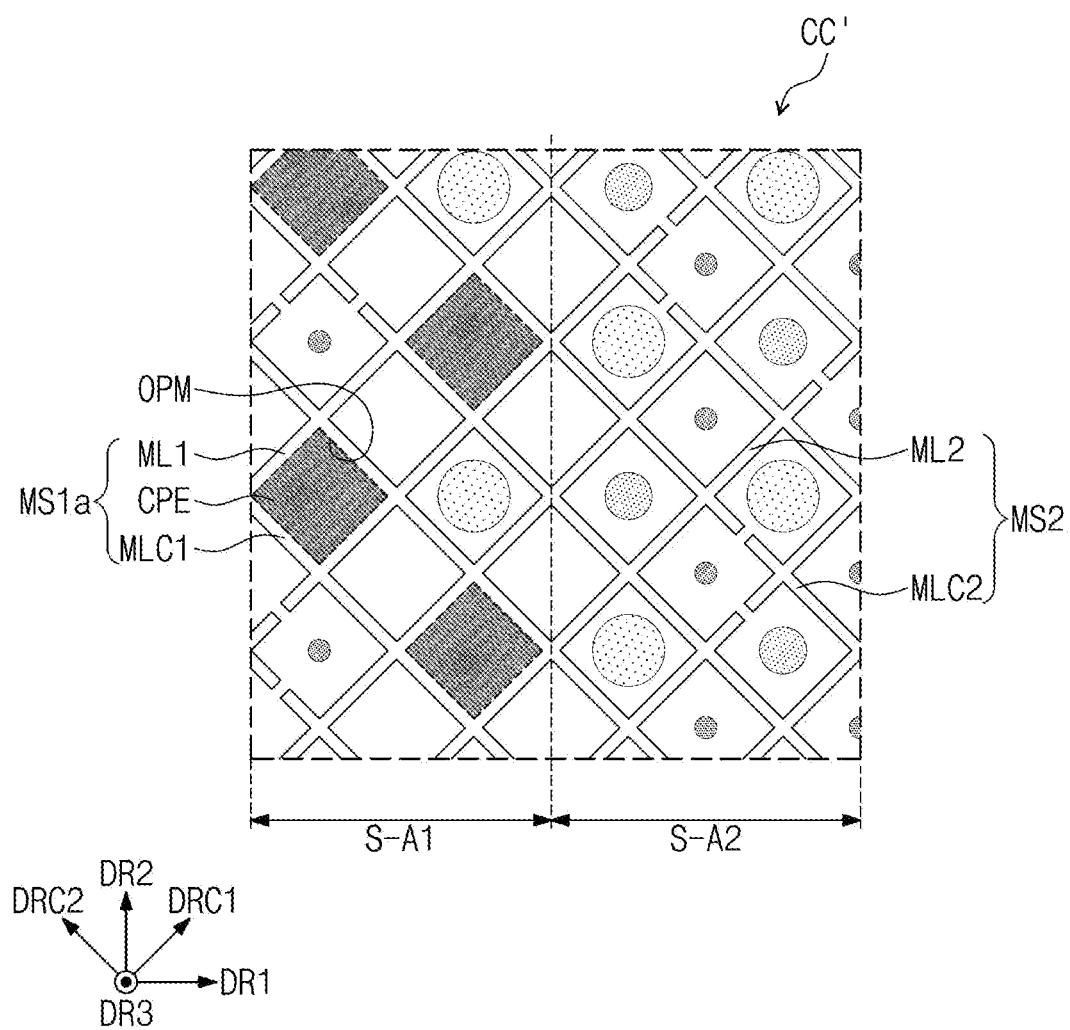
FIG. 11 is an enlarged plan view illustrating area CC' of FIG. 8.

FIG. 11 is an enlarged plan view illustrating area CC' of FIG. 8.

Referring to FIGS. 8 and 11, a portion of the first sensing area S-A1 and a portion of the second sensing area S-A2 are illustrated. The area of the portion of the first sensing area S-A1 and the area of the portion of the second sensing area S-A2 illustrated in FIG. 11 may be the same as each other.

A first mesh structure MS1a may be disposed in the first sensing area S-A1, and a second mesh structure MS2 may be disposed in the second sensing area S-A2. The first mesh structure MS1a may differ from the second mesh structure MS2. For example, the area of the first mesh structure MS1a disposed in the same reference area may be greater than the area of the second mesh structure MS2.

For example, the first mesh structure MS1a may include first mesh lines ML1, first intersection mesh lines MLC1, and a compensation electrode CPE. The first mesh lines ML1, the first intersection mesh lines MLC1, and the compensation electrode CPE may include the same material as each other and may be simultaneously formed in the same process as each other. The compensation electrode CPE may be disposed in an area corresponding to an opening OPM provided by some first mesh lines among the first mesh lines ML1 and some first intersection mesh lines among the first intersection mesh lines MLC1. The some first mesh lines ML1 may be two first mesh lines ML1 most adjacent to each other, and the some first intersection mesh lines MLC1 may be two first intersection mesh lines MLC1 most adjacent to each other.

The compensation electrode CPE may have a shape corresponding to the opening OPM and may cover the opening OPM. For example, the compensation electrode CPE may completely cover the opening OPM. The compensation electrode CPE may be connected with the some first mesh lines ML1 and the some first intersection mesh lines MLC1 to have an integrated shape. For example, although the compensation electrode CPE additionally disposed in the first sensing area S-A1 is distinguished from the first mesh lines ML1 and the first intersection mesh lines MCL1 by hatching, the compensation electrode CPE may include the same material as the first mesh lines ML1 and the first intersection mesh lines MCL1, and the boundary might not be distinguished.

The compensation electrode CPE may be disposed in a dummy area where the red light emitting element PXR (refer to FIG. 9), the green light emitting element PXG (refer to FIG. 9), and the blue light emitting element PXB (refer to FIG. 9) are not disposed. For example, the compensation electrode CPE may be provided in an area overlapping the first pixel circuit PC1 (refer to FIG. 5) that drives the first light emitting element LD1 (refer to FIG. 5). In addition, the compensation electrode CPE may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

The first sensing area S-A1 is an area adjacent to the transmissive area TPA. The first electrode 201 (refer to FIG. 7A) and the second electrode 202 (refer to FIG. 7A) are not disposed in the transmissive area TPA. Accordingly, the area of the first electrode 201 (refer to FIG. 7A) and/or the second electrode 202 (refer to FIG. 7A) may be decreased by the transmissive area TPA. For example, the area of the first electrode 201 and/or the second electrode 202 adjacent to the transmissive area TPA may be decreased. According to this embodiment, the area of the first mesh structure MS1a may be increased by deforming the first mesh structure MS1a differently from the second mesh structure MS2. Accordingly, the area of the portion decreased by the transmissive area TPA may be supplemented by the first mesh structure MS1a including the compensation electrode CPE. Thus, the sensing sensitivity in an area that overlaps the transmissive area TPA of the sensor 200 (refer to FIG. 7A) or is adjacent to the transmissive area TPA may be increased.

Furthermore, the embodiments described with reference to FIGS. 9 and 10 may be identically applied to the embodiment described with reference to FIG. 11. In addition, the embodiments described with reference to FIGS. 9 and 10 may be identically applied to embodiments to be described below.

Figure 12:
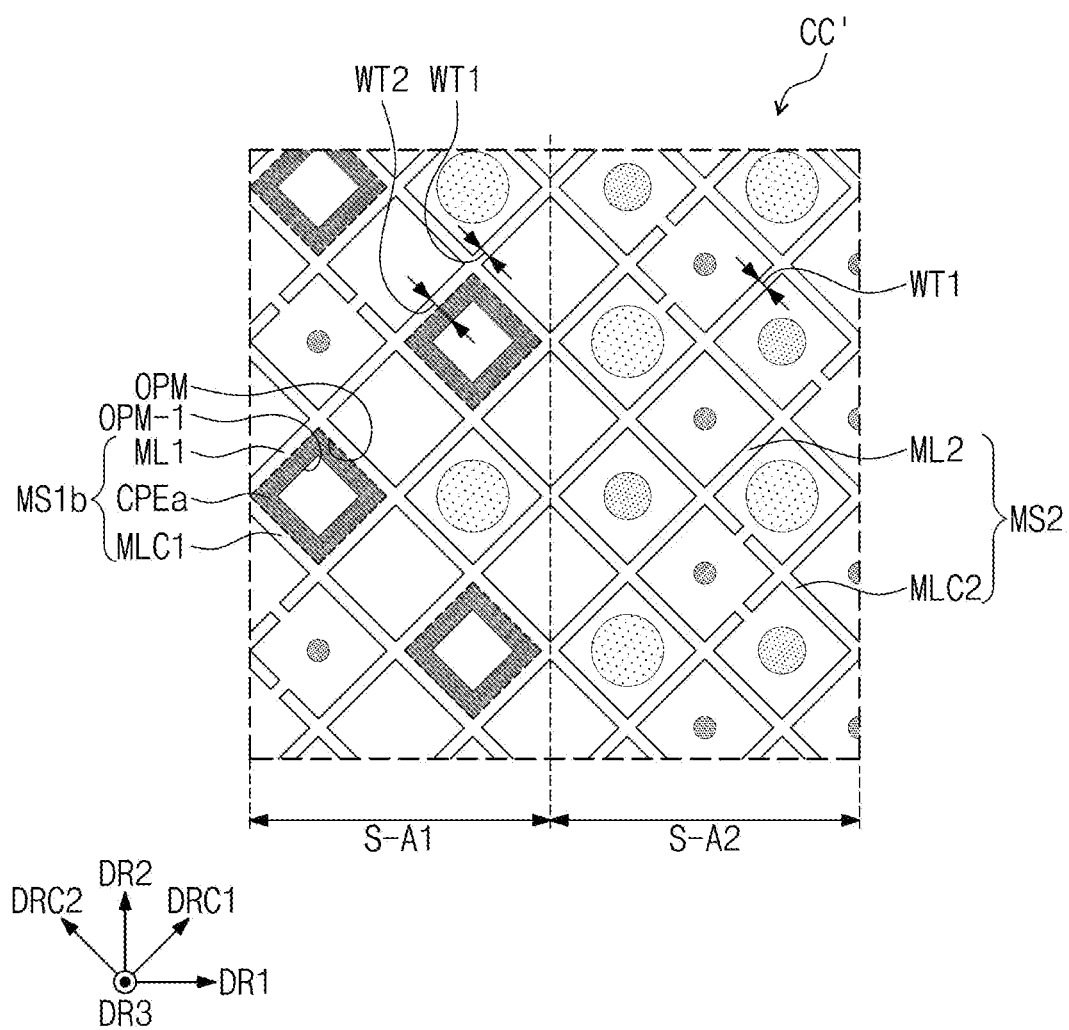
FIG. 12 is an enlarged plan view illustrating area CC' of FIG. 8.

FIG. 12 is an enlarged plan view illustrating area CC' of FIG. 8.

Referring to FIGS. 8 and 12, a portion of the first sensing area S-A1 and a portion of the second sensing area S-A2 are illustrated. The area of the portion of the first sensing area S-A1 and the area of the portion of the second sensing area S-A2 illustrated in FIG. 12 may be the same as each other.

A first mesh structure MS1b may be disposed in the first sensing area S-A1, and a second mesh structure MS2 may be disposed in the second sensing area S-A2. The first mesh structure MS1b may differ from the second mesh structure MS2. For example, the area of the first mesh structure MS1b disposed in the same reference area may be greater than the area of the second mesh structure MS2.

For example, the first mesh structure MS1b may include a plurality of first mesh lines ML1, a plurality of first intersection mesh lines MLC1, and a compensation electrode CPEa. The plurality of first mesh lines ML1, the plurality of first intersection mesh lines MLC1, and the compensation electrode CPEa may include the same material and may be simultaneously formed in the same process. The compensation electrode CPEa may have a shape overlapping a portion of an opening OPM formed by some first mesh lines ML1 among the first mesh lines ML1 and some first intersection mesh lines MLC1 among the first intersection mesh lines MLC1. For example, the compensation electrode CPEa may have a shape overlapping a portion of an opening OPM formed by two first mesh lines ML1 among the first mesh lines ML1 and some first intersection mesh lines MLC1 among the first intersection mesh lines MLC1.

The compensation electrode CPEa may have an annular shape. An opening OPM-1 formed by the compensation electrode CPEa may be smaller than the opening OPM formed by the some first mesh lines ML1 among the first mesh lines ML1 and the some first intersection mesh lines MLC1 among the first intersection mesh lines MLC1.

The compensation electrode CPEa may be connected with the some first mesh lines and the some first intersection mesh lines to have an integrated shape. A first width WT1 of one portion of the first mesh line ML1 may differ from a second width WT2 of another portion of the first mesh line ML1. The other portion of the first mesh line ML1 may be a portion including one portion of the compensation electrode CPEa. For example, the other portion of the first mesh line ML1 may include the one portion of the first mesh line ML1 that has the first width WT1 and the compensation electrode CPEa. For example, the second width WT2 may correspond to the sum of the first width WT1 and the width of the compensation electrode CPEa, and the second width WT2 may be greater than the first width WT1. Furthermore, the widths of a second mesh line ML2 and a second intersection mesh line MLC2 may be substantially the same as the first width WT1.

The compensation electrode CPEa may be disposed in a dummy area where the red light emitting element PXR (refer to FIG. 9), the green light emitting element PXG (refer to FIG. 9), and the blue light emitting element PXB (refer to FIG. 9) are not disposed. For example, the compensation electrode CPEa may be provided in an area overlapping the first pixel circuit PC1 (refer to FIG. 5) that drives the first light emitting element LD1 (refer to FIG. 5). In addition, the compensation electrode CPEa may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

According to this embodiment, the area of the first mesh structure MS1b may be increased by deforming the first mesh structure MS1b differently from the second mesh structure MS2. Accordingly, the area of the portion decreased by the transmissive area TPA may be supplemented by the first mesh structure MS1b including the compensation electrode CPEa. Thus, the sensing sensitivity in an area that overlaps the transmissive area TPA of the sensor 200 (refer to FIG. 7A) or is adjacent to the transmissive area TPA may be increased.

Figure 13:
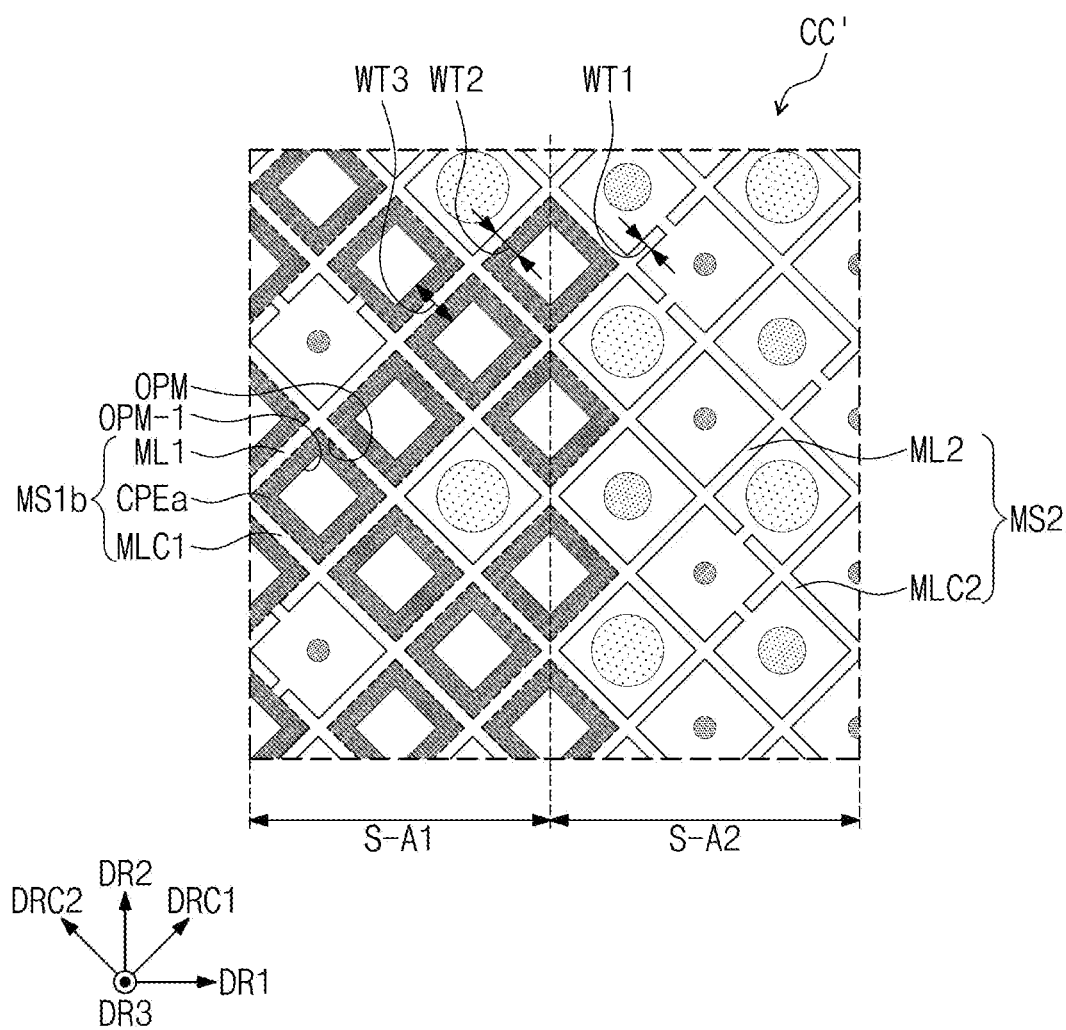
FIG. 13 is an enlarged plan view illustrating area CC' of FIG. 8.

FIG. 13 is an enlarged plan view illustrating area CC' of FIG. 8.

Referring to FIGS. 8 and 13, a portion of the first sensing area S-A1 and a portion of the second sensing area S-A2 are illustrated. The area of the portion of the first sensing area S-A1 and the area of the portion of the second sensing area S-A2 illustrated in FIG. 13 may be the same as each other.

A first mesh structure MS1b may be disposed in the first sensing area S-A1, and a second mesh structure MS2 may be disposed in the second sensing area S-A2. The first mesh structure MS1b may differ from the second mesh structure MS2. For example, the area of the first mesh structure MS1b disposed in the same reference area may be greater than the area of the second mesh structure MS2.

For example, the first mesh structure MS1b may include a plurality of first mesh lines ML1, a plurality of first intersection mesh lines MLC1, and a compensation electrode CPEa. The plurality of first mesh lines ML1, the plurality of first intersection mesh lines MLC1, and the compensation electrode CPEa may include the same material and may be simultaneously formed in the same process.

When compared with the compensation electrode CPEa described with reference to FIG. 12, the compensation electrode CPEa illustrated in FIG. 13 may be provided to correspond to all openings OPM of the first sensing area S-A1 where the red light emitting element PXR, the green light emitting element PXG, and the blue light emitting element PXB (refer to FIG. 9) are not disposed.

The compensation electrode CPEa may be connected with some of the first mesh lines and some of the first intersection mesh lines to have an integrated shape. A first width WT1 of a first portion of the first mesh line ML1 may differ from each of a second width WT2 of a second portion of the first mesh line ML1 and a third width WT3 of a third portion of the first mesh line ML1. The second portion of the first mesh line ML1 may be a portion adjacent to one compensation electrode CPEa. The third portion of the first mesh line ML1 may be a portion adjacent to two compensation electrodes CPEa. For example, the third portion of the first mesh line ML1 may be disposed between two adjacent compensation electrodes CPEa. The second width WT2 may be greater than the first width WT1, and the third width WT3 may be greater than each of the first width WT1 and the second width WT2.

The compensation electrode CPEa may be disposed in a dummy area where the red light emitting element PXR (refer to FIG. 9), the green light emitting element PXG (refer to FIG. 9), and the blue light emitting element PXB (refer to FIG. 9) are not disposed. For example, the compensation electrode CPEa may be provided in an area overlapping the first pixel circuit PC1 (refer to FIG. 5) that drives the first light emitting element LD1 (refer to FIG. 5). In addition, the compensation electrode CPEa may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

According to this embodiment, the area of the first mesh structure MS1$b$ may be increased by deforming the first mesh structure MS1$b$ differently from the second mesh structure MS2. Accordingly, the area of the portion of the sensor 200 decreased by the transmissive area TPA may be supplemented by the first mesh structure MS1$b$ including the compensation electrode CPEa. Thus, the sensing sensitivity in an area that overlaps the transmissive area TPA of the sensor 200 (refer to FIG. 7A) or is adjacent to the transmissive area TPA may be increased.

Figure 14:
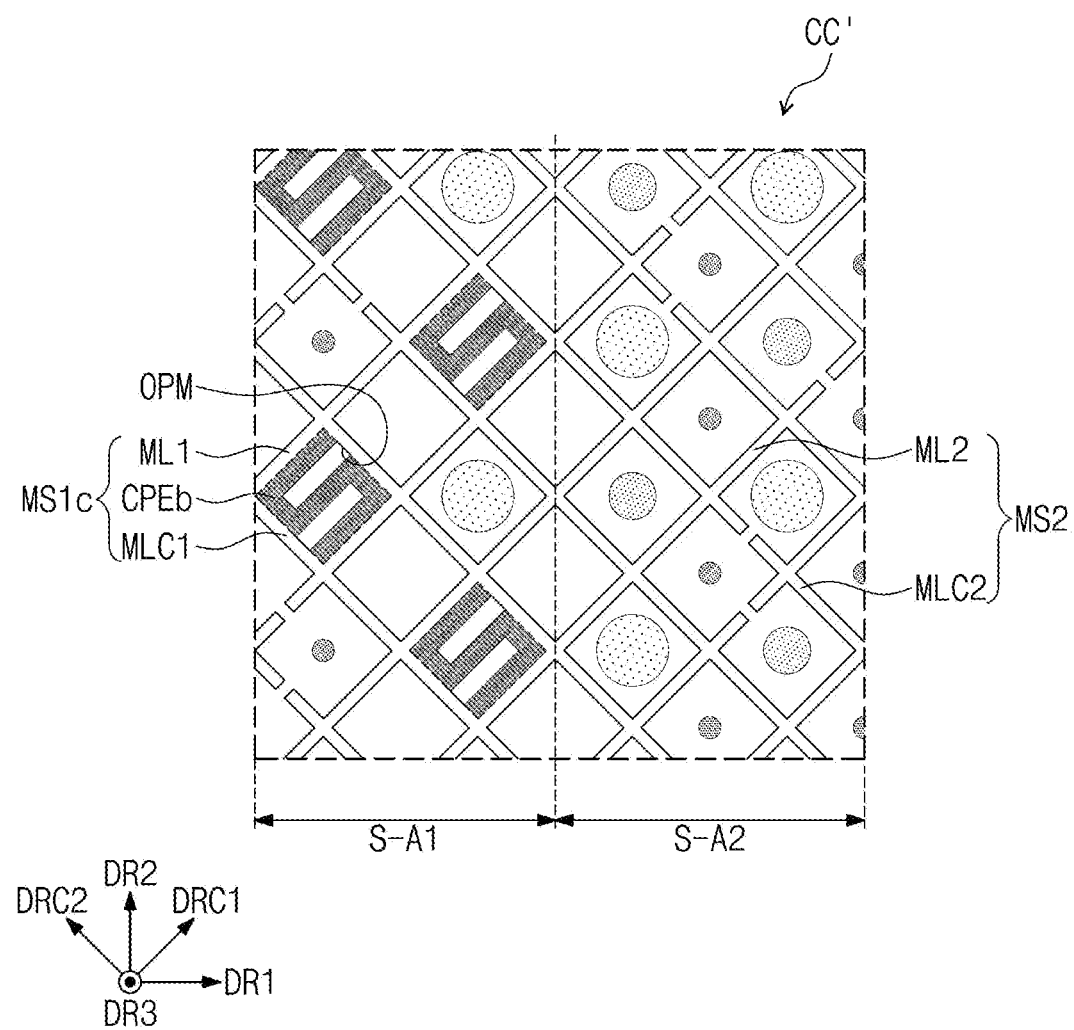
FIG. 14 is an enlarged plan view illustrating area CC' of FIG. 8.

FIG. 14 is an enlarged plan view illustrating area CC' of FIG. 8.

Referring to FIGS. 8 and 14, a portion of the first sensing area S-A1 and a portion of the second sensing area S-A2 are illustrated. A first mesh structure MS1$c$ may be disposed in the first sensing area S-A1, and a second mesh structure MS2 may be disposed in the second sensing area S-A2. The first mesh structure MS1$c$ may differ from the second mesh structure MS2. For example, the area of the first mesh structure MS1$c$ disposed in the same reference area may be greater than the area of the second mesh structure MS2.

For example, the first mesh structure MS1$c$ may include a plurality of first mesh lines ML1, a plurality of first intersection mesh lines MLC1, and a compensation electrode CPEb. The plurality of first mesh lines ML1, the plurality of first intersection mesh lines MLC1, and the compensation electrode CPEb may include the same material and may be simultaneously formed in the same process. The compensation electrode CPEb may have a shape overlapping a portion of an opening OPM formed by some first mesh lines among the first mesh lines ML1 and some first intersection mesh lines among the first intersection mesh lines MLC1.

The compensation electrode CPEb may be disposed in a dummy area where the red light emitting element PXR (refer to FIG. 9), the green light emitting element PXG (refer to FIG. 9), and the blue light emitting element PXB (refer to FIG. 9) are not disposed. For example, the compensation electrode CPEb may be provided in an area overlapping the first pixel circuit PC1 (refer to FIG. 5) that drives the first light emitting element LD1 (refer to FIG. 5). In addition, the compensation electrode CPEb may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

The compensation electrode CPEb may have a meandering shape or serpentine shape such as a square serpentine shape. The compensation electrode CPEb may be connected with the some first mesh lines and the some first intersection mesh lines to have an integrated shape. According to this embodiment, the area of the first mesh structure MS1$c$ may be increased by deforming the first mesh structure MS1$c$ differently from the second mesh structure MS2. Accordingly, the area of the portion of the sensor 200 decreased by the transmissive area TPA may be supplemented by the first mesh structure MS1$c$ including the compensation electrode CPEb. Thus, the sensing sensitivity in an area that overlaps the transmissive area TPA of the sensor 200 (refer to FIG. 7A) or is adjacent to the transmissive area TPA may be increased.

Figure 15:
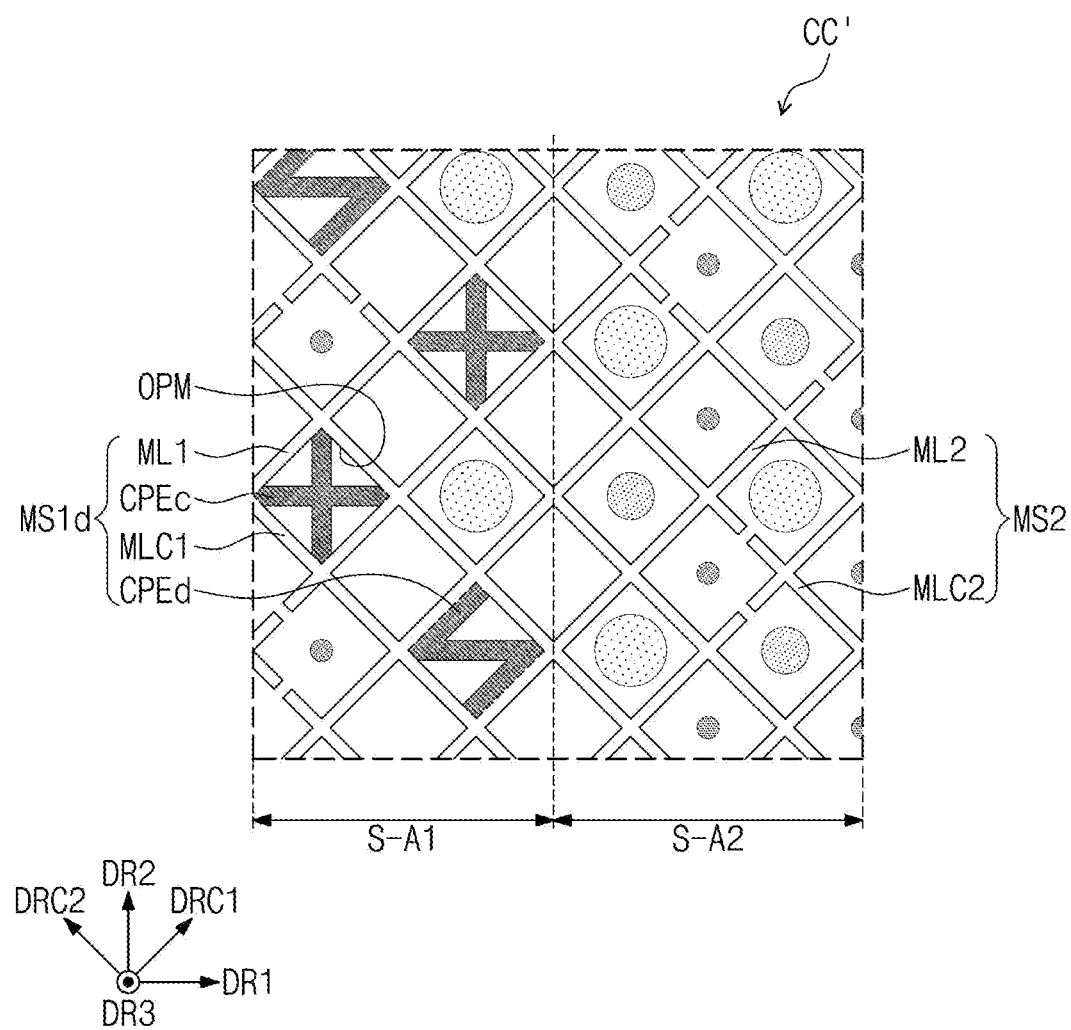
FIG. 15 is an enlarged plan view illustrating area CC' of FIG. 8.

FIG. 15 is an enlarged plan view illustrating area CC' of FIG. 8.

Referring to FIGS. 8 and 15, a portion of the first sensing area S-A1 and a portion of the second sensing area S-A2 are illustrated. A first mesh structure MS1$d$ may be disposed in the first sensing area S-A1, and a second mesh structure MS2 may be disposed in the second sensing area S-A2. The first mesh structure MS1$d$ may differ from the second mesh structure MS2. For example, the area of the first mesh structure MS1$d$ disposed in the same reference area may be greater than the area of the second mesh structure MS2.

For example, the first mesh structure MS1$d$ may include a plurality of first mesh lines ML1, a plurality of first intersection mesh lines MLC1, a first compensation electrode CPEc, and a second compensation electrode CPEd. The plurality of first mesh lines ML1, the plurality of first intersection mesh lines MLC1, the first compensation electrode CPEc, and the second compensation electrode CPEd may include the same material and may be simultaneously formed in the same process. Each of the first compensation electrode CPEc and the second compensation electrode CPEd may have a shape overlapping a portion of an opening OPM formed by some first mesh lines among the first mesh lines ML1 and some first intersection mesh lines among the first intersection mesh lines MLC1.

The first compensation electrode CPEc and the second compensation electrode CPEd may have different shapes from each other. For example, the first compensation electrode CPEc may have a cross shape, and the second compensation electrode CPEd may have a meandering shape, serpentine shape, or a "Z" shape.

Each of the first compensation electrode CPEc and the second compensation electrode CPEd may be disposed in a dummy area where the red light emitting element PXR (refer to FIG. 9), the green light emitting element PXG (refer to FIG. 9), and the blue light emitting element PXB (refer to FIG. 9) are not disposed. For example, each of the first compensation electrode CPEc and the second compensation electrode CPEd may be provided in an area overlapping the first pixel circuit PC1 (refer to FIG. 5) that drives the first light emitting element LD1 (refer to FIG. 5). In addition, each of the first compensation electrode CPEc and the second compensation electrode CPEd may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

Although FIG. 15 illustrates an example in which the first mesh structure MS1$d$ includes two types of first and second compensation electrodes CPEc and CPEd, the present inventive concept is not particularly limited thereto. For example, the first mesh structure MS1$d$ may further include at least one of the compensation electrodes CPE, CPEa, and CPEb described above with reference to FIGS. 11, 12, and 14.

Figure 16:
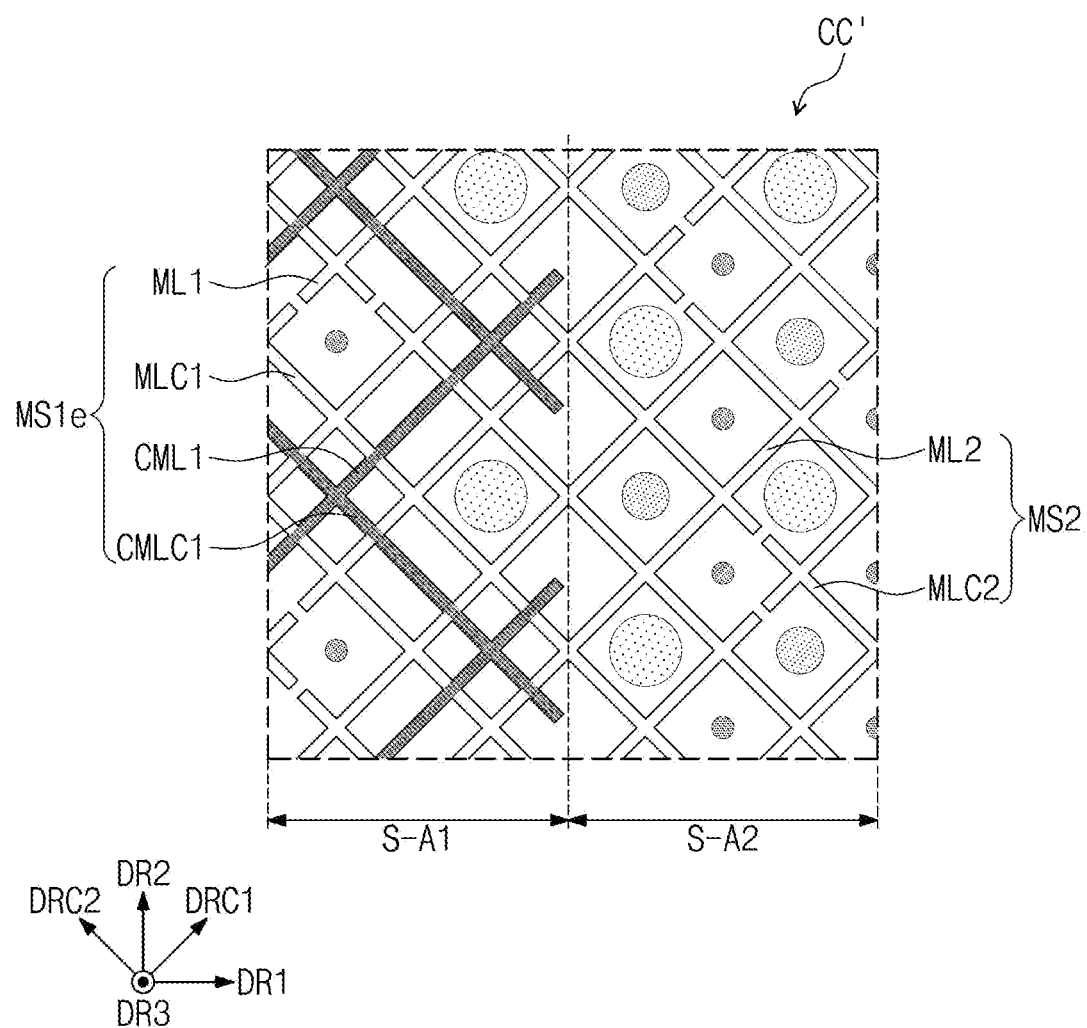
FIG. 16 is an enlarged plan view illustrating area CC' of FIG. 8.

FIG. 16 is an enlarged plan view illustrating area CC' of FIG. 8.

Referring to FIGS. 8 and 16, a portion of the first sensing area S-A1 and a portion of the second sensing area S-A2 are illustrated. A first mesh structure MS1$e$ may be disposed in the first sensing area S-A1, and a second mesh structure MS2 may be disposed in the second sensing area S-A2. The first mesh structure MS1$e$ may differ from the second mesh structure MS2. For example, the area of the first mesh structure MS1$e$ disposed in the same reference area may be greater than the area of the second mesh structure MS2.

For example, the first mesh structure MS1$e$ may include a plurality of first mesh lines ML1 and CML1 and a plurality of first intersection mesh lines MLC1 and CMLC1. The plurality of first mesh lines ML1 and CML1 and the plurality of first intersection mesh lines MLC1 and CMLC1 may include the same material and may be simultaneously formed in the same process. The minimum interval between the plurality of first mesh lines ML1 and CML1 may be smaller than the interval between a plurality of second mesh lines ML2. The minimum interval between the plurality of first intersection mesh lines MLC1 and CMLC1 may be smaller than the interval between a plurality of second intersection mesh lines MLC2.

Hereinafter, among the plurality of first mesh lines ML1 and CML1, the first mesh lines CML1 may be referred to as the first compensation mesh lines CML1. Further, the first compensation mesh lines CML1 are not included in the second mesh structure MS2. Among the plurality of first intersection mesh lines MLC1 and CMLC1, the first intersection mesh lines CMLC1 may be referred to as the first compensation intersection mesh lines CMLC1. Further, the first compensation intersection mesh lines CMLC1 are not included in the second mesh structure MS2.

One first compensation mesh line CML1 may be disposed between two first mesh lines ML1 most adjacent to each other, and one first compensation intersection mesh line CMLC1 may be disposed between two first intersection mesh lines MLC1 most adjacent to each other.

The first compensation mesh lines CML1 and the first compensation intersection mesh lines CMLC1 may be connected with each other to have an integrated shape. Furthermore, the first compensation mesh lines CML1 and the first compensation intersection mesh lines CMLC1 may be connected with the first mesh lines ML1 and the first intersection mesh lines MLC1 to have an integrated shape. For example, although the first compensation mesh lines CML1 and the first compensation intersection mesh lines CMLC1 additionally disposed in the first sensing area S-A1 are distinguished from the first mesh lines ML and the first intersection mesh lines MCL1 by hatching, the first compensation mesh lines CML1 and the first compensation intersection mesh lines CMLC1 may include the same material as the first mesh lines ML1 and the first intersection mesh lines MCL1, and the boundary might not be distinguished.

The first compensation mesh lines CML1 and the first compensation intersection mesh lines CMLC1 may be disposed in a dummy area where the red light emitting element PXR (refer to FIG. 9), the green light emitting element PXG (refer to FIG. 9), and the blue light emitting element PXB (refer to FIG. 9) are not disposed. For example, the first compensation mesh lines CML1 and the first compensation intersection mesh lines CMLC1 may be provided in an area overlapping the first pixel circuit PC1 (refer to FIG. 5) that drives the first light emitting element LD1 (refer to FIG. 5). In addition, the first compensation mesh lines CML1 and the first compensation intersection mesh lines CMLC1 may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

Figure 17:
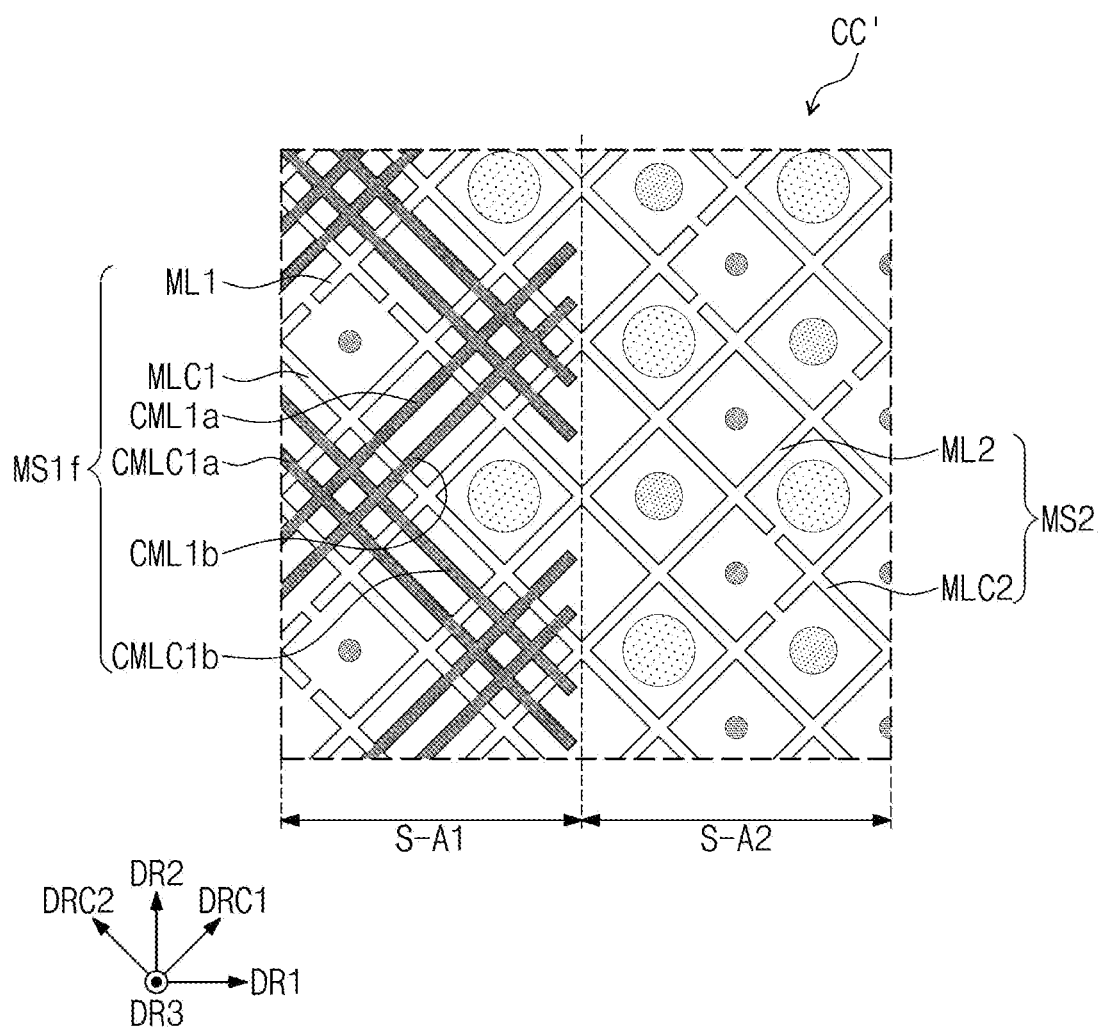
FIG. 17 is an enlarged plan view illustrating area CC' of FIG. 8.

FIG. 17 is an enlarged plan view illustrating area CC' of FIG. 8.

Referring to FIGS. 8 and 17, a first mesh structure MS1$f$ may be disposed in the first sensing area S-A1, and a second mesh structure MS2 may be disposed in the second sensing area S-A2.

The area of the first mesh structure MS1$f$ disposed in the same reference area may be greater than the area of the second mesh structure MS2. For example, the first mesh structure MS1$f$ may include a plurality of first mesh lines ML1, CML1$a$, and CML1$b$ and a plurality of first intersection mesh lines MLC1, CMLC1$a$, and CMLC1$b$. The plurality of first mesh lines ML1, CML1$a$, and CML1$b$ and the plurality of first intersection mesh lines MLC1, CMLC1$a$, and CMLC1$b$ may include the same material and may be simultaneously formed in the same process.

Hereinafter, among the plurality of first mesh lines ML1, CML1$a$, and CML1$b$, the first mesh lines CML1$a$ and CML1$b$ that the first mesh structure MS1$f$ additionally includes may be referred to as the first compensation mesh lines CML1$a$ and CML1$b$. Further, the second mesh structure MS2 does not include the first compensation mesh lines CML1$a$ and CML1$b$. Among the plurality of first intersection mesh lines MLC1, CMLC1$a$, and CMLC1$b$, the first intersection mesh lines CMLC1$a$ and CMLC1$b$ that the first mesh structure MS1$f$ additionally includes may be referred to as the first compensation intersection mesh lines CMLC1$a$ and CMLC1$b$. Further, the second mesh structure MS2 does not include the first compensation intersection mesh lines CMLC1$a$ and CMLC1$b$.

Two first compensation mesh lines CML1$a$ and CML1$b$ may be disposed between two first mesh lines ML1 most adjacent to each other, and two first compensation intersection mesh lines CMLC1$a$ and CMLC1$b$ may be disposed between two first intersection mesh lines MLC1 most adjacent to each other. Accordingly, the minimum interval between the plurality of first mesh lines ML1, CML1a, and CML1b may be smaller than the interval between a plurality of second mesh lines ML2. The minimum interval between the plurality of first intersection mesh lines MLC1, CMLC1a, and CMLC1b may be smaller than the interval between a plurality of second intersection mesh lines MLC2.

The first compensation mesh lines CML1a and CML1b and the first compensation intersection mesh lines CMLC1a and CMLC1b may be disposed in a dummy area where the red light emitting element PXR (refer to FIG. 9), the green light emitting element PXG (refer to FIG. 9), and the blue light emitting element PXB (refer to FIG. 9) are not disposed. For example, the first compensation mesh lines CML1a and CML1b and the first compensation intersection mesh lines CMLC1a and CMLC1b may be provided in an area overlapping the first pixel circuit PC1 (refer to FIG. 5) that drives the first light emitting element LD1 (refer to FIG. 5). In addition, the first compensation mesh lines CML1a and CML1b and the first compensation intersection mesh lines CMLC1a and CMLC1b may be provided in an area overlapping the pixel defining film PDL (refer to FIG. 6A) that is located between the red light emitting element PXR (refer to FIG. 9), the green light emitting element PXG (refer to FIG. 9), and the blue light emitting element PXB (refer to FIG. 9).

Figure 18:
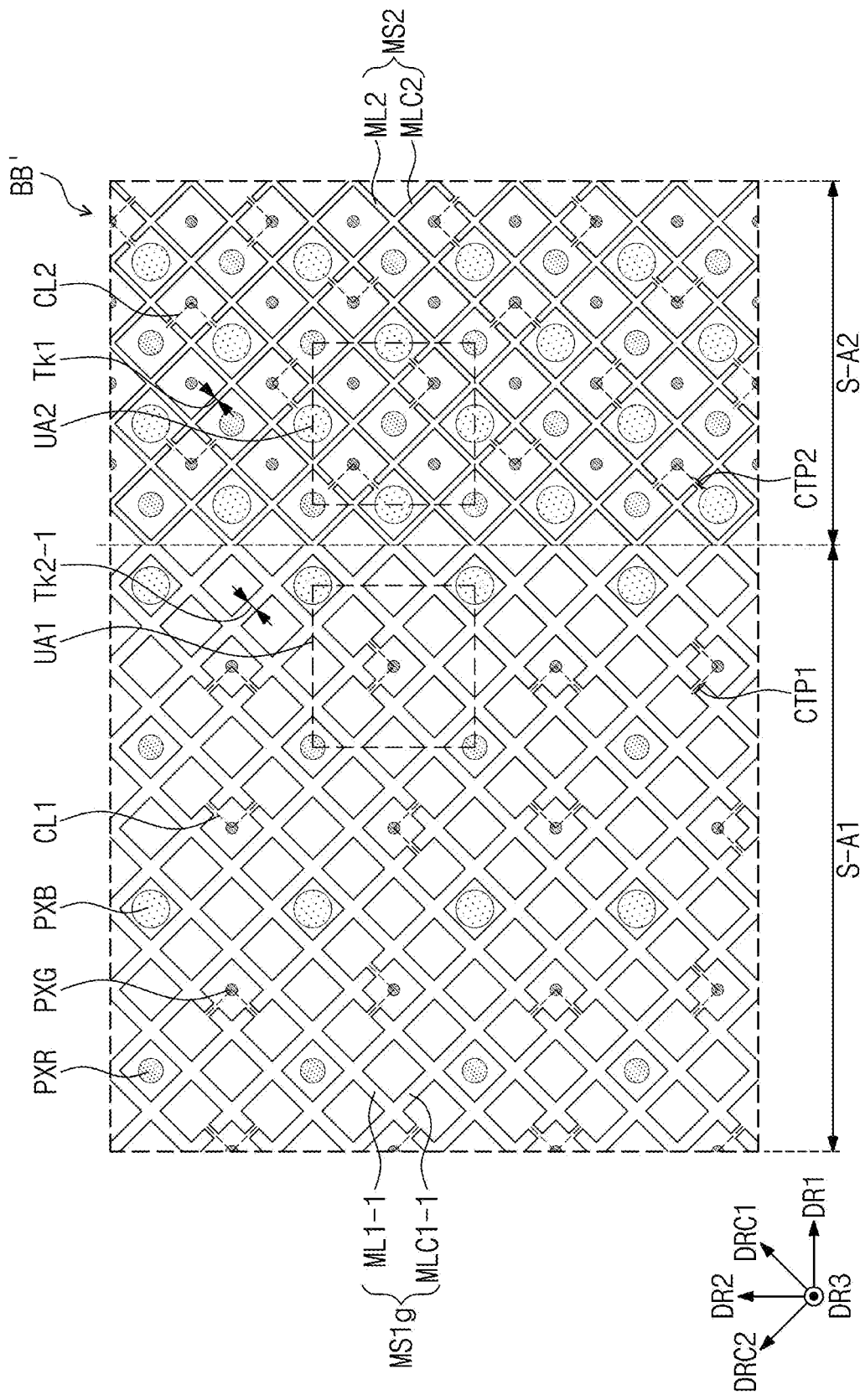
FIG. 18 is an enlarged plan view illustrating area BB' of FIG. 8.

FIG. 18 is an enlarged plan view illustrating area BB' of FIG. 8.

Referring to FIG. 18, a first mesh structure MS1g, which is disposed in the first sensing area S-A1, and a second mesh structure MS2, which is disposed in the second sensing area S-A2, are illustrated.

The first mesh structure MS1g may include a plurality of first mesh lines ML1-1 and a plurality of first intersection mesh lines MLC1-1. The plurality of first mesh lines ML1-1 and the plurality of first intersection mesh lines MLC1-1 may intersect each other and may have an integrated shape. The second mesh structure MS2 may include a plurality of second mesh lines ML2 and a plurality of second intersection mesh lines MLC2. The plurality of second mesh lines ML2 and the plurality of second intersection mesh lines MLC2 may intersect each other and may have an integrated shape.

According to this embodiment, the width Tk2-1 of each of the plurality of first mesh lines ML1-1 and the plurality of first intersection mesh lines MLC1-1 may be greater than the width Tk1 of each of the plurality of second mesh lines ML2 and the plurality of second intersection mesh lines MLC2. The area of the first mesh structure MS1g may be increased by deforming the first mesh structure MS1g differently from the second mesh structure MS2. Accordingly, the area of the portion of the sensor 200 decreased by the transmissive area TPA may be supplemented by the first mesh structure MS1g. Thus, the sensing sensitivity in an area that overlaps the transmissive area TPA (refer to FIG. 7A) of the sensor 200 (refer to FIG. 7A) or is adjacent to the transmissive area TPA (refer to FIG. 7A) may be increased.

Figure 19A:
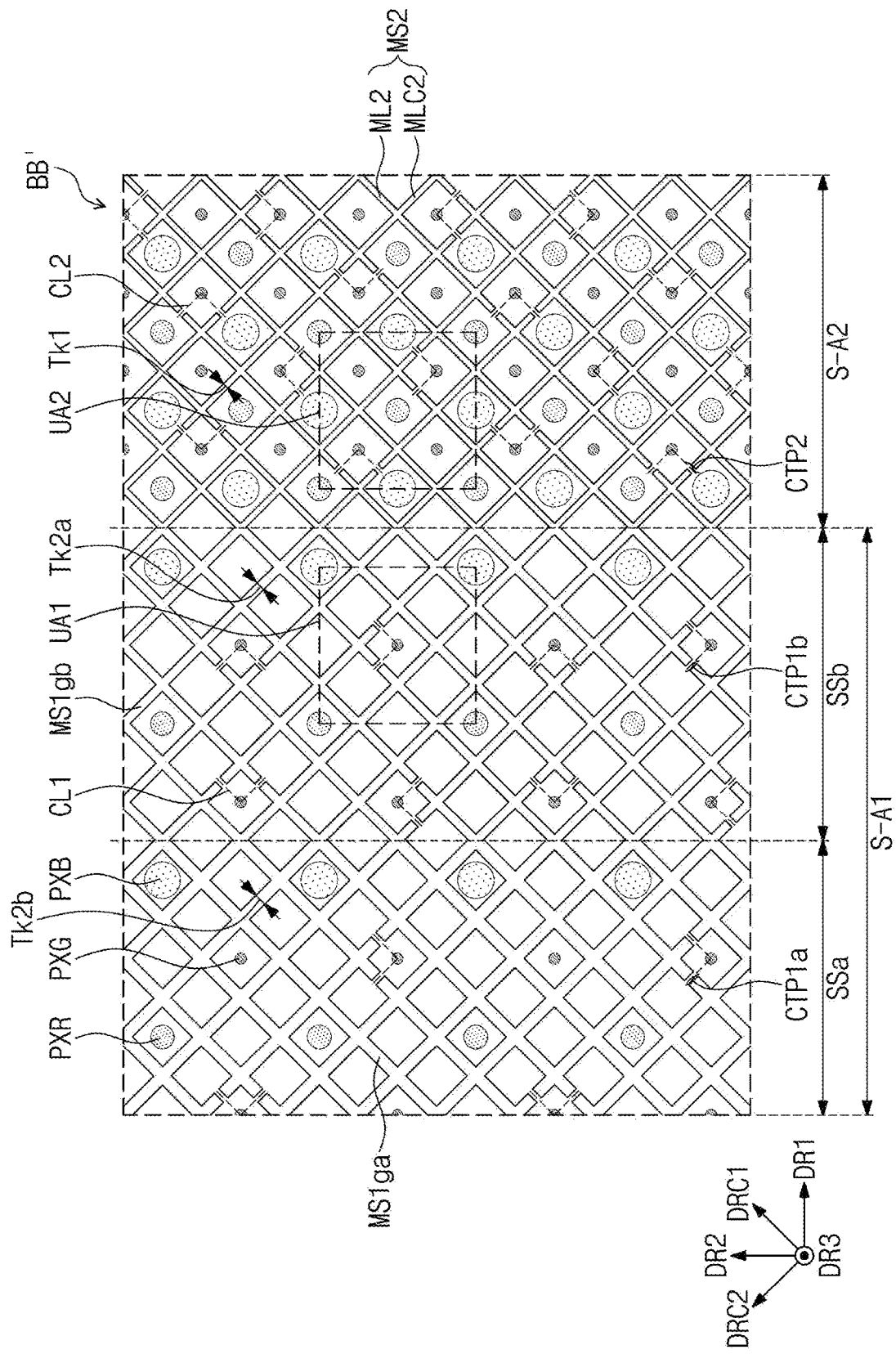
FIG. 19A is an enlarged plan view illustrating area BB' of FIG. 8.

FIG. 19A is an enlarged plan view illustrating area BB' of FIG. 8.

Referring to FIGS. 8 and 19A, the first sensing area S-A1 may include a first sub-sensing area SSa and the second sub-sensing area SSb. The first-sensing area SSa may be adjacent to the transmissive area TPA, and the second sub-sensing area SSb may be between the first sub-sensing area SSa and the second sensing area S-A2.

A first-first mesh structure MS1ga may be disposed in the first sub-sensing area SSa. A first-second mesh structure MS1gb may be disposed in the second sub-sensing area SSb, and a second mesh structure MS2 may be disposed in the second sensing area S-A2. The first-first mesh structure MS1ga may be referred to as a first portion mesh structure MS1ga, and the first-second mesh structure MS1gb may be referred to as a second portion mesh structure MS1gb.

According to this embodiment, the width Tk2b of each of mesh lines included in the first-first mesh structure MS1ga may be greater than the width Tk2a of each of mesh lines included in the first-second mesh structure MS1gb, and the width Tk2a of each of the mesh lines included in the first-second mesh structure MS1gb may be greater than the width Tk1 of each of mesh lines included in the second mesh structure MS2. Each of the widths Tk1, Tk2a, and Tk2b may refer to the width in the direction crossing the extension direction or lengthwise direction of the mesh lines and may refer to the width of a mesh line disposed between two openings adjacent to each other.

For example, mesh lines closer to the transmissive area TPA (refer to FIG. 7A) may have a larger width. Accordingly, the width of a mesh structure per unit area may be further increased toward the transmissive area TPA (refer to FIG. 7A). Thus, the area of the portion decreased by the transmissive area TPA may be supplemented by the first-first mesh structure MS1ga and the first-second mesh structure MS1gb. As a result, the sensing sensitivity in an area that overlaps the transmissive area TPA (refer to FIG. 7A) of the sensor 200 (refer to FIG. 7A) or is adjacent to the transmissive area TPA (refer to FIG. 7A) may be increased.

Figure 19B:
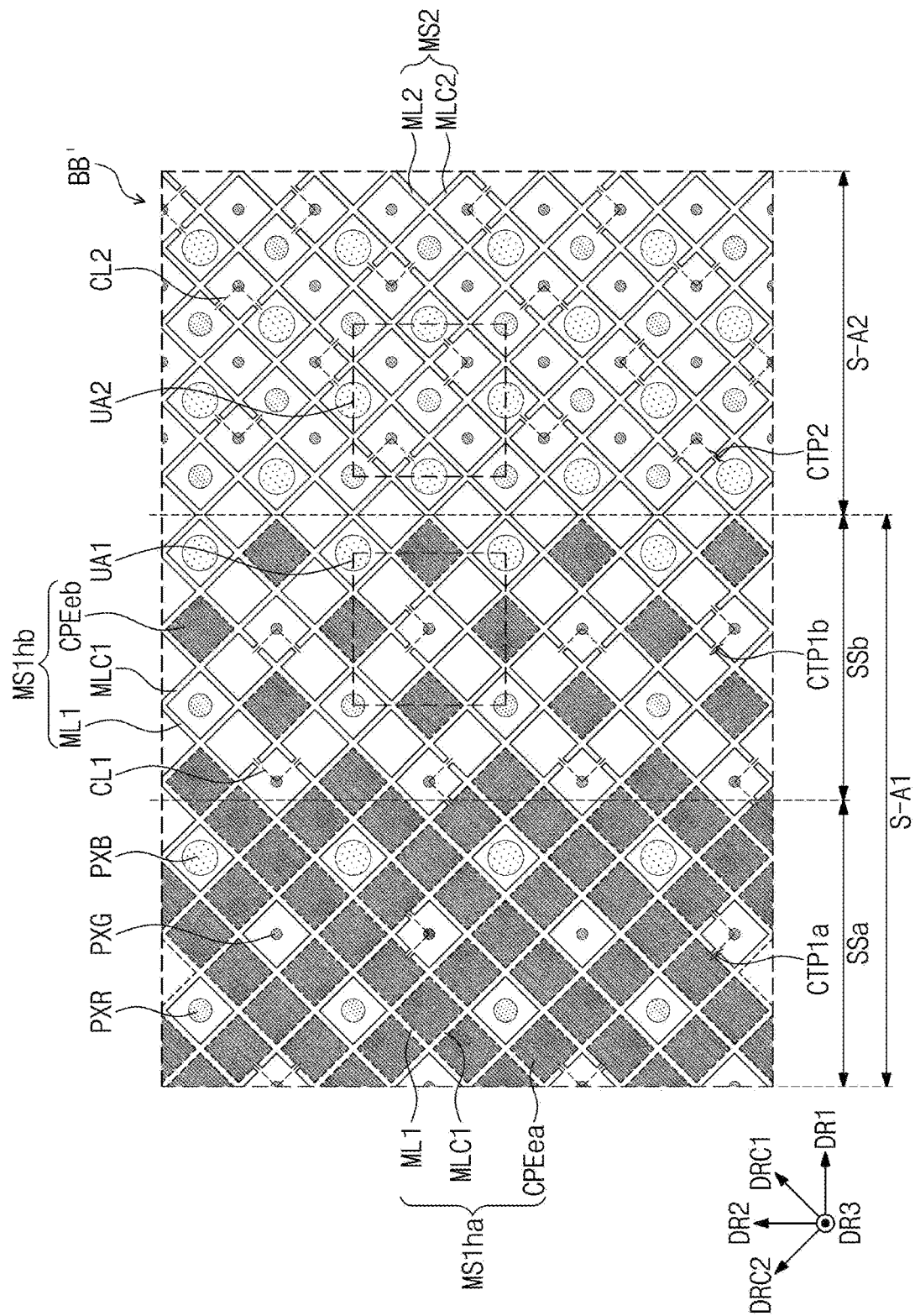
FIG. 19B is an enlarged plan view illustrating area BB' of FIG. 8.

FIG. 19B is an enlarged plan view illustrating area BB' of FIG. 8.

Referring to FIGS. 8 and 19B, a portion of the first sensing area S-A1 and a portion of the second sensing area S-A2 are illustrated.

A first-first mesh structure MS1ha may be disposed in the first sub-sensing area SSa. A first-second mesh structure MS1hb may be disposed in the second sub-sensing area SSb, and a second mesh structure MS2 may be disposed in the second sensing area S-A2. The first-first mesh structure MS1ha, the first-second mesh structure MS1hb, and the second mesh structure MS2 may differ from one another. For example, the areas of the first-first mesh structure MS1ha and the first-second mesh structure MS1hb disposed in the same reference area may be greater than the area of the second mesh structure MS2. The first-first mesh structure MS1ha may be referred to as a first portion mesh structure MS1ha, and the first-second mesh structure MS1hb may be referred to as a second portion mesh structure MS1hb.

The mesh structure MS1ha may include first mesh lines ML1, first intersection mesh lines MLC1, and a compensation electrode CPEea. The first mesh lines ML1, the first intersection mesh lines MLC1, and the compensation electrode CPEea may include the same material and may be simultaneously formed in the same process. The first-second mesh structure MS1hb may include first mesh lines ML1, first intersection mesh lines MLC1, and a compensation electrode CPEeb. The first mesh lines ML1, the first intersection mesh lines MLC1, and the compensation electrode CPEeb may include the same material as each other and may be simultaneously formed in the same process as each other.

In the first sub-sensing area SSa, the compensation electrode CPEea may be disposed in all dummy areas where the red light emitting element PXR, the green light emitting element PXG, and the blue light emitting element PXB are not disposed. In the second sub-sensing area SSb, the compensation electrode CPEeb may be disposed in a part of all dummy areas where the red light emitting element PXR, the green light emitting element PXG, and the blue light emitting element PXB are not disposed.

Unlike what is illustrated in FIG. 19B, in an embodiment of the present inventive concept, in the second sub-sensing area SSb, the compensation electrode CPEeb may be disposed in all dummy areas where the red light emitting element PXR, the green light emitting element PXG, and the blue light emitting element PXB are not disposed, and in the first sub-sensing area SSa, the compensation electrode CPEea may be disposed in a part of all dummy areas where the red light emitting element PXR, the green light emitting element PXG, and the blue light emitting element PXB are not disposed.

Furthermore, without distinction of the first sub-sensing area SSa and the second sub-sensing area SSb, the arrangement density of the compensation electrodes may be increased or decreased toward the second sensing area S-A2.

In addition, the shapes of the compensation electrodes CPEea and CPEeb are not limited to the illustrated example, and the compensation electrodes CPEea and CPEeb may have various shapes. For example, the shapes of the compensation electrodes CPEea and CPEeb may be replaced with one of the shapes of the compensation electrodes illustrated in FIGS. 12, 13, 14, and 15.

According to this embodiment, the area of the portion decreased by the transmissive area TPA may be supplemented by the first-first mesh structure MS1*ha* and the first-second mesh structure MS1*hb*. Accordingly, the sensing sensitivity in an area that overlaps the transmissive area TPA (refer to FIG. 7A) of the sensor 200 (refer to FIG. 7A) or is adjacent to the transmissive area TPA (refer to FIG. 7A) may be increased.

Figure 20:
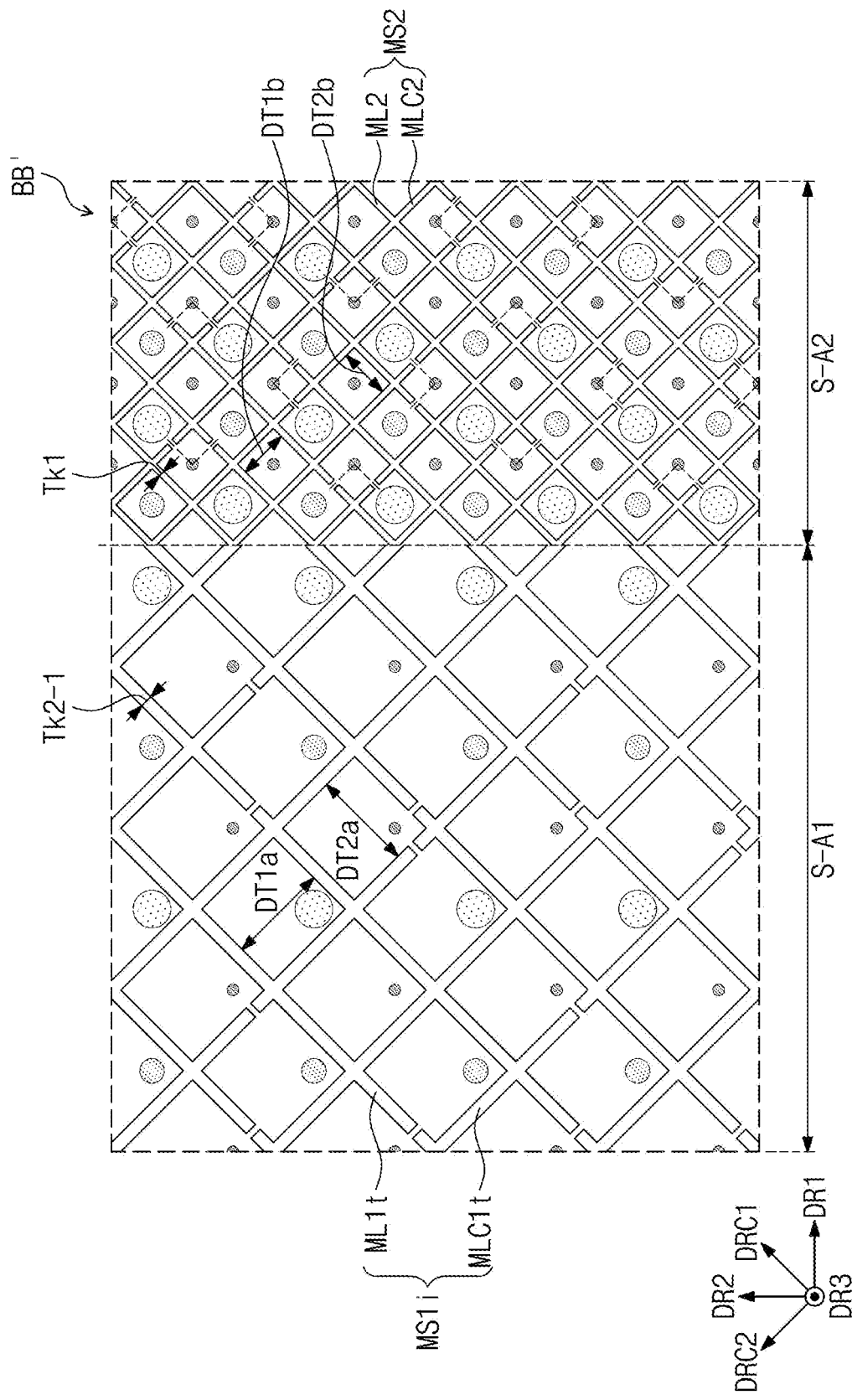
FIG. 20 is an enlarged plan view illustrating area BB' of FIG. 8.

FIG. 20 is an enlarged plan view illustrating area BB' of FIG. 8.

Referring to FIGS. 8 and 20, a first mesh structure MS1*i* may include a plurality of first mesh lines ML1*t* and a plurality of first intersection mesh lines MLC it. The plurality of first mesh lines ML1*t* and the plurality of first intersection mesh lines MLC1*t* may intersect each other and may have an integrated shape. A second mesh structure MS2 may include a plurality of second mesh lines ML2 and a plurality of second intersection mesh lines MLC2. The plurality of second mesh lines ML2 and the plurality of second intersection mesh lines MLC2 may intersect each other and may have an integrated shape.

A mesh structure is not disposed in the transmissive area TPA. For example, the arrangement density of a mesh structure disposed in the transmissive area TPA may be "0". The arrangement density of the first mesh structure MS1*i* that is disposed in the first sensing area S-A1 may have a density between the arrangement density of the second mesh structure MS2, which is disposed in the second sensing area S-A2, and the arrangement density of a mesh structure in the transmissive area TPA.

The arrangement density of the plurality of first mesh lines ML1*t* may be lower than the arrangement density of the plurality of second mesh lines ML2, and the arrangement density of the plurality of first intersection mesh lines MLC1*t* may be lower than the arrangement density of the plurality of second intersection mesh lines MLC2. The size of an opening formed in the first mesh structure MS1*i* may be larger than the size of an opening formed in the second mesh structure MS2.

The distance DT1*a* between two first mesh lines ML1*t* adjacent to each other among the plurality of first mesh lines ML1*t* may be greater than the distance DT1*b* between two second mesh lines ML2 adjacent to each other among the plurality of second mesh lines ML2. Furthermore, the distance DT2*a* between two first intersection mesh lines MLC1*t* adjacent to each other among the plurality of first intersection mesh lines MLC1*t* may be greater than the distance DT2*b* between two second intersection mesh lines MLC2 adjacent to each other among the plurality of second intersection mesh lines MLC2.

The visibility of the transmissive area TPA where a mesh structure is not disposed may be alleviated by making the arrangement density of the first mesh structure MS1*i* lower than that of the second mesh structure MS2. Furthermore, in this embodiment, the sensing sensitivity may be increased by making the width Tk2-1 of each of the plurality of first mesh lines ML1*t* and each of the plurality of first intersection mesh lines MLC1*t* greater than the width Tk1 of each of the plurality of second mesh lines ML2 and each of the plurality of second intersection mesh lines MLC2.

Figure 21:
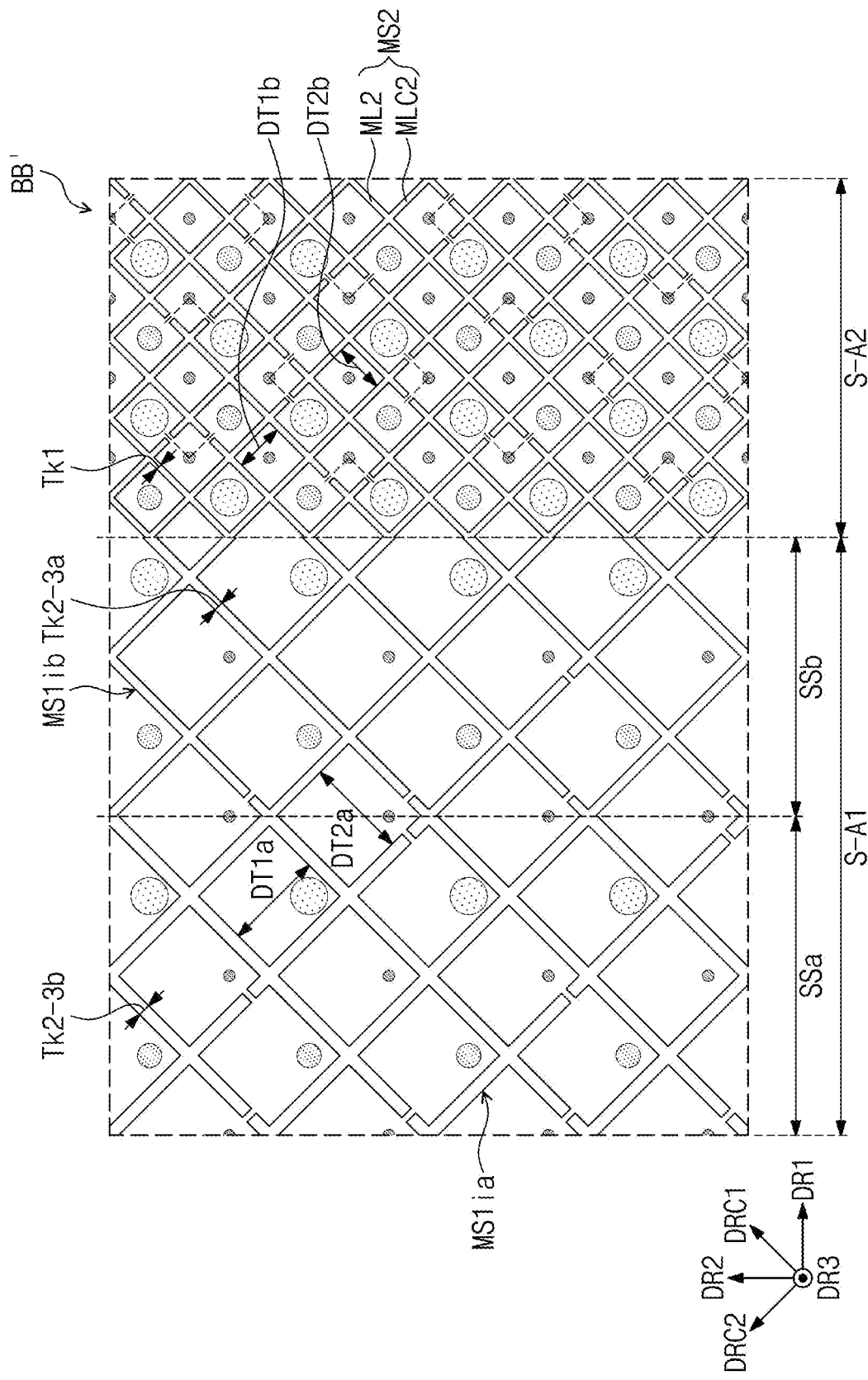
FIG. 21 is an enlarged plan view illustrating area BB' of FIG. 8.

FIG. 21 is an enlarged plan view illustrating area BB' of FIG. 8.

Referring to FIG. 21, a first-first mesh structure MS1*ia* may be disposed in the first sub-sensing area SSa. A first-second mesh structure MS1*ib* may be disposed in the second sub-sensing area SSb, and a second mesh structure MS2 may be disposed in the second sensing area S-A2. The first-first mesh structure MS1*ia* may be referred to as a first portion mesh structure MS1*ia*, and the first-second mesh structure MS1*ib* may be referred to as a second portion mesh structure MS1*ib*.

The visibility of the transmissive area TPA where a mesh structure is not disposed may be alleviated by making the arrangement density of the first-first mesh structure MS1*ia* and the first-second mesh structure MS1*ib* lower than that of the second mesh structure MS2. Furthermore, in this embodiment, the width Tk2-3*b* of each of mesh lines included in the first-first mesh structure MS1*ia* may be greater than the width Tk2-3*a* of each of mesh lines included in the first-second mesh structure MS1*ib*, and the width tk2-3*a* of each of the mesh lines included in the first-second mesh structure MS1*ib* may be greater than the width Tk1 of each of mesh lines included in the second mesh structure MS2. Accordingly, the sensor 200 (refer to FIG. 7A) having increased external visibility and sensing sensitivity may be provided.

Although FIG. 21 illustrates an example in which the first sensing area S-A1 is divided into the two sub-sensing areas SSa and SSb, the present inventive concept is not limited thereto. For example, the first sensing area S-A1 may be divided into three or more sub-sensing areas. In this case, the widths of mesh lines disposed in the sub-sensing areas may differ from one another.

Figure 22:
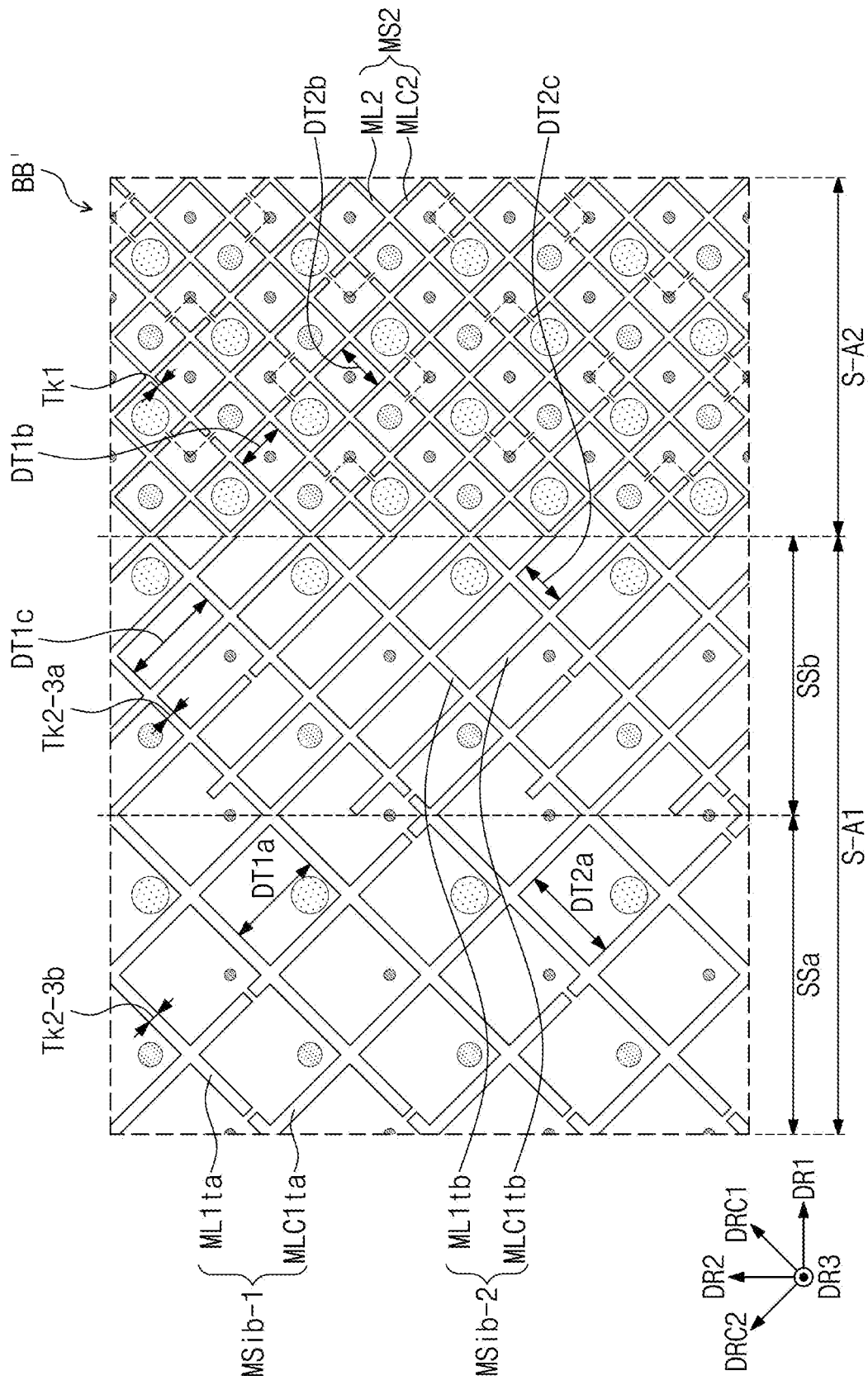
FIG. 22 is an enlarged plan view illustrating area BB' of FIG. 8.

FIG. 22 is an enlarged plan view illustrating area BB' of FIG. 8.

Referring to FIG. 22, the arrangement density of a first-first mesh structure MS1*b*-1 disposed in the first sub-sensing area SSa may be lower than the arrangement density of a first-second mesh structure MS1*b*-2 disposed in the second sub-sensing area SSb. The arrangement density of the first-second mesh structure MS1*b*-2 disposed in the second sub-sensing area SSb may have a density between the arrangement density of the first-first mesh structure MS1*b*-1, which is disposed in the first sub-sensing area SSa, and the arrangement density of a second mesh structure MS2, which is disposed in the second sensing area S-A2.

The first-first mesh structure MS1*b*-1 may include a plurality of mesh lines 1-1 ML1*ta* and a plurality of intersection mesh lines 1-1 MLC1*ta*. The first-second mesh structure MS1b-2 may include a plurality of mesh lines 1-2 ML1tb and a plurality of intersection mesh lines 1-2 MLC1tb.

The distance DT1a between two mesh lines 1-1 ML1ta adjacent to each other among the plurality of mesh lines 1-1 ML1ta may be smaller than the distance DT1c between two mesh lines 1-2 ML1tb adjacent to each other among the plurality of mesh lines 1-2 ML1tb. For example, the difference between the distance DT1a and the distance DT1c may correspond to the difference between the width of the mesh line 1-1 ML1ta and the width of the mesh line 1-2 ML1tb. The distance DT2a between two intersection mesh lines 1-1 MLC1ta adjacent to each other among the plurality of intersection mesh lines 1-1 MLC1ta may be greater than the distance DT2c between two intersection mesh lines 1-2 MLC1tb adjacent to each other among the plurality of intersection mesh lines 1-2 MLC1tb. The distance DT2c between two intersection mesh lines 1-2 MLC1tb may be the same as the distance DT2b between two second intersection mesh lines MLC2.

The arrangement density of the first-second mesh structure MS1b-2 may be lower than the arrangement density of the second mesh structure MS2, and the arrangement density of the first-first mesh structure MS1b-1 may be lower than the arrangement density of the first-second mesh structure MS1b-2. The arrangement densities of the first-first mesh structure MS1b-1, the first-second mesh structure MS1b-2, and the second mesh structure MS2 are not limited to the above-described rule.

Figure 23:
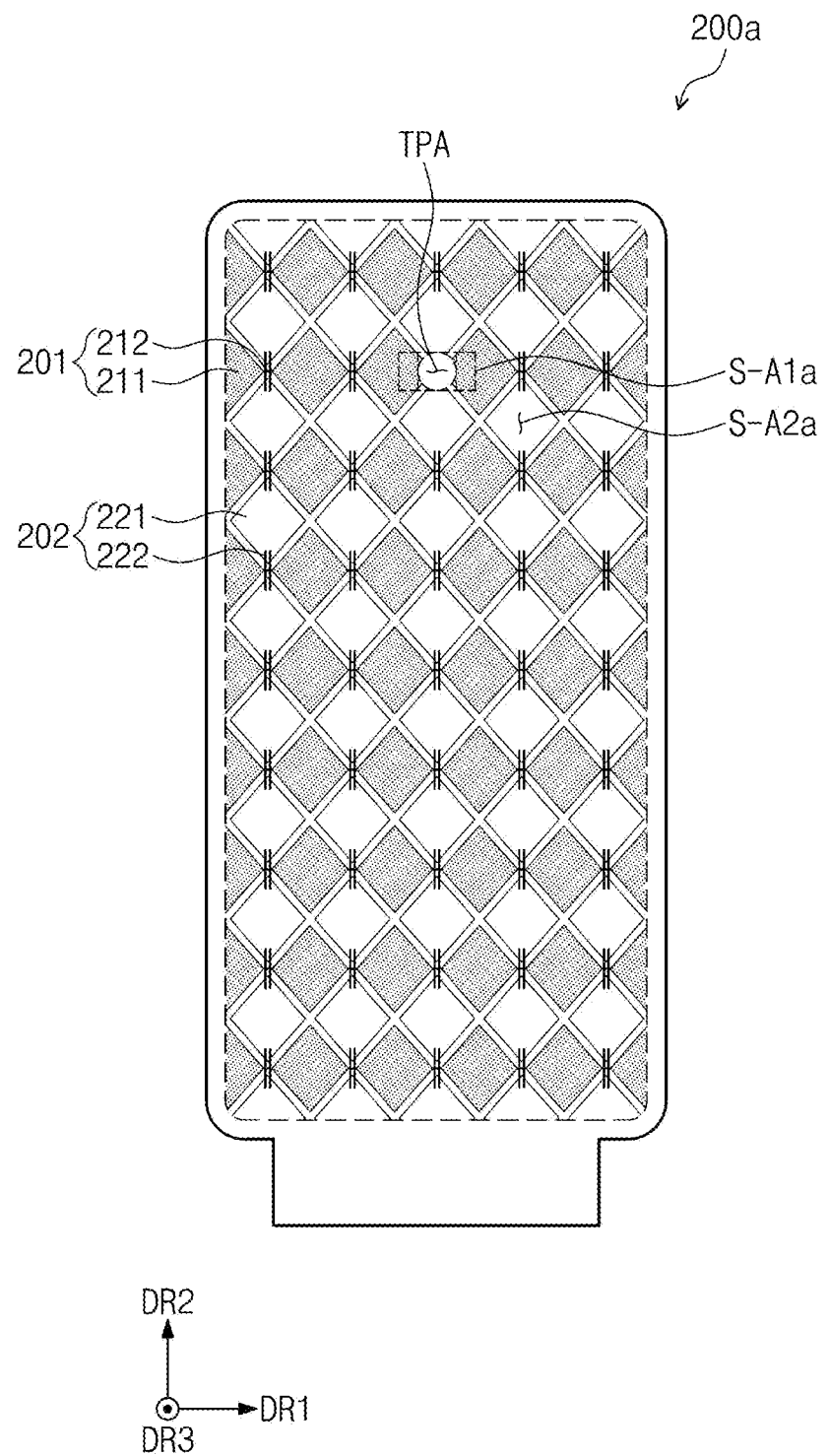
FIG. 23 is a plan view of a sensor according to an embodiment of the present inventive concept.

FIG. 23 is a plan view of a sensor according to an embodiment of the present inventive concept.

Referring to FIG. 23, the sensor 200a may include a plurality of first electrodes 201 and a plurality of second electrodes 202. Each of the plurality of first electrodes 201 may include first portions 211 and second portions 212. Each of the plurality of second electrodes 202 may include sensing patterns 221 and bridge patterns 222. Each of the plurality of first electrodes 201 and the sensing patterns 221 may have a mesh (or, e.g., lattice or net) structure.

A transmissive area TPA, a first sensing area S-A1a, and a second sensing area S-A2a may be formed in the sensor 200a. The first sensing area S-A1a may overlap the second area DP-A2 (refer to FIG. 4) of the display panel 100 (refer to FIG. 4), and the second sensing area S-A2a may overlap the third area DP-A3 (refer to FIG. 4) of the display panel 100 (refer to FIG. 4).

Figure 24:
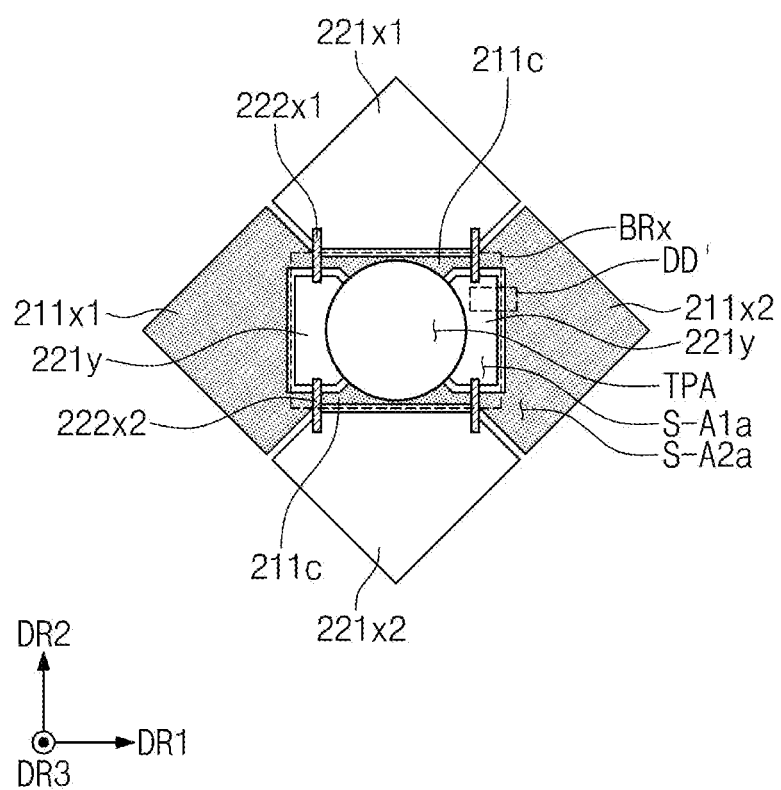
FIG. 24 is an enlarged plan view illustrating some components of the sensor illustrated in FIG. 23.

FIG. 24 is an enlarged plan view illustrating some components of the sensor illustrated in FIG. 23.

Referring to FIGS. 23 and 24, two first portions 211x1 and 211x2, which may be adjacent to the transmissive area TPA, two sensing patterns 221x1 and 221x2, a compensation portion 211c, which may be connected to the two first portions 211x1 and 211x2, a compensation pattern 221y, which may be electrically connected to the two sensing patterns 221x1 and 221x2, first bridge patterns 222x1, which may electrically connect the compensation pattern 221y and the sensing pattern 221xl to each other, and second bridge patterns 222x2, which may electrically connect the compensation pattern 221y and the sensing pattern 221x2 to each other, are illustrated.

The compensation portion 211c and the compensation pattern 221y may be disposed in the first sensing area S-A1a. The first portions 211x1 and 211x2 and the sensing patterns 221x1 and 221x2 may be disposed in the second sensing area S-A2a. Accordingly, each of the compensation portion 211c and the compensation pattern 221y may have a first mesh structure, and each of the first portions 211xl and 211x2 and the sensing patterns 221x1 and 221x2 may have a second mesh structure.

The border BRx between the first sensing area S-A1a and the second sensing area S-A2a may have a rectangular shape. One of the first mesh structure and the second mesh structure facing each other at the border BRx between the first sensing area S-A1a and the second sensing area S-A2a may be included in the first electrode 201, and the other may be included in the second electrode 202. Accordingly, even though the first electrode 201 or the second electrode 202 is not provided at the portion overlapping the transmissive area TPA, the portion where the first electrode 201 and the second electrode 202 face each other in an area adjacent to the transmissive area TPA may be increased. Thus, deterioration in sensing sensitivity by the transmissive area TPA may be prevented.

A first mesh structure and a second mesh structure, which face each other in the first direction DR1, may be included in different electrodes. For example, the first mesh structure may be included in one of the second electrodes 202, and the second mesh structure may be included in one of the first electrodes 201. Furthermore, a first mesh structure and a second mesh structure, which face each other in the second direction DR2 may be included in different electrodes. For example, the first mesh structure may be included in one of the first electrodes 201, and the second mesh structure may be included in one of the second electrodes 202.

The first mesh structure and the second mesh structure may differ from each other. For example, the areas occupied by the first mesh structure and the second mesh structure in the same reference area may differ from each other. Hereinafter, the first mesh structure and the second mesh structure will be described in detail.

Figure 25:
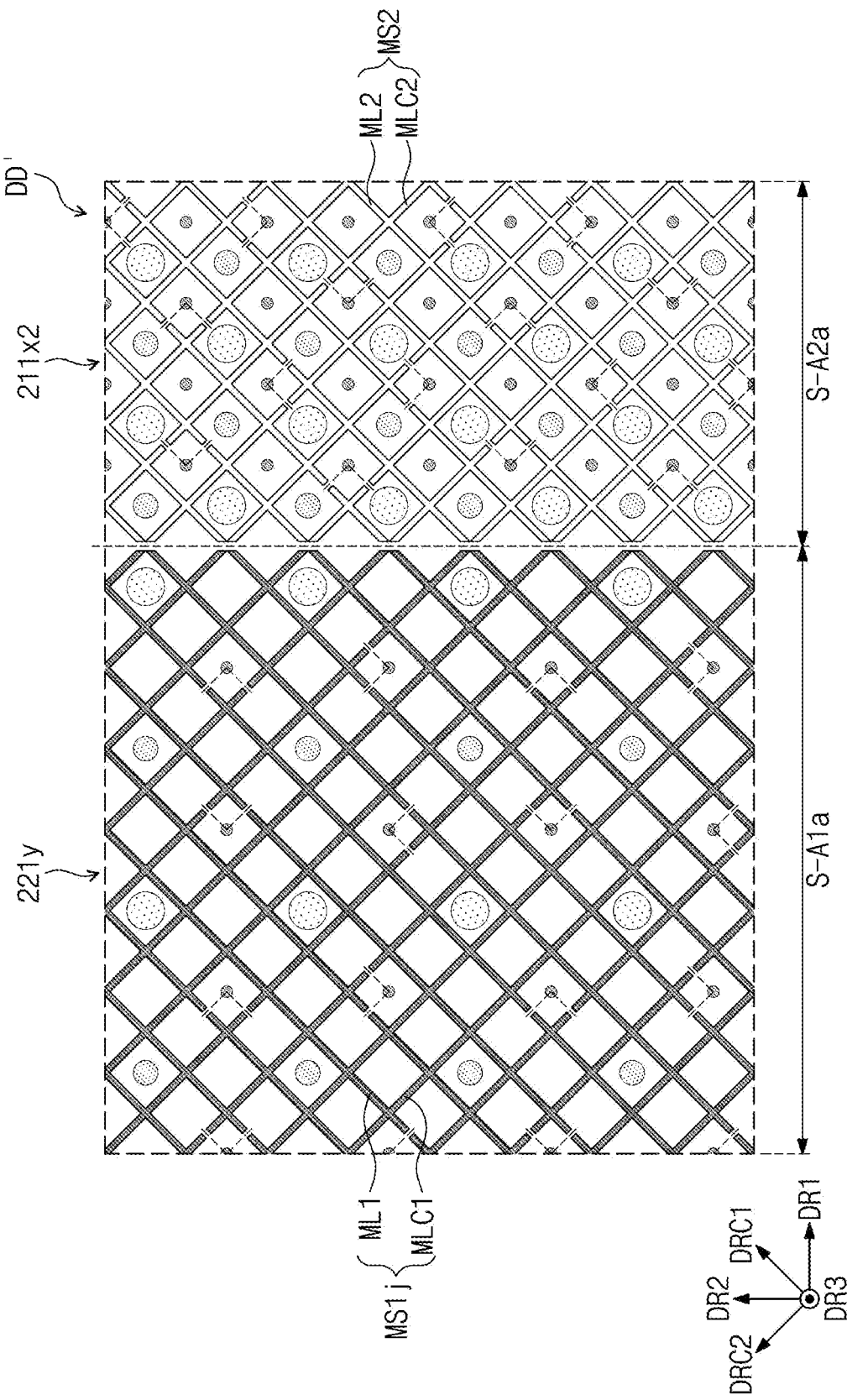
FIG. 25 is an enlarged plan view illustrating area DD' of FIG. 23.

FIG. 25 is an enlarged plan view illustrating area DD' of FIG. 23.

Referring to FIGS. 23, 24, and 25, a first mesh structure MS1j and a second mesh structure MS2, which face each other with respect to the border BRx, are illustrated. The first mesh structure MS1j may be included in the compensation pattern 221y, for example, the second electrode 202, and the second mesh structure MS2 may be included in the first portion 211x2, for example, the first electrode 201.

The first mesh structure MS1j may include a plurality of first mesh lines ML1 and a plurality of first intersection mesh lines MLC1. The plurality of first mesh lines ML1 and the plurality of first intersection mesh lines MLC1 may intersect each other and may have an integrated shape. The second mesh structure MS2 may include a plurality of second mesh lines ML2 and a plurality of second intersection mesh lines MLC2. The plurality of second mesh lines ML2 and the plurality of second intersection mesh lines MLC2 may intersect each other and may have an integrated shape.

Figure 26A:
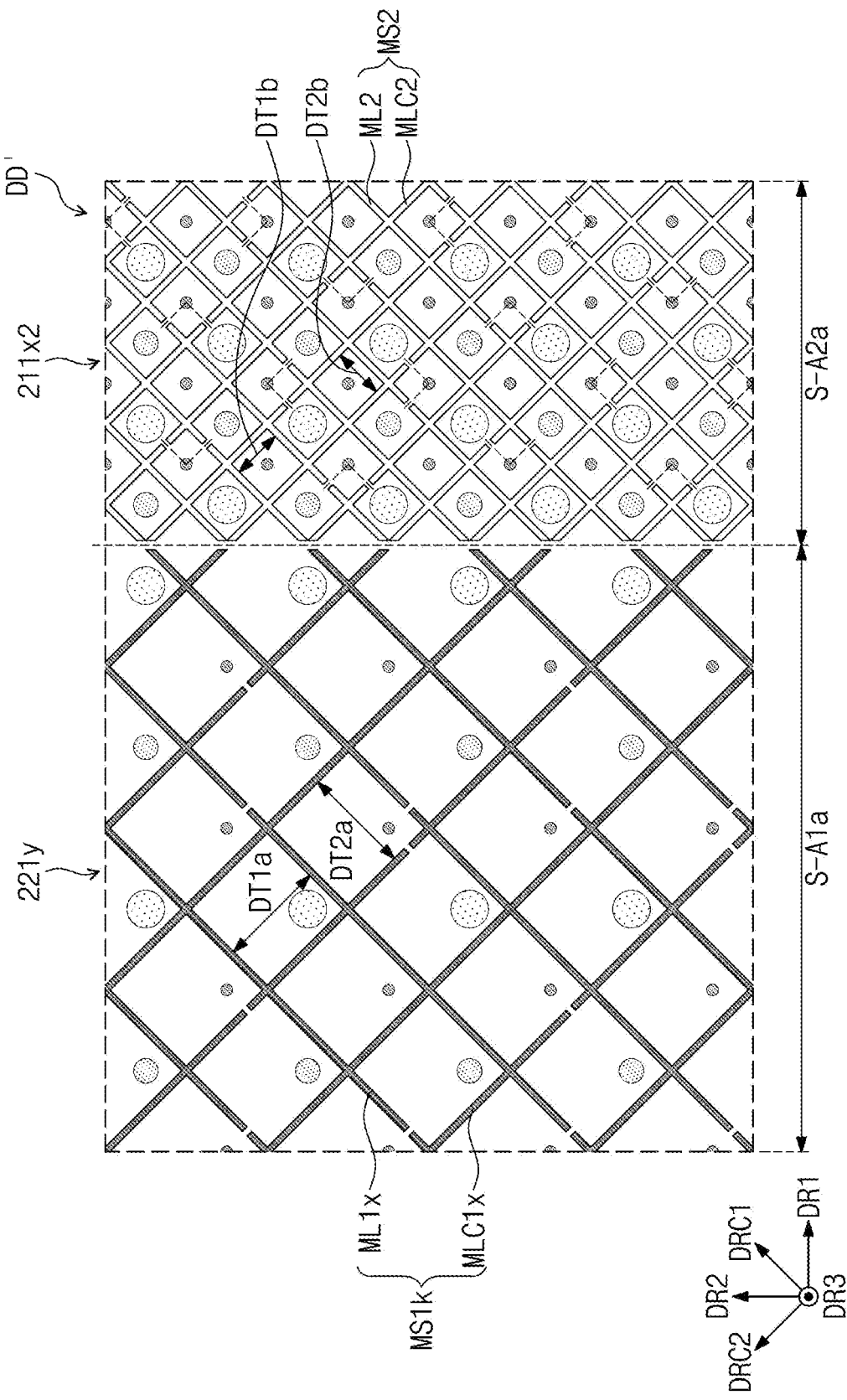
FIG. 26A is an enlarged plan view illustrating area DD' of FIG. 23.

FIG. 26A is an enlarged plan view illustrating area DD' of FIG. 23.

Referring to FIGS. 23, 24, and 26a, a first mesh structure MS1k and a second mesh structure MS2, which face each other with respect to the border BRx, are illustrated. The first mesh structure MS1k may include a plurality of first mesh lines ML1x and a plurality of first intersection mesh lines MLC1x. The plurality of first mesh lines ML1x and the plurality of first intersection mesh lines MLC1x may intersect each other and may have an integrated shape. The second mesh structure MS2 may include a plurality of second mesh lines ML2 and a plurality of second intersection mesh lines MLC2. The plurality of second mesh lines ML2 and the plurality of second intersection mesh lines MLC2 may intersect each other and may have an integrated shape.

A mesh structure is not disposed in the transmissive area TPA. For example, the arrangement density of a mesh structure disposed in the transmissive area TPA may be "0". The arrangement density of the first mesh structure MS1k disposed in the first sensing area S-Ala may have a density between the arrangement density of the second mesh structure MS2, which is disposed in the second sensing area S-A2a, and the arrangement density of a mesh structure in the transmissive area TPA.

The arrangement density of the plurality of first mesh lines ML1x may be lower than the arrangement density of the plurality of second mesh lines ML2, and the arrangement density of the plurality of first intersection mesh lines MLC1x may be lower than the arrangement density of the plurality of second intersection mesh lines MLC2. The size of an opening formed in the first mesh structure MS1k may be larger than the size of an opening formed in the second mesh structure MS2.

The distance DT1a between two first mesh lines ML1x adjacent to each other, among the plurality of first mesh lines ML1x, may be greater than the distance DT1b between two second mesh lines ML2 adjacent to each other, among the plurality of second mesh lines ML2. Furthermore, the distance DT2a between two first intersection mesh lines MLC1x adjacent to each other, among the plurality of first intersection mesh lines MLC1x, may be greater than the distance DT2b between two second intersection mesh lines MLC2 adjacent to each other, among the plurality of second intersection mesh lines MLC2.

The visibility of the transmissive area TPA where a mesh structure is not disposed may be alleviated by making the arrangement density of the first mesh structure MS1k lower than that of the second mesh structure MS2. Furthermore, in this embodiment, because different electrodes are disposed to face each other with respect to the border BRx to compensate for the sensing sensitivity, the sensing sensitivity might not be lowered even through the arrangement density of the first mesh structure MS1k is relatively low.

Figure 26B:
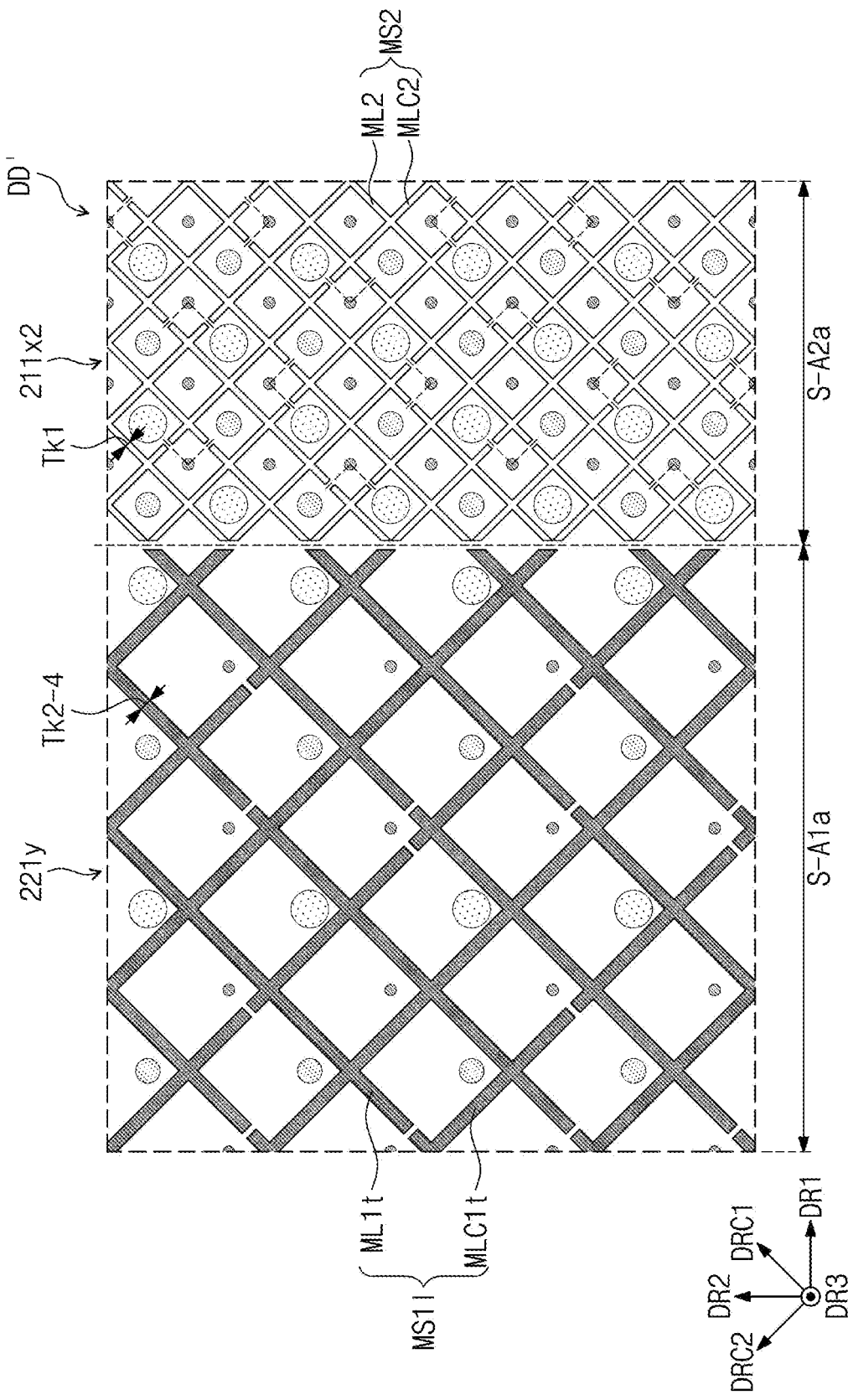
FIG. 26B is an enlarged plan view illustrating area DD' of FIG. 23.

FIG. 26B is an enlarged plan view illustrating area DD' of FIG. 23. In describing FIG. 26, components identical to the components illustrated in FIG. 26A will be assigned with identical reference numerals, and descriptions thereabout may be omitted to prevent redundant descriptions.

Referring to FIG. 26B, a first mesh structure MS1I may include a plurality of first mesh lines ML1t and a plurality of first intersection mesh lines MLC1t. The plurality of first mesh lines ML1t and the plurality of first intersection mesh lines MLC1t may intersect each other and may have an integrated shape. A second mesh structure MS2 may include a plurality of second mesh lines ML2 and a plurality of second intersection mesh lines MLC2. The plurality of second mesh lines ML2 and the plurality of second intersection mesh lines MLC2 may intersect each other and may have an integrated shape.

The visibility of the transmissive area TPA (refer to FIG. 23) where a mesh structure is not disposed may be alleviated by making the arrangement density of the first mesh structure MS1I lower than that of the second mesh structure MS2. Furthermore, in this embodiment, the sensing sensitivity may be increased by making the width Tk2-4 of each of the plurality of first mesh lines ML1t and the plurality of first intersection mesh lines MLC it greater than the width Tk1 of each of the plurality of second mesh lines ML2 and the plurality of second intersection mesh lines MLC2.

Figure 27:
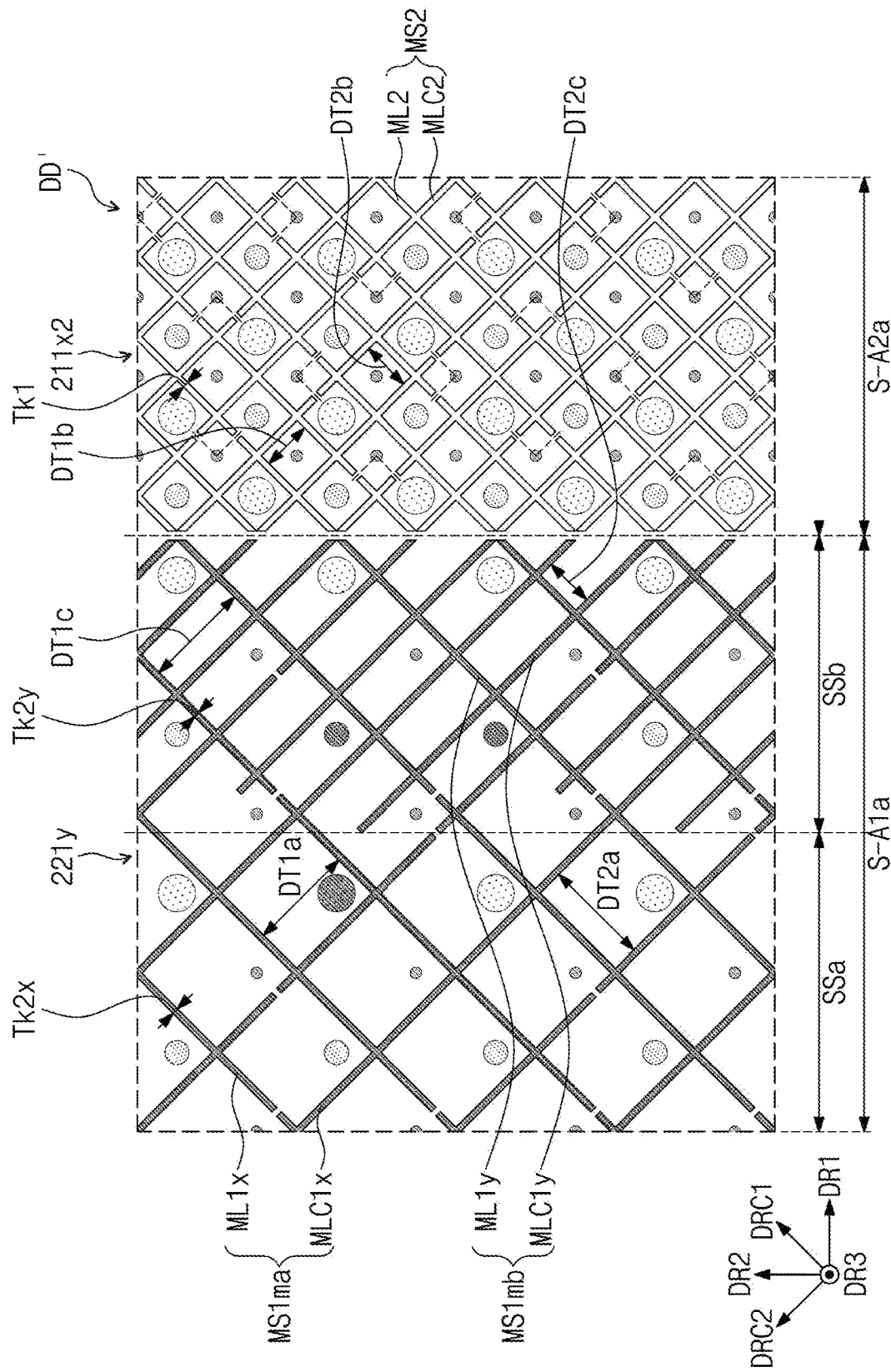
FIG. 27 is an enlarged plan view illustrating area DD' of FIG. 23.

FIG. 27 is an enlarged plan view illustrating area DD' of FIG. 23. In describing FIG. 27, components identical to the components illustrated in FIG. 26A will be assigned with identical reference numerals, and descriptions thereabout may be omitted to prevent redundant descriptions.

Referring to FIGS. 23, 24, and 27, the first sensing area S-Ala may include a first sub-sensing area SSa and a second sub-sensing area SSb. The first sub-sensing area SSa may be adjacent to the transmissive area TPA, and the second sub-sensing area SSb may be between the first sub-sensing area SSa and the second sensing area S-A2a.

The arrangement density of a first mesh structure MS1ma disposed in the first sub-sensing area SSa may be lower than the arrangement density of a first mesh structure MS1mb disposed in the second sub-sensing area SSb. The arrangement density of the first mesh structure MS1mb disposed in the second sub-sensing area SSb may have a density between the arrangement density of the first mesh structure MS1ma, which is disposed in the first sub-sensing area SSa, and the arrangement density of a second mesh structure MS2, which is disposed in the second sensing area S-A2a.

The first mesh structure MS1ma may include a plurality of first mesh lines ML1x and a plurality of first intersection mesh lines MLC1x. The first mesh structure MS1mb may include a plurality of first mesh lines ML1y and a plurality of first intersection mesh lines MLC1y.

The distance DT1a between two first mesh lines ML1x adjacent to each other, among the plurality of first mesh lines ML1x, may be substantially the same as the distance DT1c between two first mesh lines ML1y adjacent to each other, among the plurality of first mesh lines ML1y. The distance DT2a between two first intersection mesh lines MLC1x adjacent to each other, among the plurality of first intersection mesh lines MLC1x, may be greater than the distance DT2c between two first intersection mesh lines MLC1y adjacent to each other, among the plurality of first intersection mesh lines MLC y. The distance DT2c between two first intersection mesh lines MLC1y may be substantially the same as the distance DT2b between two second intersection mesh lines MLC2.

The arrangement density of the first mesh structure MS1mb may be lower than the arrangement density of the second mesh structure MS2, and the arrangement density of the first mesh structure MS1ma may be lower than the arrangement density of the first mesh structure MS1mb. The arrangement densities of the first mesh structures MS1ma and MS1mb and the second mesh structure MS2 are not limited to the above-described rule.

Furthermore, although FIG. 27 illustrates an example in which the first width Tk2x of each of the plurality of first mesh lines ML1x and each of the plurality of first intersection mesh lines MLC1x, the second width Tk2y of each of the plurality of first mesh lines ML1y and each of the plurality of first intersection mesh lines MLC1y, and the third width Tk1 of each of the second mesh lines ML2 and each of the second intersection mesh lines MLC2 are substantially the same as one another, the present inventive concept is not limited thereto. For example, the first width Tk2x may be greater than the second width Tk2y, and the second width Tk2y may be greater than the third width Tk1. In addition, the first width Tk2x may be substantially the same as the second width Tk2y, and the first width Tk2x and the second width Tk2y may be greater than the third width Tk1. In another case, the second width Tk2y may be greater than the first width Tk2x, and the first width Tk2x may be greater than the third width Tk1.

Figure 28:
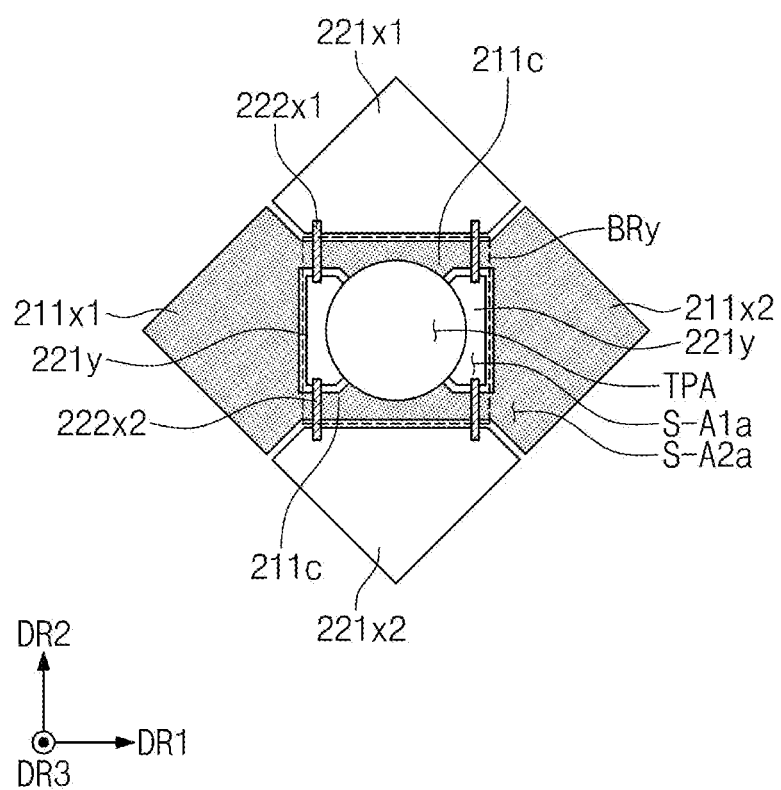
FIG. 28 is an enlarged plan view illustrating some components of the sensor illustrated in FIG. 23.

FIG. 28 is an enlarged plan view illustrating some components of the sensor illustrated in FIG. 23. In describing FIG. 28, components identical to the components illustrated in FIG. 24 will be assigned with identical reference numerals, and descriptions thereabout may be omitted to prevent redundant descriptions.

Referring to FIG. 28, two first portions 211x1 and 211x2, which are adjacent to the transmissive area TPA, two sensing patterns 221x1 and 221x2, a compensation portion 211c, which is connected to the two first portions 211x1 and 211x2, a compensation pattern 221y, which is electrically connected to the two sensing patterns 221x1 and 221x2, first bridge patterns 222x1, which electrically connects the compensation pattern 221y and the sensing pattern 221x1 to each other, and second bridge patterns 222x2, which electrically connects the compensation pattern 221y and the sensing pattern 221x2 to each other, are illustrated.

The border BRy between the first sensing area S-Ala and the second sensing area S-A2a may have a square shape. Although FIG. 28 illustrates an example that the border BRy has a square shape, the present inventive concept is not particularly limited thereto. For example, the border BRy may have a polygonal or a circular shape.

The compensation portion 211c and the compensation pattern 221y may be disposed in the first sensing area S-Ala. The first portions 211x1 and 211x2 and the sensing patterns 221x1 and 221x2 may be disposed in the second sensing area S-A2a. Accordingly, each of the compensation portion 211c and the compensation pattern 221y may have a first mesh structure, and each of the first portions 211x1 and 211x2 and the sensing patterns 221x1 and 221x2 may have a second mesh structure.

Figure 29:
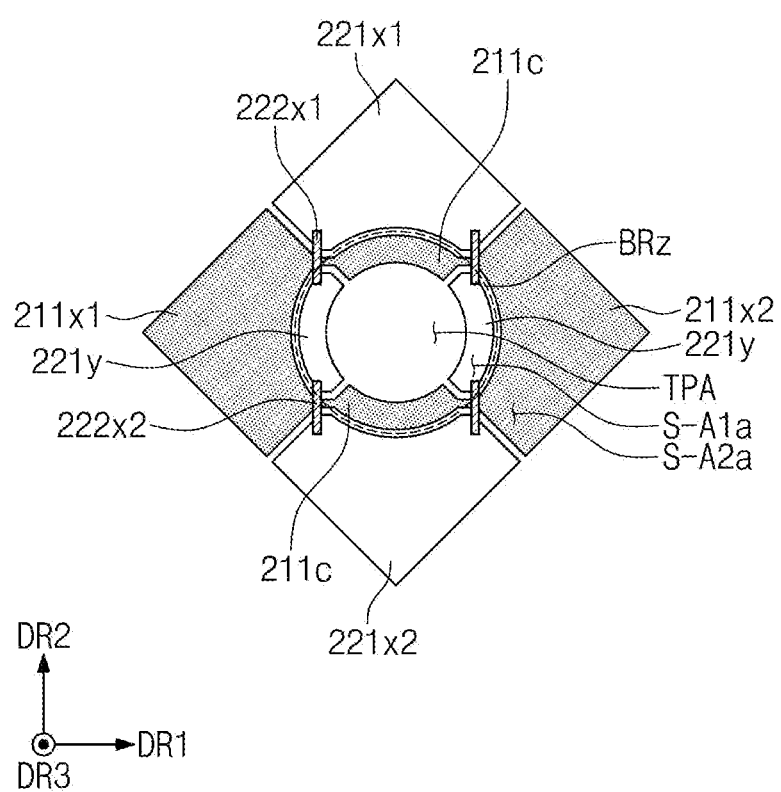
FIG. 29 is an enlarged plan view illustrating some components of the sensor illustrated in FIG. 23.

FIG. 29 is an enlarged plan view illustrating some components of the sensor illustrated in FIG. 23. In describing FIG. 29, components identical to the components illustrated in FIG. 24 will be assigned with identical reference numerals, and descriptions thereabout may be omitted to prevent redundant descriptions.

Referring to FIG. 29, two first portions 211x1 and 211x2, which are adjacent to the transmissive area TPA, two sensing patterns 221x1 and 221x2, a compensation portion 211c, which is connected to the two first portions 211xi and 211x2, a compensation pattern 221y, which is electrically connected to the two sensing patterns 221x1 and 221x2, first bridge patterns 222x1, which electrically connect the compensation pattern 221y and the sensing pattern 221xl to each other, and second bridge patterns 222x2, which electrically connect the compensation pattern 221y and the sensing pattern 221x2 to each other, are illustrated.

The border BRz between the first sensing area S-Ala and the second sensing area S-A2a may have a circular shape, but the present inventive concept is not particularly limited thereto. For example, the border BRz may have an oval shape or a shape including a curved line and a straight line. The compensation portion 211c and the compensation pattern 221y may be disposed in the first sensing area S-Ala. The first portions 211x1 and 211x2 and the sensing patterns 221x1 and 221x2 may be disposed in the second sensing area S-A2a. Accordingly, each of the compensation portion 211c and each of the compensation pattern 221y may have a first mesh structure, and each of the first portions 211xi and 211x2 and each of the sensing patterns 221x1 and 221x2 may have a second mesh structure.

As described above, the first electrode and the second electrode of the sensor might not be disposed in the transmissive area. The sensor may include the first sensing area, which is adjacent to the transmissive area, and the second sensing area, which is adjacent to the first sensing area. The first mesh structure of the first electrode or the second electrode disposed in the first sensing area may differ from the second mesh structure of the first electrode or the second electrode disposed in the second sensing area. Accordingly, the sensing sensitivity of the sensor may be increased by difference between the first mesh structure and the second mesh structure. In addition, a probability that the sensor will be visible from the outside may be decreased by the first mesh structure and the second mesh structure that differ from each other. In another case, an increase in the sensing sensitivity of the sensor and a decrease in a probability that the sensor will be visible from the outside may be achieved by the first mesh structure and the second mesh structure that differ from each other.

While the present inventive concept has been described with reference to embodiments thereof, it will be understood by those of ordinary skill in the art that various changes in form and details may be made thereto without departing from the spirit and scope of the present inventive concept.

What is claimed is:

1. A display module comprising:
 a display panel having a first area, a second area, and a third area, wherein the second area is adjacent to the first area, and the third area surrounds at least part of the second area; and
 a sensor disposed on the display panel, wherein the sensor has a transmissive area, a first sensing area, and a second sensing area, wherein the transmissive area overlaps the first area, wherein the first sensing area overlaps the second area, and the second sensing area overlaps the third area,
 wherein the sensor includes a plurality of first electrodes and a plurality of second electrodes, and each of the plurality of first electrodes and the plurality of second electrodes has a mesh structure,
 wherein the mesh structure includes a first mesh structure and a second mesh structure, wherein the first mesh structure is configured to overlap the first sensing area, wherein the second mesh structure configured to overlap the second sensing area, and wherein the first mesh structure and the second mesh structure are different from each other, and
 wherein a border between the first sensing area and the second sensing area has a polygonal shape.

2. The display module of claim 1, wherein the first mesh structure includes a plurality of first mesh lines and a plurality of first intersection mesh lines configured to intersect the plurality of first mesh lines, and the second mesh structure includes a plurality of second mesh lines and a plurality of second intersection mesh lines configured to intersect the plurality of second mesh lines.

3. The display module of claim 2, wherein the first mesh structure includes a plurality of first disconnection portions formed in the plurality of first mesh lines and the plurality of first intersection mesh lines, and the second mesh structure includes a plurality of second disconnection portions formed in the plurality of second mesh lines and the plurality of second intersection mesh lines, and
 wherein an arrangement density of the plurality of first disconnection portions is lower than an arrangement density of the plurality of second disconnection portions.

4. The display module of claim 3, wherein the first sensing area includes a first sub-sensing area adjacent to the transmissive area and a second sub-sensing area between the first sub-sensing area and the second sensing area, and wherein an arrangement density of first disconnection portions configured to overlap the first sub-sensing area among the plurality of first disconnection portions is lower than an arrangement density of first disconnection portions configured to overlap the second sub-sensing area among the plurality of first disconnection portions.

5. The display module of claim 2, wherein the first mesh structure further includes a compensation electrode, and the compensation electrode is disposed in an area corresponding to an opening formed by some first mesh lines among the plurality of first mesh lines and some first intersection mesh lines among the plurality of first intersection mesh lines.

6. The display module of claim 5, wherein the compensation electrode has a shape corresponding to the opening and is connected to the some first mesh lines and the some first intersection mesh lines.

7. The display module of claim 5, wherein the compensation electrode overlaps a portion of the opening and is connected to at least a part of the some first mesh lines and the some first intersection mesh lines.

8. The display module of claim 2, wherein the first mesh structure includes a first compensation mesh line disposed between some first mesh lines among the plurality of first mesh lines.

9. The display module of claim 8, wherein the first mesh structure further includes a first compensation intersection mesh line disposed between some first intersection mesh lines among the plurality of first intersection mesh lines.

10. The display module of claim 2, wherein a width of a first portion of a first mesh line among the plurality of first mesh lines is greater than a width of a second portion of the first mesh line, and a width of first portion of a first intersection mesh line among the plurality of first intersection mesh lines is greater than a width of second portion of the first intersection mesh line.

11. The display module of claim 2, wherein the first mesh structure and the second mesh structure face each other and are included in one of the plurality of first electrodes or one of the plurality of second electrodes.

12. The display module of claim 2, wherein the first mesh structure and the second mesh structure face each other, the first mesh structure is included in one of the plurality of first electrodes, and the second mesh structure is included in one of the plurality of second electrodes.

13. The display module of claim 12, wherein a distance between the plurality of first mesh lines is greater than a distance between the plurality of second mesh lines.

14. The display module of claim 12, wherein in the first sensing area, an arrangement density of the plurality of first mesh lines and an arrangement density of the plurality of first intersection mesh lines are gradually lowered as the transmissive area is approached.

15. The display module of claim 1, wherein the display panel includes:
a first pixel including a first light emitting element and a first pixel circuit, wherein the first light emitting element is disposed in the first area, and the first pixel circuit is configured to drive the first light emitting element and is disposed in the second area;
a second pixel including a second light emitting element and a second pixel circuit, wherein the second light emitting element is disposed in the second area, and the second pixel circuit is configured to drive the second light emitting element and is disposed in the second area; and
a third pixel including a third light emitting element and a third pixel circuit, wherein the third light emitting element is disposed in the third area, and the third pixel circuit is configured to drive the third light emitting element and is disposed in the third area.

16. The display module of claim 15, wherein the first light emitting element includes a plurality of first light emitting elements, wherein the third light emitting element includes a plurality of third light emitting elements, and wherein a distance between two first light emitting elements most adjacent to each other among the plurality of first light emitting elements is greater than a distance between two third light emitting elements most adjacent to each other among the plurality of third light emitting elements.

17. An electronic device comprising:
a display panel;
a sensor disposed on the display panel, wherein the sensor has a transmissive area, a first sensing area, and a second sensing area, wherein the first sensing area is adjacent to the transmissive area, and the second sensing area is spaced apart from the transmissive area with the first sensing area disposed therebetween; and
an electronic module disposed on the display panel and configured to overlap the transmissive area,
wherein the sensor includes:
a first mesh structure disposed in the first sensing area, wherein the first mesh structure includes a plurality of first mesh lines and a plurality of first intersection mesh lines configured to intersect the plurality of first mesh lines; and
a second mesh structure disposed in the second sensing area, wherein the second mesh structure includes a plurality of second mesh lines and a plurality of second intersection mesh lines configured to intersect the plurality of second mesh lines,
wherein an area of the first mesh structure is different from an area of the second mesh structure, and
wherein a border between the first sensing area and the second sensing area has a circular shape.

18. The electronic device of claim 17, wherein the first mesh structure includes a plurality of first disconnection portions formed in the plurality of first mesh lines and the plurality of first intersection mesh lines, and the second mesh structure includes a plurality of second disconnection portions formed in the plurality of second mesh lines and the plurality of second intersection mesh lines, and
wherein an arrangement density of the plurality of first disconnection portions is lower than an arrangement density of the plurality of second disconnection portions.

* * * * *